(12) United States Patent
Nagasaka et al.

(10) Patent No.: US 9,182,685 B2
(45) Date of Patent: Nov. 10, 2015

(54) EXPOSURE APPARATUS, EXPOSURE METHOD, METHOD FOR PRODUCING DEVICE, AND OPTICAL PART

(71) Applicant: NIKON CORPORATION, Tokyo (JP)

(72) Inventors: Hiroyuki Nagasaka, Kumagaya (JP); Hiroaki Takaiwa, Kumagaya (JP); Shigeru Hirukawa, Tokyo (JP); Ryuichi Hoshika, Sagamihara (JP); Hitoshi Ishizawa, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 204 days.

(21) Appl. No.: 14/035,135

(22) Filed: Sep. 24, 2013

(65) Prior Publication Data

US 2014/0022523 A1    Jan. 23, 2014

Related U.S. Application Data

(62) Division of application No. 11/639,245, filed on Dec. 15, 2006, now Pat. No. 9,019,469, which is a division of application No. 10/581,307, filed as application No. PCT/JP2004/018435 on Dec. 3, 2004, now Pat. No. 8,054,447.

(30) Foreign Application Priority Data

Dec. 3, 2003   (JP) .................................. 2003-404384
Feb. 19, 2004  (JP) .................................. 2004-042496

(51) Int. Cl.
*G03B 27/42*   (2006.01)
*G03F 7/20*    (2006.01)

(52) U.S. Cl.
CPC .............. *G03F 7/7085* (2013.01); *G03F 7/707* (2013.01); *G03F 7/7075* (2013.01); *G03F 7/70341* (2013.01)

(58) Field of Classification Search
CPC ... G03F 7/70341; G03F 7/707; G03F 7/7075; G03F 7/7085
USPC ........................................................... 355/53
See application file for complete search history.

(56) References Cited

U.S. PATENT DOCUMENTS 4,346,164 A    8/1982    Tabarelli et al.
4,465,368 A    8/1984    Matsuura et al.
(Continued)

FOREIGN PATENT DOCUMENTS

CN    1501175 A    6/2004
DE    221 563 A1   4/1985
(Continued)

OTHER PUBLICATIONS

Dec. 3, 2013 Office Action issued in Japanese Patent Application No. 2012-083220 (with translation).
(Continued)

*Primary Examiner* — Peter B Kim
(74) *Attorney, Agent, or Firm* — Oliff PLC

(57) ABSTRACT

An exposure apparatus exposes a substrate by irradiating exposure light onto the substrate via a projection optical system and a liquid. The exposure apparatus has a stage which includes a substrate holder for holding the substrate, a detachable member detachably disposed on the stage so that its upper surface contacts an immersion region, and a sensor having a light transmissive member. The detachable member, on which an opening is formed in the upper surface, is disposed on the stage so that the light transmissive member is arranged within the opening.

20 Claims, 19 Drawing Sheets

(56) References Cited

U.S. PATENT DOCUMENTS

| | | |
|---|---|---|
| 4,480,910 A | 11/1984 | Takanashi et al. |
| 5,284,802 A | 2/1994 | Muraoka et al. |
| 5,493,403 A | 2/1996 | Nishi |
| 5,528,118 A | 6/1996 | Lee |
| 5,591,958 A | 1/1997 | Nishi et al. |
| 5,610,683 A | 3/1997 | Takahashi |
| 5,623,853 A | 4/1997 | Novak et al. |
| 5,633,698 A | 5/1997 | Imai |
| 5,646,413 A | 7/1997 | Nishi |
| 5,715,039 A | 2/1998 | Fukuda et al. |
| 5,728,495 A | 3/1998 | Ozawa |
| 5,825,043 A | 10/1998 | Suwa |
| 5,874,820 A | 2/1999 | Lee |
| 5,923,408 A | 7/1999 | Takabayashi |
| 5,969,441 A | 10/1999 | Loopstra et al. |
| 6,191,429 B1 | 2/2001 | Suwa |
| 6,195,154 B1 | 2/2001 | Imai |
| 6,208,407 B1 | 3/2001 | Loopstra |
| 6,341,007 B1 | 1/2002 | Nishi et al. |
| 6,381,013 B1 | 4/2002 | Richardson |
| 6,400,441 B1 | 6/2002 | Nishi et al. |
| 6,549,269 B1 | 4/2003 | Nishi et al. |
| 6,590,634 B1 | 7/2003 | Nishi et al. |
| 6,650,399 B2 | 11/2003 | Baselmans et al. |
| 6,809,794 B1 | 10/2004 | Sewell |
| 6,819,414 B1 | 11/2004 | Takeuchi |
| 6,828,542 B2 | 12/2004 | Ye et al. |
| 6,882,406 B2 | 4/2005 | Kurt et al. |
| 6,940,582 B1 | 9/2005 | Tanaka |
| 7,199,858 B2 | 4/2007 | Lof et al. |
| 7,483,119 B2 | 1/2009 | Owa et al. |
| 7,760,366 B2 | 7/2010 | Mengel et al. |
| 7,796,274 B2 | 9/2010 | Mengel et al. |
| 2001/0026355 A1 | 10/2001 | Aoki et al. |
| 2002/0041377 A1 | 4/2002 | Hagiwara et al. |
| 2002/0061469 A1 | 5/2002 | Tanaka |
| 2002/0074635 A1 | 6/2002 | Hattori et al. |
| 2002/0163629 A1 | 11/2002 | Switkes et al. |
| 2003/0030916 A1 | 2/2003 | Suenaga |
| 2003/0066975 A1 | 4/2003 | Okada |
| 2003/0108806 A1 | 6/2003 | Chen |
| 2003/0139620 A1 | 7/2003 | Yamaguchi et al. |
| 2003/0174408 A1 | 9/2003 | Rostalski et al. |
| 2003/0226951 A1 | 12/2003 | Ye et al. |
| 2004/0000627 A1 | 1/2004 | Schuster |
| 2004/0060195 A1 | 4/2004 | Garcia et al. |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0000941 A1 | 1/2005 | Ward |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0074704 A1 | 4/2005 | Endo et al. |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094116 A1 | 5/2005 | Flagello et al. |
| 2005/0094119 A1 | 5/2005 | Loopstra et al. |
| 2005/0100745 A1 | 5/2005 | Lin et al. |
| 2005/0106512 A1 | 5/2005 | Endo et al. |
| 2005/0110973 A1 | 5/2005 | Streefkerk et al. |
| 2005/0117135 A1 | 6/2005 | Verhoeven et al. |
| 2005/0117224 A1 | 6/2005 | Shafer et al. |
| 2005/0122497 A1 | 6/2005 | Lyons et al. |
| 2005/0122505 A1 | 6/2005 | Miyajima |
| 2005/0128445 A1 | 6/2005 | Hoogendam et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0136361 A1 | 6/2005 | Endo et al. |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146693 A1 | 7/2005 | Ohsaki |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0174550 A1 | 8/2005 | Streefkerk et al. |
| 2005/0175776 A1 | 8/2005 | Streefkerk et al. |
| 2005/0175940 A1 | 8/2005 | Dierichs |
| 2005/0179877 A1 | 8/2005 | Mulkens et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219488 A1 | 10/2005 | Nei et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnychenko et al. |
| 2005/0233081 A1 | 10/2005 | Tokita |
| 2005/0237501 A1 | 10/2005 | Furukawa et al. |
| 2005/0237504 A1 | 10/2005 | Nagasaka et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |

(56) References Cited

U.S. PATENT DOCUMENTS

| | | | |
|---|---|---|---|
| 2005/0259233 A1 | 11/2005 | Streefkerk et al. | |
| 2005/0259234 A1 | 11/2005 | Hirukawa et al. | |
| 2005/0259236 A1 | 11/2005 | Straaijer | |
| 2005/0263068 A1 | 12/2005 | Hoogendam et al. | |
| 2005/0264778 A1 | 12/2005 | Lof et al. | |
| 2005/0270505 A1 | 12/2005 | Smith | |
| 2006/0103830 A1 | 5/2006 | Holmes et al. | |
| 2006/0103832 A1* | 5/2006 | Hazelton et al. | 355/72 |
| 2006/0139614 A1 | 6/2006 | Owa et al. | |
| 2006/0141400 A1 | 6/2006 | Hirayama et al. | |
| 2006/0192930 A1 | 8/2006 | Limura et al. | |
| 2007/0109521 A1 | 5/2007 | Nishii et al. | |
| 2007/0177125 A1 | 8/2007 | Shibazaki | |
| 2007/0269294 A1 | 11/2007 | Nagasaka et al. | |
| 2008/0246931 A1 | 10/2008 | Nakano et al. | |

FOREIGN PATENT DOCUMENTS

| | | |
|---|---|---|
| DE | 224 448 A1 | 7/1985 |
| EP | 0 605 103 A1 | 7/1994 |
| EP | 1 079 223 A1 | 2/2001 |
| EP | 1 429 188 A2 | 6/2004 |
| EP | 1 571 698 A1 | 9/2005 |
| EP | 1 628 329 A1 | 2/2006 |
| EP | 1 641 028 A1 | 3/2006 |
| EP | 1670043 A2 | 6/2006 |
| JP | A-57-117238 | 7/1982 |
| JP | A 57-153433 | 9/1982 |
| JP | A 58-202448 | 11/1983 |
| JP | A 59-019912 | 2/1984 |
| JP | A 62-065326 | 3/1987 |
| JP | A-62-221130 | 9/1987 |
| JP | A 63-157419 | 6/1988 |
| JP | A-4-65603 | 3/1992 |
| JP | A 04-305915 | 10/1992 |
| JP | A 04-305917 | 10/1992 |
| JP | A 05-062877 | 3/1993 |
| JP | A-6-53120 | 2/1994 |
| JP | A-6-124873 | 5/1994 |
| JP | A-06-124873 | 5/1994 |
| JP | A-6-188169 | 7/1994 |
| JP | A-6-326174 | 11/1994 |
| JP | A-07-078750 | 3/1995 |
| JP | A-7-81978 | 3/1995 |
| JP | A-7-176468 | 7/1995 |
| JP | A 07-220990 | 8/1995 |
| JP | A-8-37149 | 2/1996 |
| JP | A-8-166475 | 6/1996 |
| JP | A-8-279549 | 10/1996 |
| JP | A-8-316125 | 11/1996 |
| JP | A-08-316125 | 11/1996 |
| JP | A-8-330224 | 12/1996 |
| JP | A-9-36212 | 2/1997 |
| JP | A-10-163099 | 6/1998 |
| JP | A-10-214783 | 8/1998 |
| JP | A-10-255319 | 9/1998 |
| JP | A 10-303114 | 11/1998 |
| JP | A 10-340846 | 12/1998 |
| JP | A-11-16816 | 1/1999 |
| JP | A-11-111819 | 4/1999 |
| JP | A-11-135400 | 5/1999 |
| JP | A-11-163103 | 6/1999 |
| JP | A 11-176727 | 7/1999 |
| JP | A-11-239758 | 9/1999 |
| JP | A-2000-058436 | 2/2000 |
| JP | A 2000-058436 | 2/2000 |
| JP | A-2000-505958 | 5/2000 |
| JP | A-2002-14005 | 1/2002 |
| JP | A-2003-238577 | 8/2003 |
| JP | A-2003-240906 | 8/2003 |
| JP | A-2004-207711 | 7/2004 |
| JP | A-2004-289127 | 10/2004 |
| JP | A-2005-5707 | 1/2005 |
| JP | A-2005-19864 | 1/2005 |
| TW | 521320 | 2/2003 |
| TW | 522460 | 3/2003 |
| WO | WO 98/24115 | 6/1998 |
| WO | WO 98/28665 | 7/1998 |
| WO | WO 99/49504 A1 | 9/1999 |
| WO | WO 99/60361 | 11/1999 |
| WO | WO 01/22480 A1 | 3/2001 |
| WO | WO 02/091078 A1 | 11/2002 |
| WO | WO 03/077036 A1 | 9/2003 |
| WO | WO 03/077037 A1 | 9/2003 |
| WO | WO 2004/019128 A2 | 3/2004 |
| WO | WO 2004/053953 A1 | 6/2004 |
| WO | WO 2004/053955 A1 | 6/2004 |
| WO | WO 2004/053956 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/048328 A1 | 5/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/062351 A1 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Dec. 5, 2013 Office Action issued in U.S. Appl. No. 11/639,245.
Jan. 27, 2015 Office Action issued in Japanese Application No. 2014-044468.
Jan. 7, 2014 Office Action issued in Japanese Patent Application No. 2012-193619 (with translation).
Jan. 7, 2014 Office Action issued in Japanese Patent Application No. 2012-193620 (with translation).

(56) References Cited

OTHER PUBLICATIONS

Feb. 4, 2014 Office Action issued in U.S. Appl. No. 13/753,969.
Feb. 14, 2014 Office Action issued in Taiwanese Patent Application No. 098124811 (with translation).
Jun. 2, 2014 Office Action issued in U.S. Appl. No. 13/754,112.
Jun. 11, 2014 Office Action issued in U.S. Patent Application No. 11/639,245.
Jun. 20, 2014 Office Action issued in European Patent Application No. 04 746 086.0.
Jun. 27, 2014 Office Action issued in Korean Patent Application No. 2013-7020081 (with translation).
Jul. 30, 2014 Office Action issued in Korean Patent Application No. 2012-7025739 (with translation).
Aug. 1, 2014 Office Action issued in European Patent Application No. 14150747.5.
Lin, B.J. "Semiconductor Foundry, Lithography, and Partners." Proceedings of SPIE, vol. 4688, pp. 11-24, 2002.
Switkes, M., et al. "Resolution Enhancement of 157nm Lithography by Liquid Immersion." Proceedings of SPIE, vol. 4691, pp. 459-465, 2002.
Switkes, M., et al. "Resolution Enhancement of 157nm Lithography by Liquid Immersion." J. Microlith., Microfab., Microsyst., vol. 1, No. 3, pp. 1-4, 2002.
Owa, Soichi, et al. "Nikon F2 Exposure Tool," slides 1-25, $3^{rd}$ 157nm Symposium, Sep. 4, 2002.
Owa, Soichi. "Immersion Lithography," slides 1-24, Immersion Lithography Workshop, Dec. 11, 2002.
Owa, Soichi, et al. "Immersion Lithography; its Potential Performance and Issues." Proceedings of SPIE, vol. 5040, pp. 724-733, 2003.
Owa, Soichi, et al. "Potential Performance and Feasibility of Immersion Lithography," slides 1-33, NGL Workshop 2003, Jul. 2003.
Owa, Soichi, et al. "Update on 193nm Immersion Exposure Tool," slides 1-38, Immersion Workshop 2004, Jan. 27, 2004.
Owa, Soichi, et al. "Update on 193nm Immersion Exposure Tool," slides 1-51, Litho Forum, Jan. 28, 2004.
Nov. 23, 2009 Office Action in U.S. Appl. No. 10/581,307.
Jan. 4, 2008 Chinese Office Action in Corresponding Chinese Application No. 2004800359019 and English Translation.
Aug. 28, 2009 Chinese Office Action in Corresponding Chinese Application No. 2004800359019 and English Translation.
English Translation of CN 1501175A (Jun. 2, 2004).
Aug. 27, 2010 Office Action in U.S. Appl. No. 10/581,307.
Mar. 9, 2007 Office Action in U.S. Appl. No. 11/297,324.
Dec. 5, 2007 Notice of Allowance in U.S. Appl. No. 11/297,324.
Jun. 9, 2008 Notice of Allowance in U.S. Appl. No. 11/297,324.
Jul. 12, 2007 Office Action in U.S. Appl. No. 11/448,927.
Oct. 23, 2009 Office Action in U.S. Appl. No. 12/007,450.
Jul. 20, 2010 Office Action in U.S. Appl. No. 12/007,450.
Mar. 1, 2011 Notice of Allowance in U.S. Appl. No. 10/581,307.
Nov. 9, 2004 International Search Report in International Application No. PCT/JP2004/008578, with translation.
Sep. 15, 2008 Supplemental European Search Report in European Application No. 04746086.0.
Mar. 29, 2005 International Search Report in International Application No. PCT/JP2004/018435, with translation.
Sep. 15, 2008 Supplemental European Search Report in European Application No. 04801655.4.
Nov. 9, 2004 Written Opinion in International Application No. PCT/JP2004/008578, with translation.
Mar. 29, 2005 Written Opinion in International Application No. PCT/JP2004/018435, with translation.
Jan. 5, 2010 Office Action in Japanese Application No. 2004-349940, with translation.
Apr. 20, 2010 Notice of Allowance in Japanese Application No. 2004-349940, with translation.
Dec. 22, 2009 Office Action in Japanese Application No. 2005-028724, with translation.
Apr. 20, 2010 Notice of Allowance in Japanese Application No. 2005-028724, with translation.
Aug. 4, 2009 Office Action in Japanese Application No. 2005-507005, with translation.
Nov. 4, 2009 Notice of Allowance in Japanese Application No. 2005-507005, with translation.
Aug. 2, 2007 Australian Written Opinion in Singapore Application No. 200603679-2.
May 22, 2008 Australian Office Action in Singapore Application No. 200603679-2.
Oct. 19, 2009 Office Action in Israeli Application No. 176057, with translation.
Oct. 4, 2010 Office Action in Israeli Application No. 176057, with translation.
Feb. 21, 2011 Office Action in Taiwanese Application No. 093116810, with translation.
Feb. 28, 2011 Office Action in Korean Application No. 2005-7023920, with translation.
Mar. 9, 2011 Office Action in Israeli Application No. 207788, with translation.
Mar. 9, 2011 Office Action in Israeli Application No. 207790, with translation.
Apr. 15, 2011 Office Action in Korean Application No. 2006-7005879 (with English translation).
Jun. 6, 2011 Office Action issued in U.S. Appl. No. 12/232,063.
Jun. 13, 2011 Notice of Allowance in U.S. Appl. No. 12/007,450.
Jul. 12, 2011 Office Action in U.S. Appl. No. 12/232,064.
Dec. 27, 2011 Office Action in Korean Patent Application No. 2011-7024388 (with English translation).
Chinese Patent Office, First Examination Report mailed Feb. 16, 2012 in Chinese Patent Application No. 201110089902.3 (with English translation).
Mar. 22, 2012 Office Action issued in U.S. Appl. No. 12/232,064.
Jul. 3, 2012 Office Action issued in Japanese Patent Application No. 2009-231860 (with translation).
Jul. 3, 2012 Office Action issued in Japanese Patent Application No. 2010-050828 (with translation).
Sep. 28, 2012 Office Action issued in Taiwanese Patent Application No. 098124811 (with English Translation).
Sep. 28, 2012 Office Action issued in Taiwanese Patent Application No. 100137115 (with English Translation).
Jan. 5, 2013 Second Office Action issued in Chinese Patent Application 201110089902.3 (with translation).
Mar. 25, 2013 Office Action issued in European Patent Application No. 04746086.0.
Mar. 19, 2013 Office Action issued in U.S. Appl. No. 11/639,245.
May 23, 2013 Office Action issued in U.S. Appl No. 13/753,969.
May 21, 2013 Office Action issued in Taiwanese Patent Application No. 098124811 w/ English translation.
Jul. 19, 2013 Office Action issued in U.S. Appl. No. 13/754,112.
Aug. 13, 2013 Office Action issued in European Patent Application No. 04801655.4.
Dec. 8, 2010 Office Action issued in U.S. Appl. No. 11/639,245.
Sep. 1, 2011 Office Action issued in U.S. Appl. No. 11/639,245.
Aug. 27, 2015 Office Action issued in European Application No. 04 801 655.4.
Aug. 7, 2015 Office Action issued in Taiwanese Application No. 103128271.

\* cited by examiner

Fig. 11
(a)
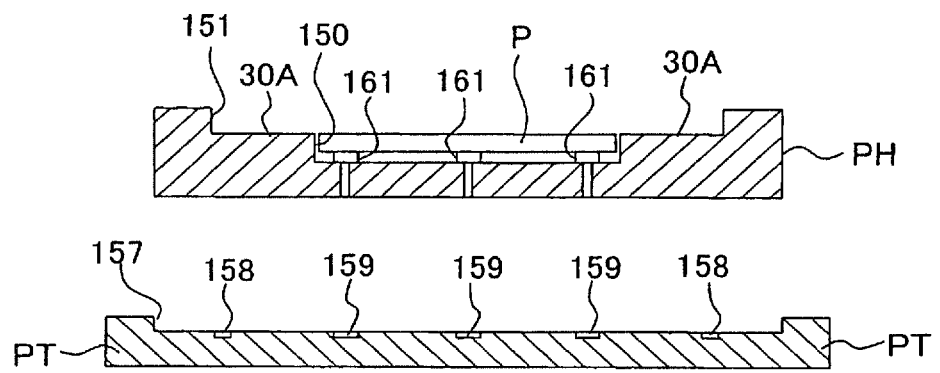
(b)
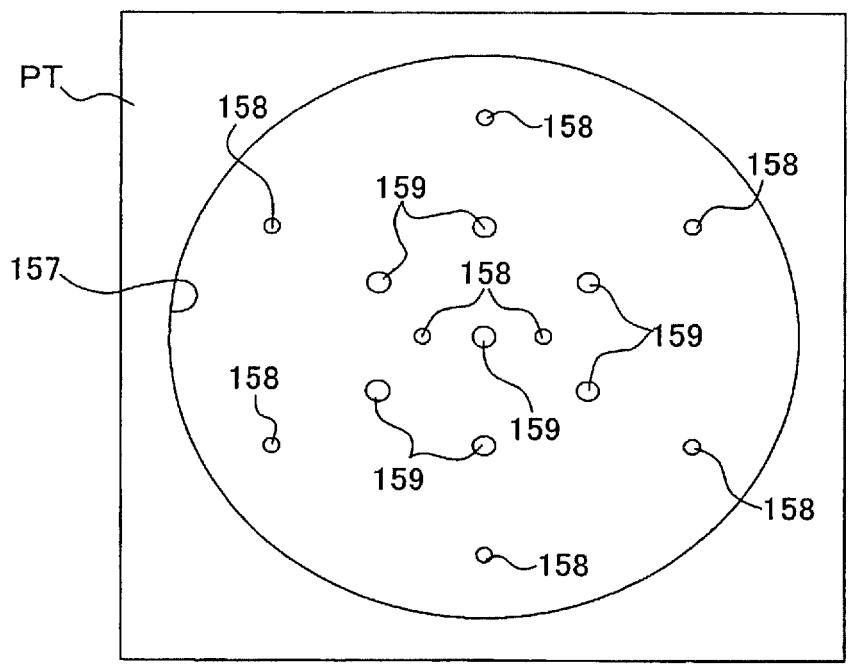

Fig. 12
(a)
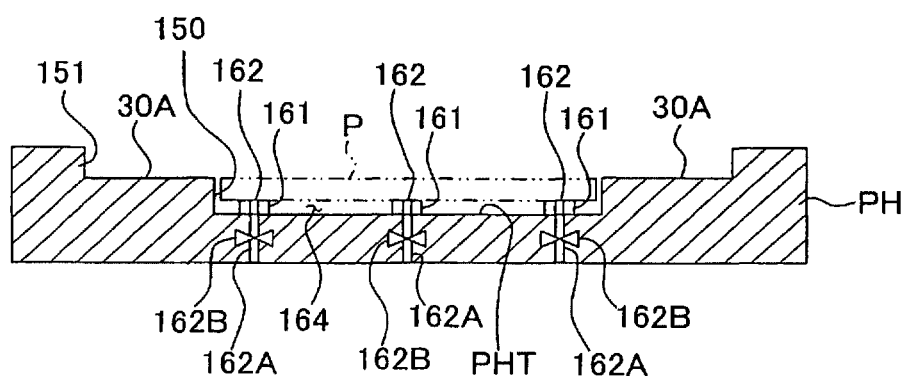
(b)
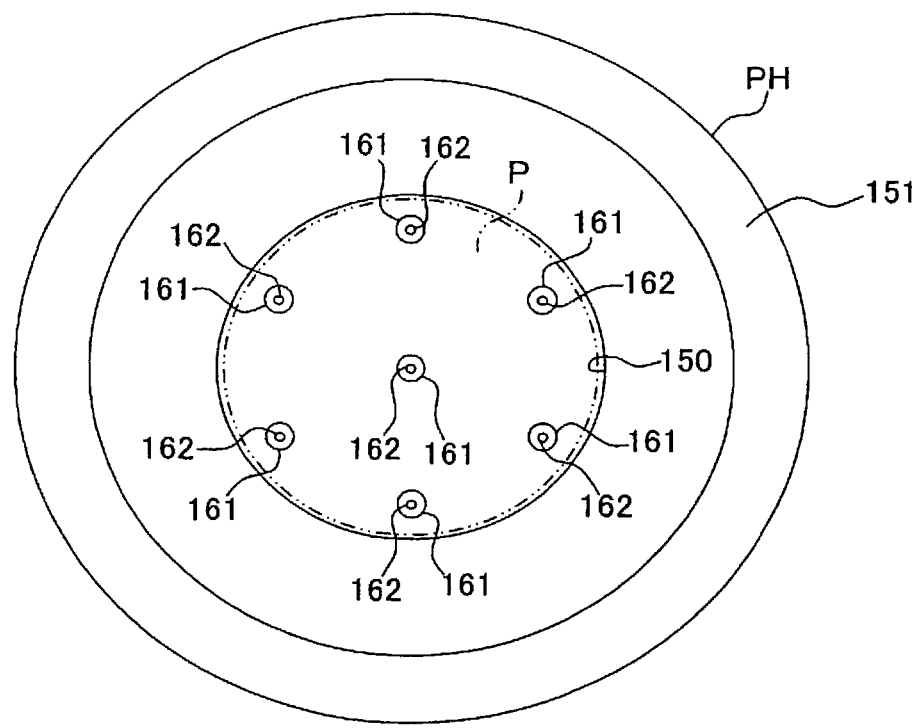

Fig. 13
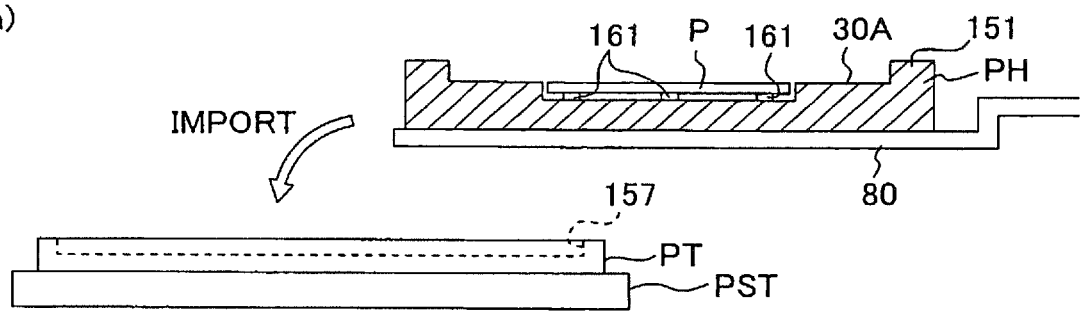
(a)
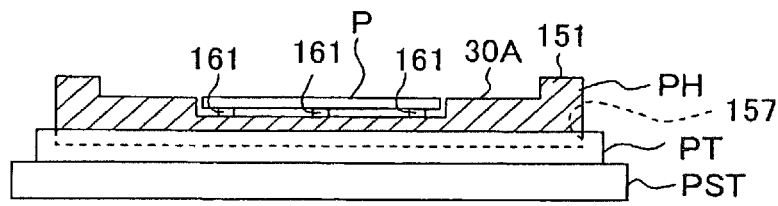
(b)
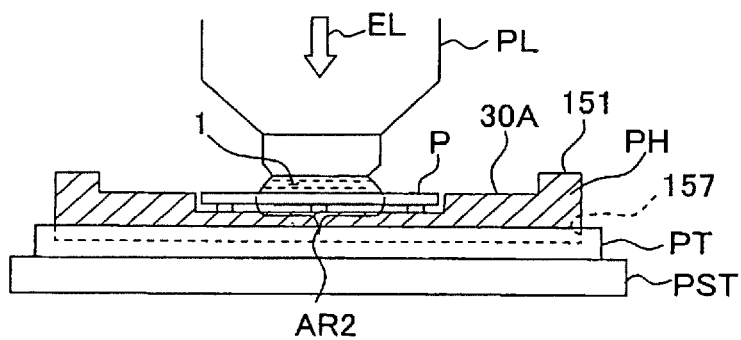
(c)
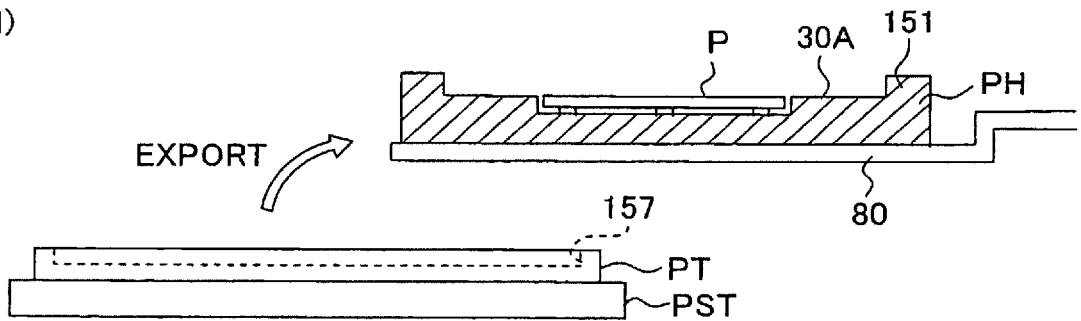
(d)

EXPOSURE APPARATUS, EXPOSURE METHOD, METHOD FOR PRODUCING DEVICE, AND OPTICAL PART

This is a Division of application Ser. No. 11/639,245 filed Dec. 15, 2006, which is a Division of application Ser. No. 10/581,307, which is the U.S. National Stage of PCT/JP2004/018435 filed Dec. 3, 2004. The disclosure of each of the prior applications is hereby incorporated by reference herein in its entirety.

TECHNICAL FIELD

The present invention relates to an exposure apparatus, an exposure method, and a method for producing a device, in which an exposure light beam is radiated onto a substrate through a liquid to expose the substrate. The present invention also relates to an optical part which is usable for a projection exposure apparatus using the liquid immersion method, and the projection exposure apparatus using the optical part. Further, the present invention relates to an optical part which is preferably usable in such an environment that the optical part makes contact with a liquid or a vapor.

BACKGROUND ART

Semiconductor devices and liquid crystal display devices are produced by means of the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus $\delta$ are represented by the following expressions respectively.

$$R = k_1 \cdot \lambda/NA \quad (1)$$

$$\delta = \pm k_2 \lambda/NA^2 \quad (2)$$

In the expressions, $\lambda$ represents the exposure wavelength, NA represents the numerical aperture of the projection optical system, and $k_1$ and $k_2$ represent the process coefficients. According to the expressions (1) and (2), the following fact is appreciated. That is, when the exposure wavelength $\lambda$ is shortened and the numerical aperture NA is increased in order to enhance the resolution R, then the depth of focus $\delta$ is narrowed.

If the depth of focus $\delta$ is too narrowed, it is difficult to match the substrate surface with respect to the image plane of the projection optical system. It is feared that the margin is insufficient during the exposure operation. Further, the optical part material, which is usable for the exposure light beam that has the increasingly shortened wavelength, is restricted. From the viewpoints as described above, the liquid immersion method has been suggested, which is disclosed, for example, in International Publication No. 99/49504 and Japanese Patent Application Laid-open No. 10-303114 as a method for substantially shortening the wavelength of the exposure light beam after passing via the projection optical system and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

As schematically shown in FIG. 18, an edge area E of a substrate P is sometimes subjected to the exposure as well in the case of the exposure apparatus which adopts the liquid immersion method. In such a situation, a portion of the projection area 100 protrudes to the outside of the substrate P, and the exposure light beam is also radiated onto a substrate table 120 for holding the substrate P. In the case of the liquid immersion exposure, the liquid immersion area of the liquid is formed so that the projection area 100 is covered therewith. However, when the edge area E is subjected to the exposure, then a part of the liquid immersion area of the liquid protrudes to the outside of the substrate P, and the liquid immersion area is also formed on the substrate table 120. When various measuring members and/or measuring sensors are arranged around the substrate P on the substrate table 120, the liquid immersion area is also formed on the substrate table 120 in some cases in order to use the measuring members and/or the measuring sensors. When a portion of the liquid immersion area is formed on the substrate table 120, then the liquid may remain on the substrate table 120 highly possibly, and the following possibility arises. That is, for example, the environment (temperature, humidity), in which the substrate P is placed, may be varied as a result of the vaporization of the remained liquid, the substrate table 120 may be thermally deformed, the environment of the optical paths for various measuring light beams to measure, for example, the position information about the substrate P may be varied, and the exposure accuracy may be lowered. Further, the following possibility arises as well. That is, the water mark (trace of water) may remain after the vaporization of the remained liquid, which may result in the factor of the pollution of, for example, the substrate P and the liquid, and which may result in the factor of the error concerning various types of measurements.

DISCLOSURE OF THE INVENTION

The present invention has been made taking the foregoing circumstances into consideration, a first object of which is to provide an exposure apparatus, an exposure method, and a method for producing a device, in which it is possible to prevent the liquid from remaining, and it is possible to maintain a satisfactory exposure accuracy and a satisfactory measurement accuracy.

A second object of the present invention is to provide an optical part which has a water-repellent film provided with durability against ultraviolet laser irradiation, and a projection exposure apparatus which is provided with the optical part.

In order to achieve the objects as described above, the present invention adopts the following constructions.

According to a first aspect of the present invention, there is provided an exposure apparatus which exposes a substrate by radiating an exposure light beam onto the substrate through a liquid; the exposure apparatus comprising a projection optical system which projects an image of a pattern onto the substrate; and a substrate table which holds the substrate; wherein a member, at least a part of a surface of which is liquid-repellent, is provided exchangeably on the substrate table.

According to the present invention, there is provided a method for producing a device, comprising using the exposure apparatus according to the aspect as described above.

According to the present invention, the liquid-repellent member, which is provided on the substrate table, is provided exchangeably. Therefore, when the liquid repellence of the member is deteriorated, the member can be exchanged with a new liquid-repellent member. Therefore, it is possible to suppress the remaining of the liquid. Even when the liquid remains, the liquid can be recovered smoothly. Therefore, it is possible to avoid the deterioration of the exposure accuracy and the measurement accuracy which would be otherwise caused by the remaining liquid. It is possible to produce the device which can exhibit desired performance.

According to a second aspect of the present invention, there is provided an exposure method for performing liquid immersion exposure for a substrate by radiating an exposure light beam onto the substrate via a projection optical system and a liquid; the exposure method comprising holding the substrate with a substrate-holding member, the substrate-holding member having a flat portion which is disposed around the substrate and which is substantially flush with a surface of the substrate; loading the substrate-holding member to a substrate stage, the substrate-holding member holding the substrate; performing the liquid immersion exposure for the substrate loaded onto the substrate stage; and unloading the substrate-holding member with which the substrate is held from the substrate stage after completion of the liquid immersion exposure.

According to the present invention, there is provided a method for producing a device, comprising using the exposure method as described above.

According to the present invention, the substrate-holding member, which has the flat portion around the substrate, is loaded and unloaded with respect to the substrate stage together with the substrate. Accordingly, the substrate-holding member can be easily exchanged with respect to the substrate stage together with the substrate. For example, even when the liquid repellence of the substrate-holding member is deteriorated, it is easy to perform the exchange. The substrate-holding member has the flat portion around the substrate. Therefore, when the substrate-holding member is loaded to the substrate stage together with the substrate, and the liquid immersion exposure for the edge area of the substrate is performed, the shape of the liquid immersion area is maintained by the flat portion, even when a part of the liquid immersion area of the liquid protrudes to the outside of the substrate. It is possible to perform the liquid immersion exposure in a state in which the liquid is satisfactorily retained below the projection optical system, without causing, for example, the outflow of the liquid. Therefore, the deterioration of the exposure accuracy is avoided, and it is possible to produce the device which exhibits desired performance.

According to a third aspect of the present invention, there is provided an exposure apparatus which exposes a substrate by radiating an exposure light beam onto the substrate through a liquid; the exposure apparatus comprising a projection optical system which projects an image of a pattern onto the substrate; and a movable stage which is movable relative to the projection optical system; wherein a liquid-repellent member, at least a part of which is liquid-repellent, is provided on the movable stage, and the liquid-repellent member is exchangeable.

In the exposure apparatus according to the third aspect of the present invention, the liquid-repellent member, which is provided on the movable stage, is provided exchangeably. Therefore, when the liquid repellence of the member is deteriorated, the member can be exchanged with a new member. The movable stage may be a substrate stage which is movable while holding the substrate, or a measuring stage which is provided with various reference members and/or measuring members such as measuring sensors. Alternatively, the exposure apparatus may include, as the movable stage, both of a substrate stage and a measuring stage. Further, the exposure apparatus may include, as the movable stage, a plurality of substrate stages or a plurality of measuring stages.

According to a fourth aspect of the present invention, there is provided an exposure method for performing liquid immersion exposure for a substrate by radiating an exposure light beam onto the substrate through a liquid; the exposure method comprising supplying the liquid to at least a part of a surface of the substrate; and performing the liquid immersion exposure for the substrate by radiating the exposure light beam onto the substrate through the liquid; wherein a part of the exposure apparatus, which is different from the substrate for which the liquid is supplied, is liquid-repellent, and the liquid-repellent part of the exposure apparatus is exchanged depending on deterioration of liquid repellence thereof.

In the exposure method according to the fourth aspect of the present invention, even when the liquid-repellent part of the exposure apparatus is deteriorated by being irradiated with the ultraviolet light, it is possible to avoid, for example, the remaining and the leakage of the liquid which would be caused by the deterioration, because the concerning part is exchanged depending on the deterioration. The part may be exchanged periodically. Alternatively, the part may be exchanged on the basis of the result of the observation or the estimation of the situation of deterioration for every part.

According to a fifth aspect of the present invention, there is provided an optical part to be provided on a substrate stage of a projection exposure apparatus which illuminates a mask with an exposure light beam and transfers a pattern of the mask through a liquid onto a substrate held by the substrate stage by using a projection optical system; the optical part comprising a light irradiated surface which is irradiated with the exposure light beam; an adhesive particulate layer which comprises a particulate layer composed of at least one of silicon dioxide, magnesium fluoride, and calcium fluoride, and formed on the light irradiated surface; and a water-repellent film which is composed of an amorphous fluororesin and formed on a surface of the adhesive particulate layer.

The inventors performed analysis about the adhesiveness between the base material glass and fluoroalkylsilane, and found that any chemical bond, which is based on, for example, the hydrogen bond and/or the condensation reaction, cannot be expected between fluoroalkylsilane and the base material glass, because the terminal group —$CF_3$ of fluoroalkylsilane is chemically stable. Accordingly, the inventors have made the investigation about the method for increasing the intermolecular attractive force without depending on the chemical bond. As a result, the inventors have succeeded in the increase in the adhesion energy in a skillful manner by increasing the surface area of the adhesive layer which is to be adhered to the base material glass. According to the optical part of the present invention, the particulate or fine particle layer, which is composed of at least one of silicon dioxide ($SiO_2$), magnesium fluoride ($MgF_2$), and calcium fluoride ($CaF_2$) for forming the adhesive particulate layer, has the good affinity for the glass (main component: $SiO_2$) of the base material, wherein a proper or appropriate degree of adhesiveness is obtained. Further, irregularities, which result from diameters of the particles or particulates, are generated on the surface. Further, silicon dioxide or the like is such a material that the ultraviolet transmittance is extremely high. Therefore, such a material itself has the high durability against the laser irradiation as well. Therefore, when the particulate layer, which is composed of at least one of silicon dioxide ($SiO_2$), magnesium fluoride ($MgF_2$), and calcium fluoride ($CaF_2$), is formed as a film, and the water-repellent film, which is composed of the amorphous fluororesin, is formed thereafter, then the amorphous fluororesin enters voids or interstices of particulates of silicon dioxide or the like, and the amorphous fluororesin is subjected to drying and solidification while effecting embrace and inclusion of the particles. The mechanical strength of the amorphous fluororesin itself is high. Therefore, the water-repellent film, which is allowed to make tight contact with the base material, has the high strength.

According to a sixth aspect of the present invention, there is provided an optical part to be provided on a substrate stage of a projection exposure apparatus for illuminating a mask with an exposure light beam and transferring a pattern of the mask through a liquid onto a substrate held by the substrate stage by using a projection optical system; the optical part comprising a light irradiated surface which is irradiated with the exposure light beam; an adhesive surface which is formed on the light irradiated surface; and a water-repellent film which is composed of an amorphous fluororesin and formed on the adhesive surface. In the optical part of this aspect, it is preferable that the adhesive surface is a surface subjected to etching with hydrogen fluoride.

According to the optical part of the sixth aspect, the adhesive surface, which is constructed of the etching surface subjected to the etching with hydrogen fluoride, for example, is provided for the light irradiated surface. Therefore, when the water-repellent film, which is composed of the amorphous fluororesin, is formed on the adhesive surface, the amorphous fluororesin is subjected to drying and solidification while effecting embrace and inclusion. The mechanical strength of the amorphous fluororesin itself is high. Therefore, the water-repellent film, which is allowed to make tight contact with the base material, has the high strength.

In the optical part according to the aspect described above, the light irradiated surface may have a base material glass. In the optical part according to the aspect described above, the irradiated surface may have a metal film which is formed on at least a part or portion of the base material glass. According to the optical part as described above, the water-repellent film, which is formed on the light irradiated surface, has the durability against the laser irradiation. Therefore, it is possible to maintain the water repellence of the light irradiated surface of the optical part provided on the substrate stage of the projection exposure apparatus for a long period of time.

According to the present invention, there is also provided a projection exposure apparatus comprising the optical part according to any one of the aspects described above. According to this projection exposure apparatus, the optical part, which makes it possible to maintain the water repellence of the light irradiated surface for a long period of time, is provided on the substrate stage. Therefore, even when the liquid immersion exposure is repeatedly performed, it is possible to reliably discharge water from the light irradiated surface of the optical part.

According to a seventh aspect of the present invention, there is provided a projection exposure apparatus which illuminates a mask with an exposure light beam and transfers a pattern of the mask through a liquid onto a substrate held by a substrate stage by using a projection optical system; the projection exposure apparatus comprising, on the substrate stage, an optical part including a light irradiated surface which is irradiated with the exposure light beam; an adhesive particulate layer which is formed on the light irradiated surface; and a water-repellent film which is composed of an amorphous fluororesin and formed on a surface of the adhesive particulate layer.

According to the projection exposure apparatus of the seventh aspect, the optical part, which is provided on the substrate stage, has the adhesive particulate layer on the light irradiated surface. Therefore, the water-repellent film, which is composed of the amorphous fluororesin, makes tight contact with the adhesive particulate layer. The mechanical strength of the amorphous fluororesin itself is high. Therefore, the water-repellent film, which is allowed to make tight contact with the base material, has the high strength.

In the projection exposure apparatus of the seventh aspect, the light irradiated surface may have a base material glass. In the projection exposure apparatus of the seventh aspect, the light irradiated surface may have a metal film which is formed on at least a part or portion of the base material glass. According to the projection exposure apparatus as described above, the water-repellent film, which is formed on the light irradiated surface of the optical part mounted on the substrate stage, has the durability against the laser irradiation. Therefore, it is possible to maintain the water repellence of the light irradiated surface of the optical part mounted on the substrate stage of the projection exposure apparatus for a long period of time.

According to an eighth aspect of the present invention, there is provided an optical part comprising a part body which has a light irradiated surface; a particulate layer which is formed of at least one particulate selected from the group consisting of silicon dioxide, magnesium fluoride, and calcium fluoride, and formed on the light irradiated surface; and a water-repellent film which is formed of an amorphous fluororesin, on a surface of the particulate layer. The water-repellent film is strongly connected to the light irradiated surface by the aid of the particulate layer. Therefore, the present invention is extremely useful for the way of use including, for example, optical sensors and lenses to be used in the liquid or vapor atmosphere.

According to a ninth aspect of the present invention, there is provided an optical part comprising a part body which has a light irradiated surface; an adhesive surface which is formed by etching on the light irradiated surface; and a water-repellent film which is formed of an amorphous fluororesin, on the adhesive surface. The water-repellent film is strongly connected to the light irradiated surface by the aid of the particulate layer. Therefore, the present invention is extremely useful for the way of use including, for example, optical sensors and lenses to be used in the liquid or vapor atmosphere.

BRIEF DESCRIPTION OF THE DRAWINGS

FIGS. 11(a) and 11(b) show a schematic arrangement illustrating another embodiment of an exposure apparatus of the present invention.

FIGS. 12(a) and 12(b) show another embodiment of a substrate-holding member.

FIGS. 13(a) to 13(d) schematically show another example of the operation of the exposure apparatus of the present invention.

BEST MODE FOR CARRYING OUT THE INVENTION

An explanation will be made below about the exposure apparatus according to the present invention with reference to the drawings. However, the present invention is not limited thereto.

First Embodiment

Figure 1:
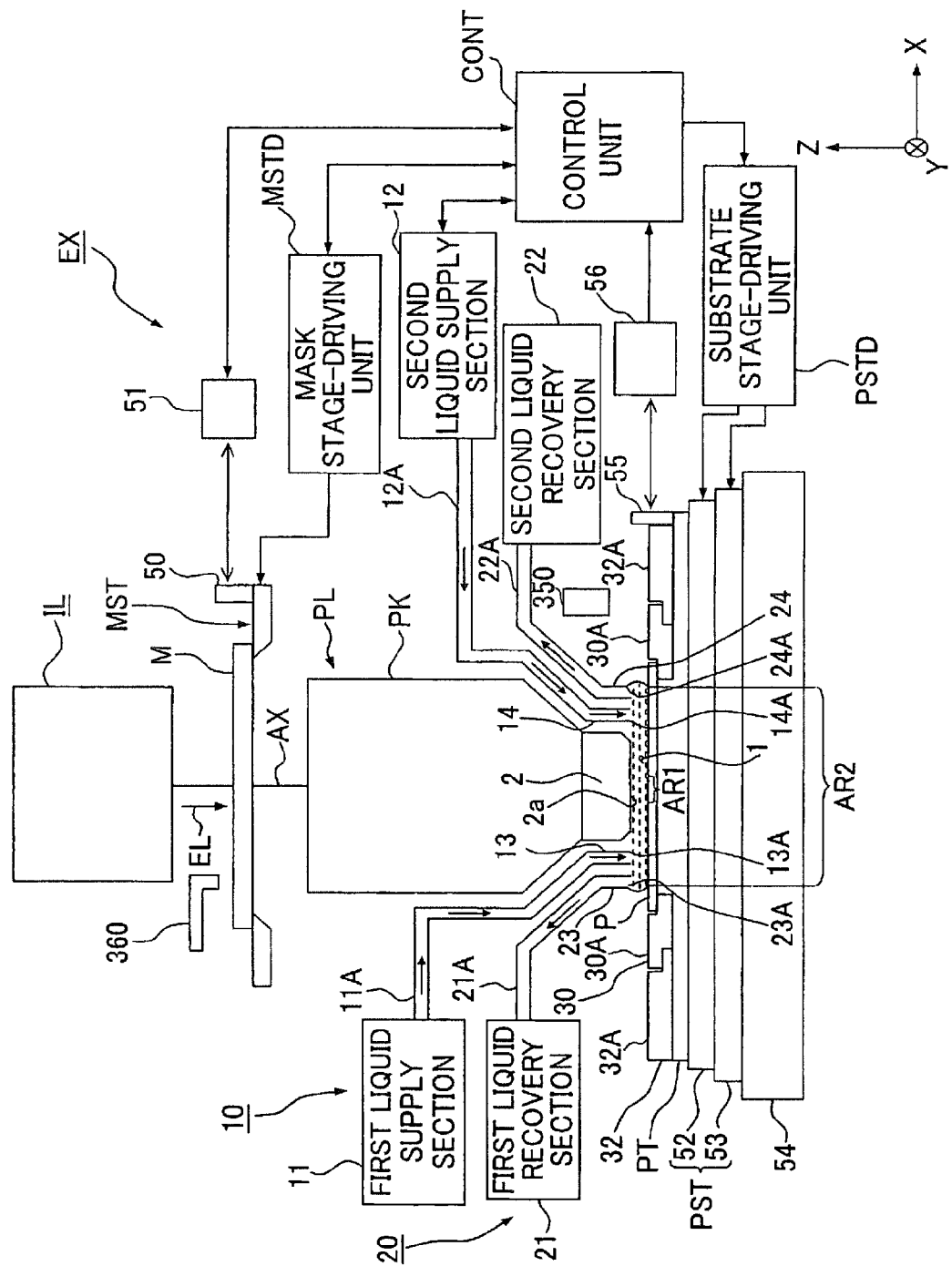
FIG. 1 shows a schematic arrangement illustrating an embodiment of an exposure apparatus of the present invention.

FIG. 1 shows a schematic arrangement illustrating an embodiment of the exposure apparatus of the present invention. With reference to FIG. 1, an exposure apparatus EX includes a mask stage MST which supports a mask M, a substrate stage PST which supports a substrate P by the aid of a substrate table PT, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, and a control unit CONT which integrally controls the overall operation of the exposure apparatus EX.

The liquid immersion method is applied to the exposure apparatus EX of the embodiment of the present invention in order that the exposure wavelength is substantially shortened to improve the resolution and the depth of focus is substantially widened. The liquid immersion exposure apparatus includes a liquid supply mechanism 10 which supplies the liquid 1 onto the substrate P, and a liquid recovery mechanism 20 which recovers the liquid 1 from the surface of the substrate P. In embodiment of the present invention, pure water is used as the liquid 1. The exposure apparatus EX forms a liquid immersion area AR2 (locally) on at least a part of the substrate P including a projection area AR1 of the projection optical system PL by the liquid 1 supplied from the liquid supply mechanism 10 at least during the period in which the image of the pattern of the mask M is transferred onto the substrate P. Specifically, the exposure apparatus EX is operated as follows. That is, the space between the surface (exposure surface) of the substrate P and the optical element 2 disposed at the end portion of the projection optical system PL is filled with the liquid 1. The image of the pattern of the mask M is projected onto the substrate P to expose the substrate P therewith via the projection optical system PL and the liquid 1 disposed between the projection optical system PL and the substrate P.

The embodiment of the present invention will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the Z axis direction is the direction which is coincident with the optical axis AX of the projection optical system PL, the X axis direction is the synchronous movement direction (scanning direction) for the mask M and the substrate P in the plane perpendicular to the Z axis direction, and the Y axis direction (non-scanning direction) is the direction which is perpendicular to the Z axis direction and the X axis direction. The directions of rotation (inclination) about the X axis, the Y axis, and the Z axis are designated as θX, θY, and θZ directions respectively. The term "substrate" referred to herein includes those obtained by coating a semiconductor wafer surface with a photoresist as a photosensitive material, and the term "mask" includes a reticle formed with a device pattern to be subjected to the reduction projection onto the substrate.

The illumination optical system IL is used so that the mask M, which is supported on the mask stage MST, is illuminated with the exposure light beam EL. The illumination optical system IL includes, for example, an exposure light source, an optical integrator (homogenizer) which uniformizes the illuminance of the light flux radiated from the exposure light source, a condenser lens which collects the exposure light beam EL emitted from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used. As described above, the liquid 1 is pure water in this embodiment, through which the exposure light beam EL is transmissive even when the exposure light beam EL is the ArF excimer laser beam. The emission line (g-ray, h-ray, i-ray) and the far ultraviolet light beam (DUV light beam) such as the KrF excimer laser beam (wavelength: 248 nm) are also transmissive through pure water.

The mask stage MST supports the mask M, while the mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. A movement mirror 50 is provided on the mask stage MST. A laser interferometer 51 is provided at a position opposed to the movement mirror 50. The position in the two-dimensional direction and the angle of rotation of the mask M on the mask stage MST are measured in real-time by the laser interferometer 51. The result of the measurement is outputted to the control unit CONT. The control unit CONT drives the mask stage-driving unit MSTD on the basis of the result of the measurement obtained by the laser interferometer 51 to thereby position the mask M supported on the mask stage MST.

The projection optical system PL projects the pattern on the mask M onto the substrate P at a predetermined projection magnification β to perform the exposure. The projection optical system PL includes a plurality of optical elements including the optical element (lens) 2 provided at the end portion on the side of the substrate P. The optical elements are supported by a barrel PK. In this embodiment, the projection optical system PL is based on the reduction system having the projection magnification β which is, for example, ¼ or ⅕. The projection optical system PL may be any one of the 1× magnification system and the magnifying system. The projection optical system PL may be any one of the catoptric system including no dioptric element, the dioptric system including no catoptric element, and the catadioptric system including dioptric and catoptric elements. The optical element 2, which is disposed at the end portion of the projection optical system PL of this embodiment, is provided detachably (exchangeably) with respect to the barrel PK. The liquid 1 in the liquid immersion area AR2 makes contact with the optical element 2.

The optical element 2 is formed of fluorite. Water has a high affinity for fluorite. Therefore, the liquid 1 is successfully allowed to make tight contact with the substantially entire surface of the liquid contact surface 2a of the optical element 2. That is, in this embodiment, the water, which has the high affinity for the liquid contact surface 2a of the optical element 2, is supplied as the liquid 1. Therefore, the highly tight contact is effected between the liquid 1 and the liquid contact surface 2a of the optical element 2. The optical path, which is disposed between the optical element 2 and the substrate P, can be reliably filled with the liquid 1. The optical element 2 may be quartz having a high affinity for water as well. A water-attracting (lyophilic or liquid-attracting) treatment may be performed to the liquid contact surface 2a of the optical element 2 to further enhance the affinity for the liquid 1. The barrel PK makes contact with the liquid (water) 1 at portions disposed in the vicinity of the end portion. Therefore, at least the portions disposed in the vicinity of the end portion are formed of a metal such as Ti (titanium) which has the resistance against rust.

The substrate stage PST supports the substrate P. The substrate stage PST includes a Z stage 52 which holds the substrate P by the aid of the substrate table PT, an XY stage 53 which supports the Z stage 52, and a base 54 which supports the XY stage 53. The substrate table PT holds the substrate P. The substrate table PT is provided on the substrate stage PST (Z stage 52). The substrate stage PST is driven by a substrate stage-driving unit PSTD such as a linear motor. The substrate stage-driving unit PSTD is controlled by the control unit CONT. By driving the Z stage 52, the substrate P held by the substrate table PT is subjected to the control of the position in the Z axis direction (focus position) and the positions in the θX and θY directions. By driving the XY stage 53, the substrate P is subjected to the control of the position in the XY directions (position in the direction substantially parallel to the image plane of the projection optical system PL). That is, the Z stage 52 controls the focus position and the angle of inclination of the substrate P so that the surface of the substrate P is adjusted to match the image plane of the projection optical system PL in the auto-focus manner and the auto-leveling manner, and the XY stage 53 positions the substrate P in the X axis direction and the Y axis direction. It goes without saying that the Z stage and the XY stage may be provided as an integrated body. Those usable for the auto-focus/auto-leveling detecting system include, for example, an arrangement disclosed in Japanese Patent Application Laid-open No. 8-37149.

A movement mirror 55, which is movable together with the substrate stage PST with respect to the projection optical system PL, is provided on the substrate stage PST (substrate table PT). A laser interferometer 56 is provided at a position opposed to the movement mirror 55. The angle of rotation and the position in the two-dimensional direction of the substrate P on the substrate stage PST (substrate table PT) are measured in real-time by the laser interferometer 56. The result of the measurement is outputted to the control unit CONT. The control unit CONT drives the substrate stage-driving unit PSTD on the basis of the result of the measurement of the laser interferometer 56 to thereby position the substrate P supported on the substrate stage PST.

A substrate alignment system 350, which detects the alignment mark on the substrate P or the reference mark (described later on) provided on the substrate stage PST (substrate table PT), is arranged over those disposed in the vicinity of the substrate stage PST (substrate table PT). A mask alignment system 360, which detects the reference mark provided on the substrate stage PST (substrate table PT) via the mask M and the projection optical system PL by using a light beam having the same wavelength as that of the exposure light beam EL, is provided in the vicinity of the mask stage MST. Those usable for the arrangement of the substrate alignment system 350 include, for example, one disclosed in Japanese Patent Application Laid-open No. 4-65603 (corresponding to U.S. Pat. No. 5,493,403). Those usable for the arrangement of the mask alignment system 360 include, for example, one disclosed in Japanese Patent Application Laid-open No. 7-176468 (corresponding to U.S. Pat. No. 5,646,413).

A plate member 30, which surrounds the substrate P held by the substrate table PT, is provided on the substrate table PT. The plate member 30 is a member distinct from the substrate table PT. The plate member 30 is provided detachably with respect to the substrate table PT, and the plate member 30 is exchangeable. The plate member 30 has a flat surface (flat portion) 30A which is substantially flush with the surface of the substrate P held by the substrate table PT. The flat surface 30A is arranged around the substrate P held by the substrate table PT. Further, a second plate member 32, which has a flat surface 32A substantially flush with the flat surface 30A of the plate member 30, is provided outside the plate member 30 on the substrate table PT. The second plate member 32 is provided detachably with respect to the substrate table PT as well, and the second plate member 32 is exchangeable.

The liquid supply mechanism 10, which supplies the predetermined liquid 1 onto the substrate P, includes a first liquid supply section 11 and a second liquid supply section 12 which are capable of supplying the liquid 1, a first supply member 13 which is connected to the first liquid supply section 11 via a supply tube 11A having a flow passage and which has a supply port 13A for supplying the liquid 1 fed from the first liquid supply section 11 onto the substrate P, and a second supply member 14 which is connected to the second liquid supply section 12 via a supply tube 12A having a flow passage and which has a supply port 14A for supplying the liquid 1 fed from the second liquid supply section 12 onto the substrate P. The first and second supply members 13, 14 are arranged closely to the surface of the substrate P, and they are provided at mutually different positions in the surface direction of the substrate P. Specifically, the first supply member 13 of the liquid supply mechanism 10 is provided on one side (−X side) in the scanning direction with respect to the projection area AR1. The second supply member 14 is provided on the other side (+X side) in the scanning direction with respect to the projection area AR1.

Each of the first and second liquid supply sections 11, 12 includes, for example, a tank for accommodating the liquid 1, and a pressurizing pump (these components are not shown). The first and second liquid supply sections 11, 12 supply the liquid 1 onto the substrate P via the supply tubes 11A, 12A and the supply members 13, 14 respectively. The operation of each of the first and second liquid supply sections 11, 12 for supplying the liquid is controlled by the control unit CONT. The control unit CONT is capable of controlling the liquid supply amounts per unit time onto the substrate P by the first and second liquid supply sections 11, 12 independently respectively. Each of the first and second liquid supply sections 11, 12 includes a temperature-adjusting mechanism for the liquid. The liquid 1, which has approximately the same temperature (for example, 23° C.) as the temperature in the chamber for accommodating the apparatus therein, can be supplied onto the substrate P by the temperature-adjusting mechanism. It is not necessarily indispensable that the exposure apparatus EX is provided with the tank, the pressurizing pump, and the temperature-adjusting mechanism of each of the liquid supply sections 11, 12 which may be replaced with the equipment of the factory or the like in which the exposure apparatus EX is installed.

The liquid recovery mechanism 20 recovers the liquid 1 from the surface of the substrate P. The liquid recovery mechanism 20 includes first and second recovery members 23, 24 each of which has a recovery port 23A, 24A arranged closely to the surface of the substrate P, and first and second liquid recovery sections 21, 22 which are connected to the first and second recovery members 23, 24 via recovery tubes 21A, 22A having flow passages respectively. Each of the first and second liquid recovery sections 21, 22 includes, for example, a vacuum system (sucking unit) such as a vacuum pump, a gas/liquid separator, and a tank for accommodating the recovered liquid 1 (these components are not shown). The first and second liquid recovery sections 21, 22 recover the liquid 1 from the surface of the substrate P via the first and second recovery members 23, 24 and the recovery tubes 21A, 22A, respectively. The operation of each of the first and second liquid recovery sections 21, 22 for recovering the liquid is controlled by the control unit CONT. The control unit CONT is capable of controlling the liquid recovery amounts per unit time by the first and second liquid recovery sections 21, 22 independently respectively. It is not necessarily indispensable that the exposure apparatus EX is provided with the vacuum system, the gas/liquid separator, and the tank of each of the liquid recovery sections 21, 22 which may be replaced with the equipment of the factory or the like in which the exposure apparatus EX is installed.

Figure 2:
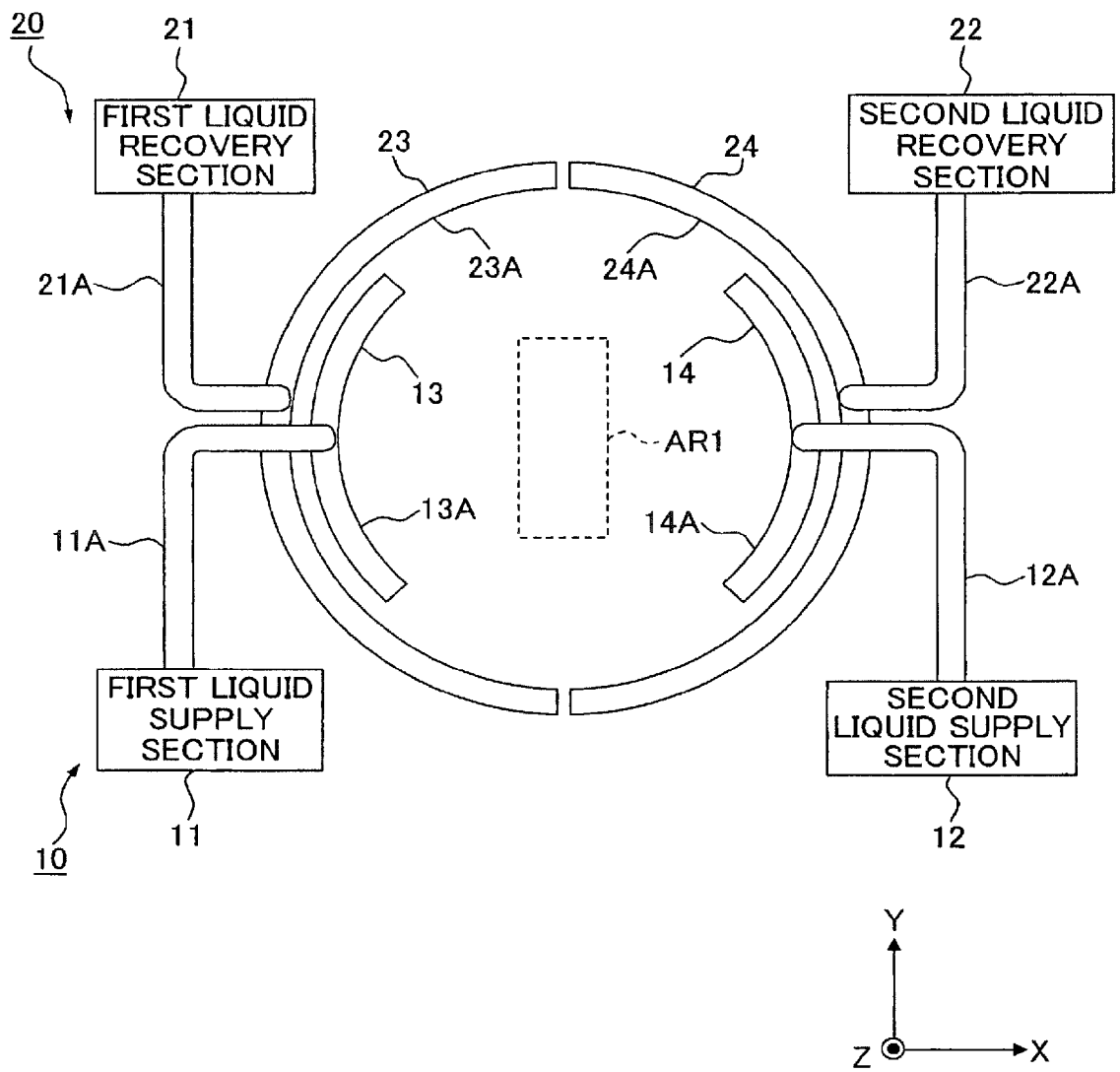
FIG. 2 shows a schematic plan view illustrating a liquid supply mechanism and a liquid recovery mechanism.

FIG. 2 shows a plan view illustrating a schematic arrangement of the liquid supply mechanism 10 and the liquid recovery mechanism 20. As shown in FIG. 2, the projection area AR1 of the projection optical system PL is designed to have a slit shape (rectangular shape) in which the Y axis direction (non-scanning direction) is the longitudinal direction. The liquid immersion area AR2, which is filled with the liquid 1, is formed on a part of the substrate P so that the projection area AR1 is included therein. The first supply member 13 of the liquid supply mechanism 10, which is used to form the liquid immersion area AR2 of the projection area AR1, is provided on one side (−X side) in the scanning direction with respect to the projection area AR1, and the second supply member 14 is provided on the other side (+X side).

The first and second supply members 13, 14 are formed to be substantially circular arc-shaped respectively as viewed in a plan view. The size in the Y axis direction of the supply port 13A, 14A is designed to be larger than at least the size in the Y axis direction of the projection area AR1. The supply ports 13A, 14A, which are formed to be substantially circular arc-shaped as viewed in a plan view, are arranged to interpose the projection area AR1 in relation to the scanning direction (X axis direction). The liquid supply mechanism 10 simultaneously supplies the liquid 1 on the both sides of the projection area AR1 by the aid of the supply ports 13A, 14A of the first and second supply members 13, 14.

Each of the first and second recovery members 23, 24 of the liquid recovery mechanism 20 has a recovery port 23A, 24A which is formed continuously to be circular arc-shaped so that the recovery port 23A, 24A is directed to the surface of the substrate P. A substantially annular recovery port is formed by the first and second recovery members 23, 24 which are arranged so that they are opposed to one another. The recovery ports 23A, 24A of the first and second recovery members 23, 24 respectively are arranged to surround the projection area AR1 and the first and second supply members 13, 14 of the liquid supply mechanism 10.

The liquid 1, which is supplied onto the substrate P from the supply ports 13A, 14A of the first and second supply members 13, 14, is supplied so that the liquid 1 is spread while causing the wetting between the substrate P and the lower end surface of the end portion (optical element 2) of the projection optical system PL. The liquid 1, which outflows to the outside of the first and second supply members 13, 14 with respect to the projection area AR1, is recovered from the recovery ports 23A, 24A of the first and second recovery members 23, 24 which are arranged outside with respect to the projection area AR1 as compared with the first and second supply members 13, 14.

In this embodiment, when the substrate P is subjected to the scanning exposure, the liquid supply amount per unit time, which is supplied in front of the projection area AR1 in relation to the scanning direction, is set to be larger than the liquid supply amount supplied from the side opposite thereto. For example, when the exposure process is performed while moving the substrate P in the +X direction, the control unit CONT is operated so that the liquid amount, which is supplied from the −X side (i.e., from the supply port 13A) with respect to the projection area AR1, is larger than the liquid amount which is supplied from the +X side (i.e., from the supply port 14A). On the other hand, when the exposure process is performed while moving the substrate P in the −X direction, the control unit CONT is operated so that the liquid amount, which is supplied from the +X side with respect to the projection area AR1, is larger than the liquid amount which is supplied from the −X side. The liquid recovery amount per unit time, which is recovered in front of the projection area AR1 in relation to the scanning direction, is set to be smaller than the liquid recovery amount on the side opposite thereto. For example, when the substrate P is moved in the +X direction, the recovery amount, which is recovered from the +X side (i.e., from the recovery port 24A) with respect to the projection area AR1, is larger than the recovery amount which is recovered from the −X side (i.e., from the recovery port 23A).

The mechanism, with which the liquid immersion area AR2 is locally formed on the substrate P (substrate stage PST), is not limited to the mechanism as described above. It is also possible to adopt, for example, mechanisms disclosed in United States Patent Application Publication No. 2004/020782 and International Publication No. 2004/055803, the content of which are incorporated herein by reference within a range of permission of the domestic laws and ordinances of the state designated or selected in this international application.

Figure 3:
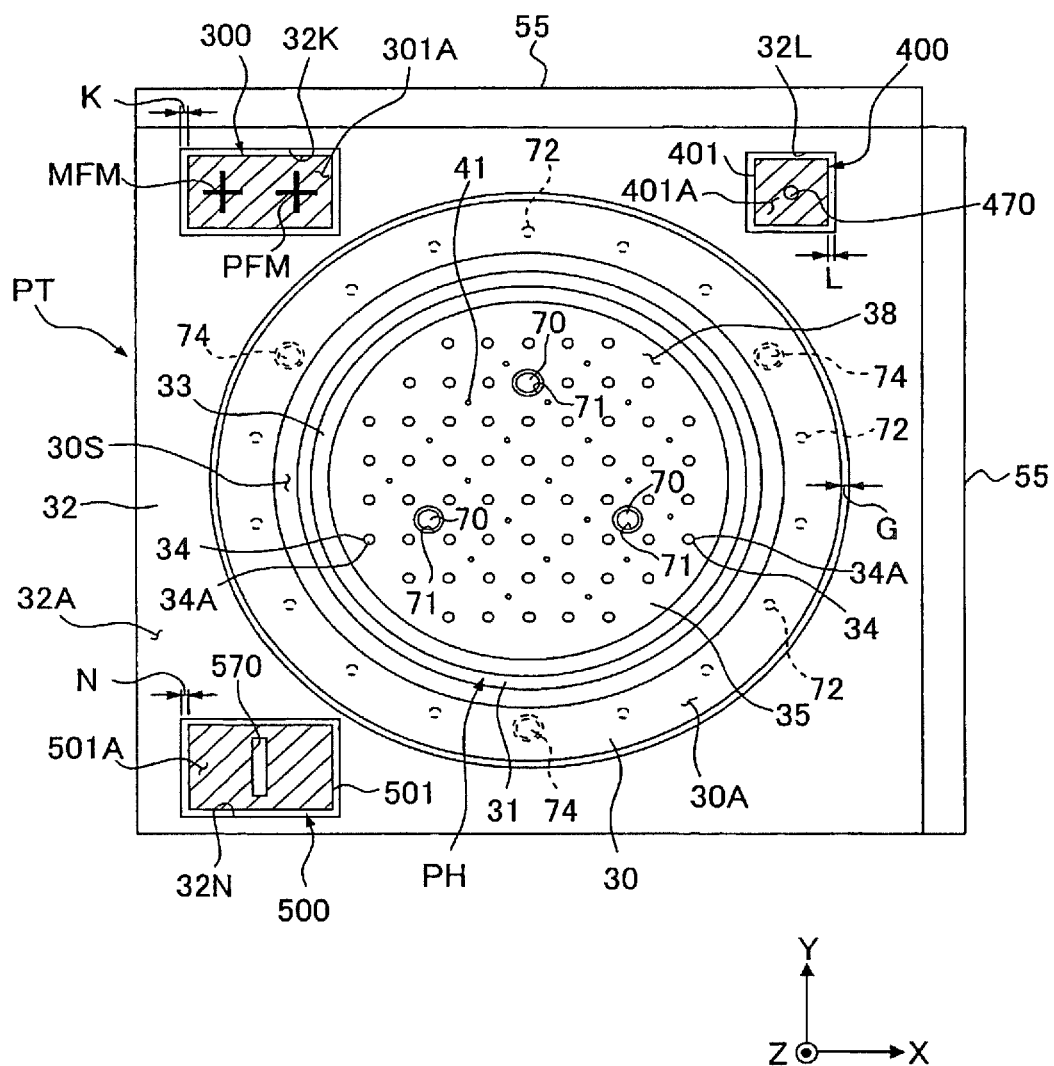
FIG. 3 shows a plan view illustrating a substrate table.
Figure 4:
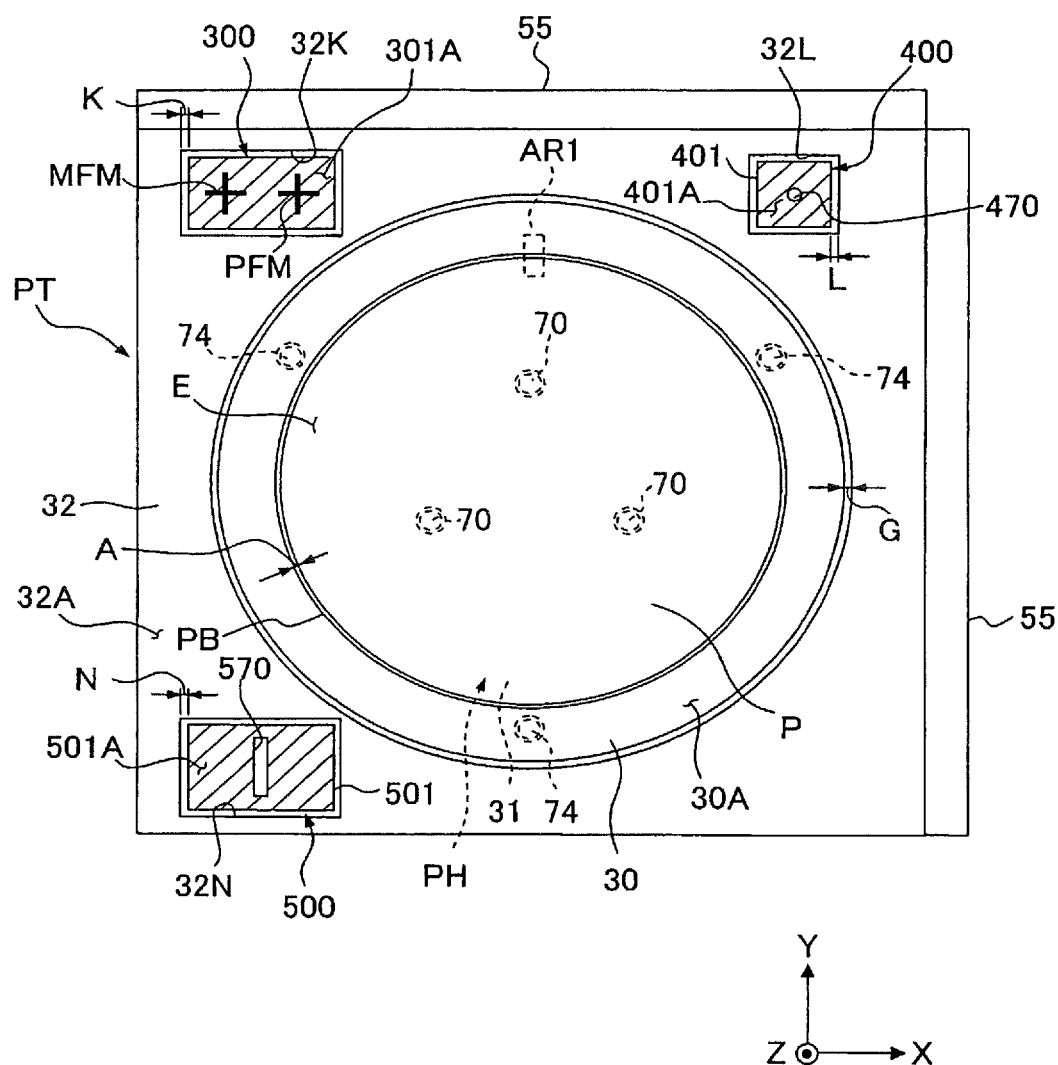
FIG. 4 shows a plan view illustrating the substrate table in a state in which a substrate is held.

FIG. 3 shows a plan view illustrating the substrate table PT as viewed from an upper position. FIG. 4 shows a plan view illustrating the substrate table PT which holds the substrate P as viewed from an upper position. With reference to FIGS. 3 and 4, movement mirrors 55 are arranged at two edge portions of the substrate table PT which is rectangular as viewed in a plan view, the two edge portions being perpendicular to one another. A recess 31 is formed at a substantially central portion of the substrate table PT. The substrate holder PH, which constructs a part of the substrate table PT, is arranged in the recess 31. The substrate P is held by the substrate holder PH. The plate member 30, which has the flat surface 30A having approximately the same height as that of (being flush with) the surface of the substrate P, is provided around the substrate P (substrate holder PH). The plate member 30 is an annular member, which is arranged to surround the substrate holder PH (substrate P). The plate member 30 is formed of a material having the liquid repellence such as fluoride including, for example, polytetrafluoroethylene (Teflon (trade name)). The liquid immersion area AR2 can be satisfactorily formed on the image plane side of the projection optical system PL even when the edge area E of the substrate P is subjected to the liquid immersion exposure, because the plate member 30, which has the flat surface 30A substantially flush with the surface of the substrate P, is provided around the substrate P.

It is also allowable that any difference in height is present between the surface of the substrate P and the flat surface 30A of the plate member 30, on condition that the liquid immersion area AR2 can be formed to fill the optical path space on the image plane side of the projection optical system PL with the liquid 1. For example, the flat surface 30A may be lower than the surface of the substrate P in relation to the Z direction.

As shown in FIGS. 1, 3, and 4, the second plate member 32 is provided outside the plate member 30 (substrate holder PH) on the substrate table PT. The second plate member 32 has the flat surface 32A which has substantially the same height as that of (is flush with) the surface of the substrate P and the flat surface 30A of the plate member 30. The second plate member 32 is provided to cover the substantially entire region of the upper surface of the substrate table PT except for the substrate holder PH (substrate P) and the plate member 30. The second plate member 32 is also formed of a material having the liquid repellence including, for example, polytetrafluoroethylene.

The contact angle of the liquid 1 on the surface of the flat surface 30A of the plate member 30 and the contact angle of the liquid 1 on the surface of the flat surface 32A of the second plate member 32 are not less than 110° respectively in the initial state before the exposure light beam EL is radiated.

A plurality of openings 32K, 32L, 32N are formed at predetermined positions of the second plate member 32. A reference member 300 is arranged in the opening 32K. A reference mark PFM to be detected by a substrate alignment system 350 and a reference mark MFM to be detected by a mask alignment system 360 are provided in a predetermined positional relationship on the reference member 300. The reference member 300 has an upper surface 301A which is a substantially flat surface. The upper surface 301A may be used as a reference plane for the focus/leveling-detecting system as well. Further, the upper surface 301A of the reference member 300 is provided to have approximately the same height as those of (be flush with) the surface of the substrate P, the surface (flat surface) 30A of the plate member 30, and the surface (flat surface) 32A of the second plate member 32. The reference member 300 is formed to be rectangular as viewed in a plan view. A gap K is formed between the second plate member 32 and the reference member 300 arranged in the opening 32K. In this embodiment, the gap K is, for example, about 0.3 mm.

An uneven illuminance sensor 400 as an optical sensor is arranged in the opening 32L. The uneven illuminance sensor is disclosed, for example, in Japanese Patent Application Laid-open No. 57-117238 (corresponding to U.S. Pat. No. 4,465,368), the content of which are incorporated herein by reference within a range of permission of the domestic laws and ordinances of the state designated or selected in this international application. An upper surface 401A of an upper plate 401 of the uneven illuminance sensor 400 is a substantially flat surface, which is provided to have approximately the same height as those of (be flush with) the surface of the substrate P, the surface 30A of the plate member 30, and the surface 32A of the second plate member 32. A pinhole 470, through which the light can pass, is provided for the upper surface 401A of the uneven illuminance sensor 400. Portions of the upper surface 401A of the light-transmissive upper plate 401 except for the pinhole 470 are covered with a light-shielding material such as chromium. The uneven illuminance sensor 400 (upper plate 401) is formed to be rectangular as viewed in a plan view. A gap L is formed between the second plate member 32 and the uneven illuminance sensor 400 (upper plate 401) arranged in the opening 32L. In this embodiment, the gap L is, for example, about 0.3 mm.

A spatial image-measuring sensor 500 as an optical sensor is arranged in the opening 32N. The spatial image-measuring sensor 500 is disclosed, for example, in Japanese Patent Application Laid-open No. 2002-14005 (corresponding to United States Patent Application Publication No. 2002/0041377), the content of which are incorporated herein by reference within a range of permission of the domestic laws and ordinances of the state designated or selected in this international application. An upper surface 501A of an upper plate 501 of the spatial image-measuring sensor 500 is a substantially flat surface, which may be used as a reference plane for the focus/leveling-detecting system as well. The upper surface 501A is provided to have approximately the same height as those of (be flush with) the surface of the substrate P, the surface 30A of the plate member 30, and the surface 32A of the second plate member 32. A slit 570, through which the light can pass, is provided for the upper surface 501A of the spatial image-measuring sensor 500. Portions of the upper surface 501A of the light-transmissive upper plate 501 except for the slit 570 are covered with a light-shielding material such as chromium. The spatial image-measuring sensor 500 (upper plate 501) is formed to be rectangular as viewed in a plan view. A gap N is formed between the spatial image-measuring sensor 500 (upper plate 501) and the opening 32N. In this embodiment, the gap N is in approximately the same degree as the production tolerance or margin for the outer shape of the substrate P, for example, about 0.3 mm. As described above, the substrate table PT, which holds the substrate P, has the upper surface which is substantially flush over the entire surface.

It is also allowable that any mutual difference in height is present in relation to the flat surface 30A of the plate member 30, the surface 32A of the second plate member 32, the upper surface 301A of the reference member 300, the upper surface 401A of the uneven illuminance sensor 400, and the upper surface 501A of the spatial image-measuring sensor 500, on condition that the liquid immersion area AR2 can be formed to fill the optical path space on the image plane side of the projection optical system PL with the liquid 1.

Although not shown, the substrate table PT is also provided with a radiation amount sensor (illuminance sensor) which is arranged in an opening formed for the second plate member 32. The radiation amount sensor is disclosed, for example, in Japanese Patent Application Laid-open No. 11-16816 (corresponding to United States Patent Application Publication No. 2002/0061469), the content of which are incorporated herein by reference within a range of permission of the domestic laws and ordinances of the state designated or selected in this international application.

The measuring units, which are provided on the substrate table PT, are not limited to those described above. Various measuring units can be provided, if necessary. For example, a wave front aberration-measuring unit may be arranged on the substrate table PT. The wave front aberration-measuring unit is disclosed, for example, in International Publication No. 99/60361 (corresponding to European Patent Publication No. 1,079,223) and U.S. Pat. No. 6,650,399, the content of which are incorporated herein by reference within a range of permission of the domestic laws and ordinances of the state designated or selected in this international application. Of course, it is also allowable that no measuring unit is provided on the substrate table PT.

The flat surface 30A of the plate member 30, which is formed to have the annular shape, has the width which is formed to be larger than at least the projection area AR1 (see FIG. 4). Therefore, when the edge area E of the substrate P is subjected to the exposure, the exposure light beam EL is not radiated onto the second plate member 32. Accordingly, it is possible to suppress the deterioration of the liquid repellence of the second plate member 32 which would be caused by the radiation of the exposure light beam. The frequency of the exchange of the second plate member 32 can be made smaller than the frequency of the exchange of the plate member 30. Further, it is preferable that the width of the flat surface 30A is formed to be larger than the liquid immersion area AR2 which is formed on the image plane side of the projection optical system PL. Accordingly, when the edge area E of the substrate P is subjected to the liquid immersion exposure, then the liquid immersion area AR2 is arranged on the flat surface 30A of the plate member 30, and the liquid immersion area AR2 is not arranged on the second plate member 32. Therefore, it is possible to avoid the inconvenience which would be otherwise caused such that the liquid 1 of the liquid immersion area AR2 inflows into the gap G as the interstice between the plate member 30 and the second plate member 32. The width of the flat surface 30A of the plate member 30 is not limited to those described above. It goes without saying that the width may be smaller than the liquid immersion area AR2.

Figure 5:
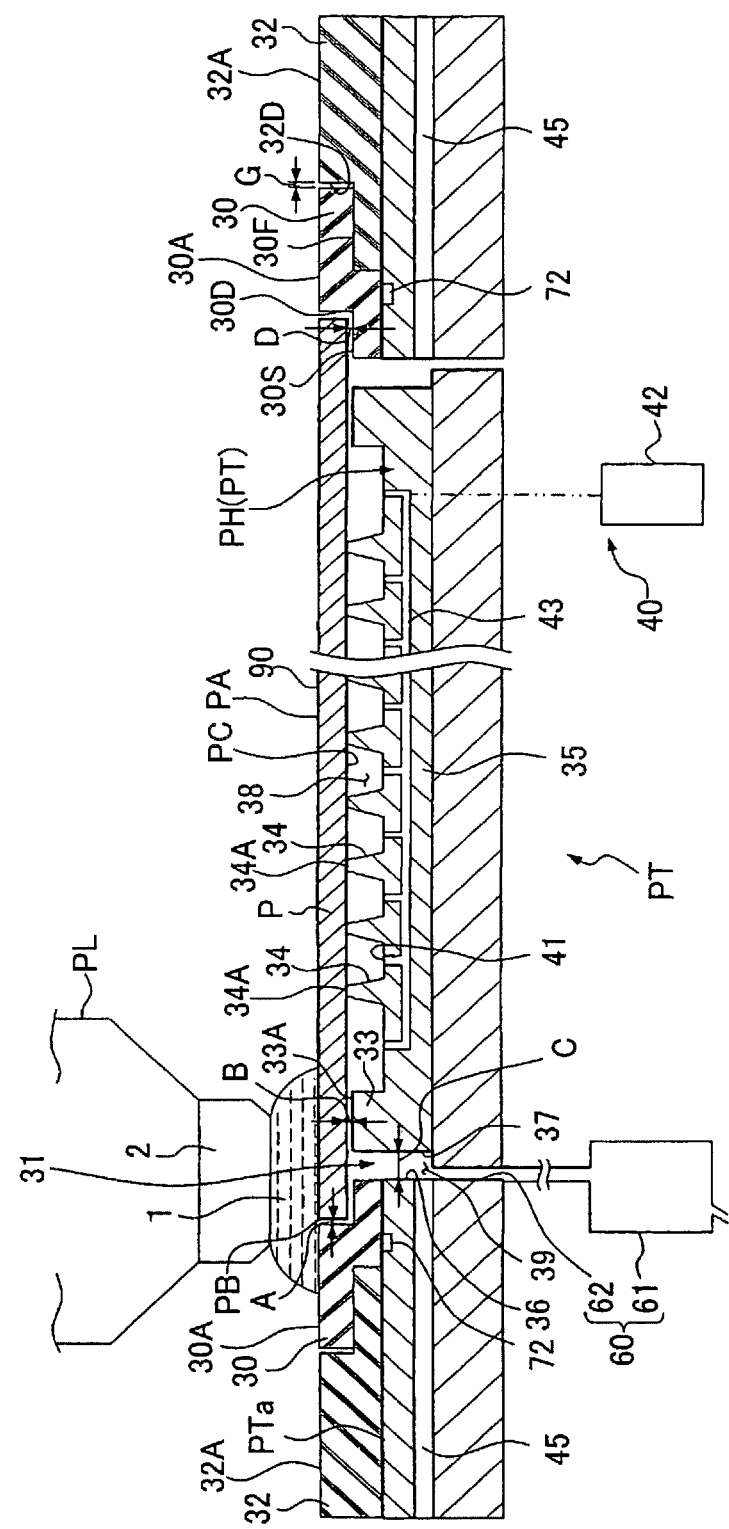
FIG. 5 shows a sectional view illustrating the substrate table.

As shown in FIG. 3 and FIG. 5 which is a magnified sectional view illustrating main parts of the substrate table PT which holds the substrate P, the substrate holder PH, which constructs a part of the substrate table PT, includes a substantially annular circumferential wall portion 33, a plurality of support portions 34 which are provided on a base portion 35 disposed inside the circumferential wall portion 33 and which support the substrate P, and a plurality of suction ports 41 which are arranged between the support portions 34 and which are provided in order to attract and hold the substrate P. The support portions 34 and the suction ports 41 are arranged uniformly at the inside of the circumferential wall portion 33. In FIG. 5, the upper end surface of the circumferential wall portion 33 is depicted to have a relatively wide width. However, the upper end surface actually has only a width of about 1 to 2 mm. The base portion 35 is provided with holes 71 which are arranged with lifting members 70 constructed of pin members for moving the substrate P upwardly and downwardly. In this embodiment, the lifting members 70 are provided at three positions. The lifting member 70 is moved upwardly and downwardly by an unillustrated driving unit. The control unit CONT controls the upward/downward movement of the lifting member 70 by the aid of the driving unit.

As shown in FIG. 5, a plurality of suction holes 72, which are provided in order to attract and hold the plate member 30 with respect to the substrate table PT, are disposed at positions of the upper surface of the substrate table PT opposed to the lower surface of the plate member 30. Lifting members 74, which are constructed of pin members for moving the plate member 30 upwardly and downwardly with respect to the substrate table PT, are provided at a plurality of positions (three positions in this arrangement) of the substrate table PT. The lifting member 74 is moved upwardly and downwardly by an unillustrated driving unit. The control unit CONT controls the upward and downward movement of the lifting member 74 by the aid of the driving unit (see FIG. 7(d)). Further, although not shown, a plurality of suction holes, which are provided in order to attract and holds the second plate member 32 with respect to the substrate table PT, are disposed at positions of the upper surface of the substrate table PT opposed to the lower surface of the second plate member 32. Lifting members, which move the second plate member 32 upwardly and downwardly with respect to the substrate table PT, are provided at a plurality of positions of the substrate table PT.

The exchange frequency of the second plate member 32 is small as described above. Therefore, the second plate member 32 may be fixed by, for example, the screw fastening rather than being attracted and held with respect to the substrate table PT, and the exchange operation may be performed manually. It is also allowable that the second plate member 32 is not exchangeable.

However, the exposure light beam EL or any light beam having the same wavelength as that of the exposure light beam is radiated onto the second plate member 32, for example, when the reference member 300 and/or the uneven illuminance sensor 400 is used, it is feared that the liquid repellence of the surface of the second plate member 32 may be deteriorated. In this case, there is such a possibility that the exchange frequency equivalent to that of the plate member 30 may be required.

As shown in FIGS. 4 and 5, a predetermined gap A is formed between the plate member 30 and a side surface PB of the substrate P held by the substrate holder PH (substrate table PT).

With reference to FIG. 5, the substrate holder PH, which holds the substrate P, is arranged in the recess 31 of the substrate table PT. The substrate table PT is formed so that an upper end surface 34A of the substrate holder PH is higher than the placing surface PTa of the substrate table PT for the plate member 30 and the second plate member 32, when the substrate holder PH is arranged in the recess 31. The circumferential wall portion 33 and the support portions 34 are provided on the substantially disk-shaped base portion 35 which constructs a part of the substrate holder PH. Each of the support portions 34 is trapezoidal as viewed in a sectional view. The back surface PC of the substrate P is held by the upper end surface 34A of the plurality of support portions 34. The upper surface 33A of the circumferential wall portion 33 is a flat surface. The height of the circumferential wall portion 33 is lower than the height of the support portion 34. A gap B is formed between the substrate P and the circumferential wall portion 33. The gap B is smaller than the gap A which is provided between the plate member 30 and the side surface PB of the substrate P. A gap C is formed between the inner side surface 36 of the recess 31 and the side surface 37 of the substrate holder PH opposed to the inner side surface 36. In this arrangement, the diameter of the substrate holder PH is formed to be smaller than the diameter of the substrate P. The gap A is smaller than the gap C. In this embodiment, any cutout (for example, orientation flat or notch), which is to be used for the positioning, is not formed for the substrate P. The substrate P is substantially circular. The gap A is 0.1 mm to 1.0 mm, which is about 0.3 mm in this embodiment over the entire circumference of the substrate. Therefore, it is possible to avoid the inflow of the liquid. When any cutout is formed for the substrate P, the plate member 30 and the circumferential wall portion 33 may be allowed to shapes adapted to the cutout, for example, such that projections are provided for the plate member 30 and the circumferential wall portion 33 depending on the cutout. Accordingly, the gap A can be also secured between the substrate P and the plate member 30 at the cutout of the substrate P.

An inner stepped portion 30D is formed at an inner portion of the plate member 30. A support surface 30S, which is opposed to the edge portion of the substrate lower surface PC, is formed by the inner stepped portion 30D. The plate member 30 is capable of supporting the edge portion of the substrate lower surface PC by the support surface 30S. In this arrangement, as shown in FIG. 5, a gap D is formed between the edge portion of the substrate lower surface PC held by the substrate holder PH and the support surface 30S of the plate member 30 held by the placing surface PTa of the substrate table PT. Accordingly, it is possible to avoid the occurrence of the inconvenience which would be otherwise caused such that the plate member 30 (support surface 30S) abuts against the edge portion of the substrate lower surface PC, and the edge portion of the substrate P is warped upwardly.

An inner stepped portion 32D is formed at an inner portion of the second plate member 32. An outer stepped portion 30F is formed at an outer portion of the plate member 30 so that the outer stepped portion 30F is adapted to the shape of the inner stepped portion 32D of the second plate member 32. Accordingly, a state is given, in which a part of the plate member 30 is placed on a part of the second plate member 32. A predetermined gap G is formed between the outer side surface of the plate member 30 and the inner side surface of the second plate member 32. In this embodiment, the gap G is, for example, about 0.3 mm. The gap G is interposed by the second plate member 32 and the plate member 30 made of polytetrafluoroethylene having the liquid-repellent surface. Therefore, even when the liquid immersion area is formed at the boundary between the plate member 30 and the second plate member 32, it is possible to avoid the inflow of the liquid into the gap G.

The surface PA as the exposure surface of the substrate P is coated with a photoresist (photosensitive material) 90. In this embodiment, the photosensitive material 90 is a photosensitive material for the ArF excimer laser (for example, TARF-P6100 produced by TOKYO OHKA KOGYO CO., LTD.). The photosensitive material 90 is liquid-repellent (water-repellent), and the contact angle thereof is about 70° to 80°.

In this embodiment, the side surface PB of the substrate P is subjected to a liquid-repelling treatment (water-repelling treatment). Specifically, the side surface PB of the substrate P is also coated with the photosensitive material 90 having the liquid repellence. Accordingly, it is possible to avoid the inflow of the liquid from the gap A between the side surface of the substrate P and the plate member 30 having the liquid-repellent surface. Further, the back surface PC of the substrate P is also subjected to a liquid-repelling treatment by coating the back surface PC with the photosensitive material 90.

In this embodiment, the placing surface PTa and the inner side surface 36 of the substrate table PT have the liquid repellence. Further, a part of the surface of the substrate holder PH is also subjected to the liquid-repelling treatment to have the liquid repellence. In this embodiment, the side surface 37 and the upper surface 33A of the circumferential wall portion 33 of the substrate holder PH have the liquid repellence. When the liquid-repelling treatment is performed for the substrate table PT and the substrate holder PH, for example, a liquid-repellent material including, for example, fluorine-based resin materials and acrylic resin materials is coated, or a thin film composed of the liquid-repellent material as described above is stuck. A material, which is insoluble in the liquid 1, is used as the liquid-repellent material in order to provide the liquid repellence. The entire substrate table PT and/or the entire substrate holder PH may be formed of a material having the liquid repellence (for example, fluorine-based resin).

A first space 38, which is surrounded by the circumferential wall portion 33 of the substrate holder PH, is allowed to have the negative pressure by a sucking unit 40. The sucking unit 40 includes a plurality of suction ports 41 which are provided on the upper surface of the base portion 35 of the substrate holder PH, a vacuum section 42 which includes a vacuum pump provided externally with respect to the substrate table PT, and a flow passage 43 which is formed in the base portion 35 and which connects the plurality of suction ports 41 and the vacuum section 42 respectively. The suction ports 41 are provided at a plurality of predetermined positions of the upper surface of the base portion 35 except for the support portions 34 respectively. The sucking unit 40 sucks the gas (air) contained in the first space 38 formed among the circumferential wall portion 33, the base portion 35, and the substrate P supported by the support portions 34 so that the first space 38 is allowed to have the negative pressure. Accordingly, the substrate P is attracted and held by the support portions 34. The gap B, which is formed between the back surface PC of the substrate P and the upper surface 33A of the circumferential wall portion 33, is minute. Therefore, the negative pressure of the first space is maintained.

The liquid 1, which flows into a second space 39 between the inner side surface 36 of the recess 31 and the side surface 37 of the substrate holder PH, is recovered by a recovery section 60. In this embodiment, the recovery section 60 has a tank 61 which is capable of accommodating the liquid 1, and a flow passage 62 which is provided in the substrate table PT and which connects the space 39 and the external tank 61. The liquid-repelling treatment is also performed to the inner wall surface of the flow passage 62. The liquid, which flows into the space 39, may be temporarily held on the substrate stage PST (substrate table PT), and the liquid may be discharged, for example, to an external tank provided separately from the substrate stage PST at a predetermined timing.

The substrate table PT is formed with a flow passage 45 which connects the second space 39 disposed between the inner side surface 36 of the recess 31 and the side surface 37 of the substrate holder PH and the space (atmospheric air space) disposed outside the substrate table PT. The gas (air) is capable of flowing via the flow passage 45 between the second space 39 and the outside of the substrate table PT. The second space 39 is approximately set to have the atmospheric pressure.

Figure 6:
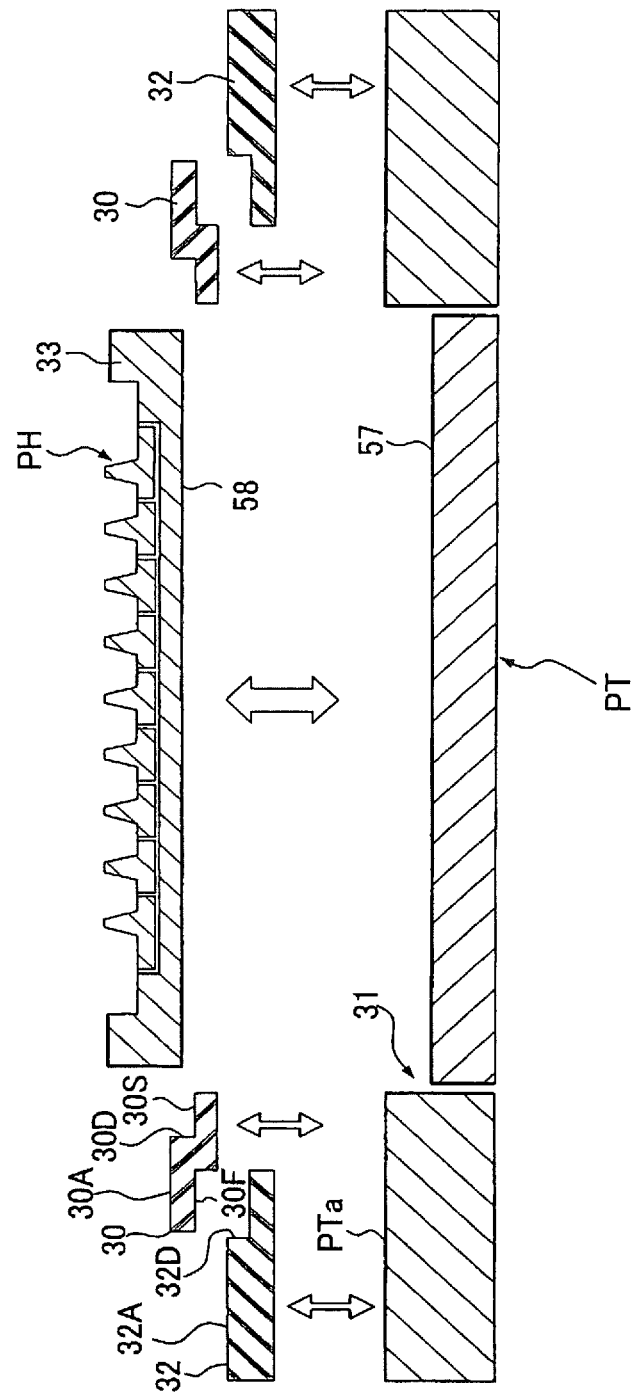
FIG. 6 schematically shows that respective members are detachable with respect to the substrate table.

As shown in FIG. 6, the substrate holder PH, the plate member 30, and the second plate member 32 are independent parts, and are provided detachably with respect to the substrate table PT. The contact surface 57, of the substrate table PT, which makes contact with the substrate holder PH is subjected to the liquid-repelling treatment to have the liquid repellence. Further, the back surface 58 of the substrate holder PH, which is the contact surface with respect to the substrate table PT, is also subjected to the liquid-repelling treatment to have the liquid repellence. The liquid-repelling treatment for the contact surface 57 and the back surface 58 can be performed, for example, by coating the liquid-repellent material such as fluorine-based resin materials and acrylic resin materials as described above.

Figure 7:
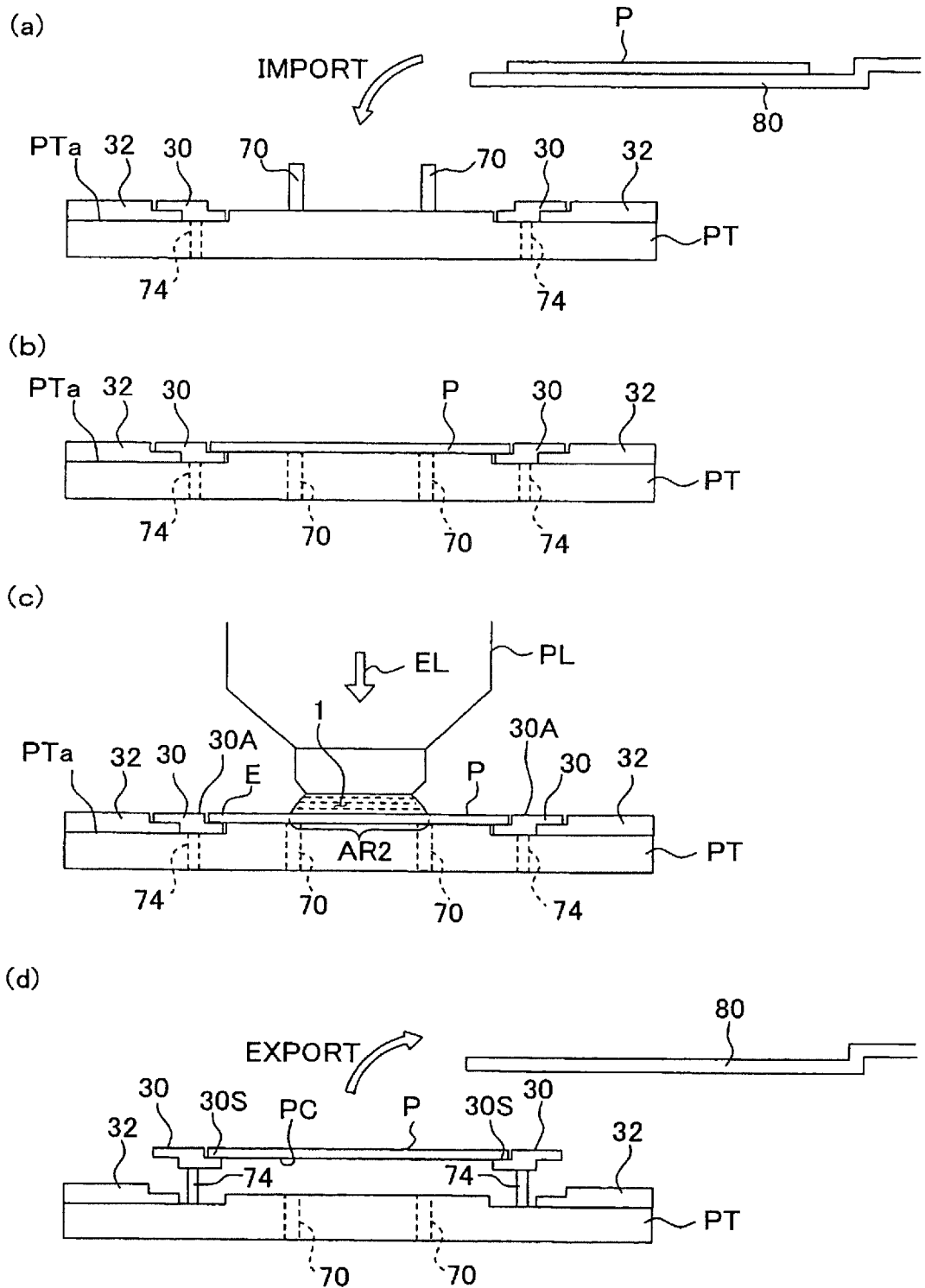
FIGS. 7(a) to 7(d) schematically show an example of the operation of the exposure apparatus of the present invention.
Figure 8:
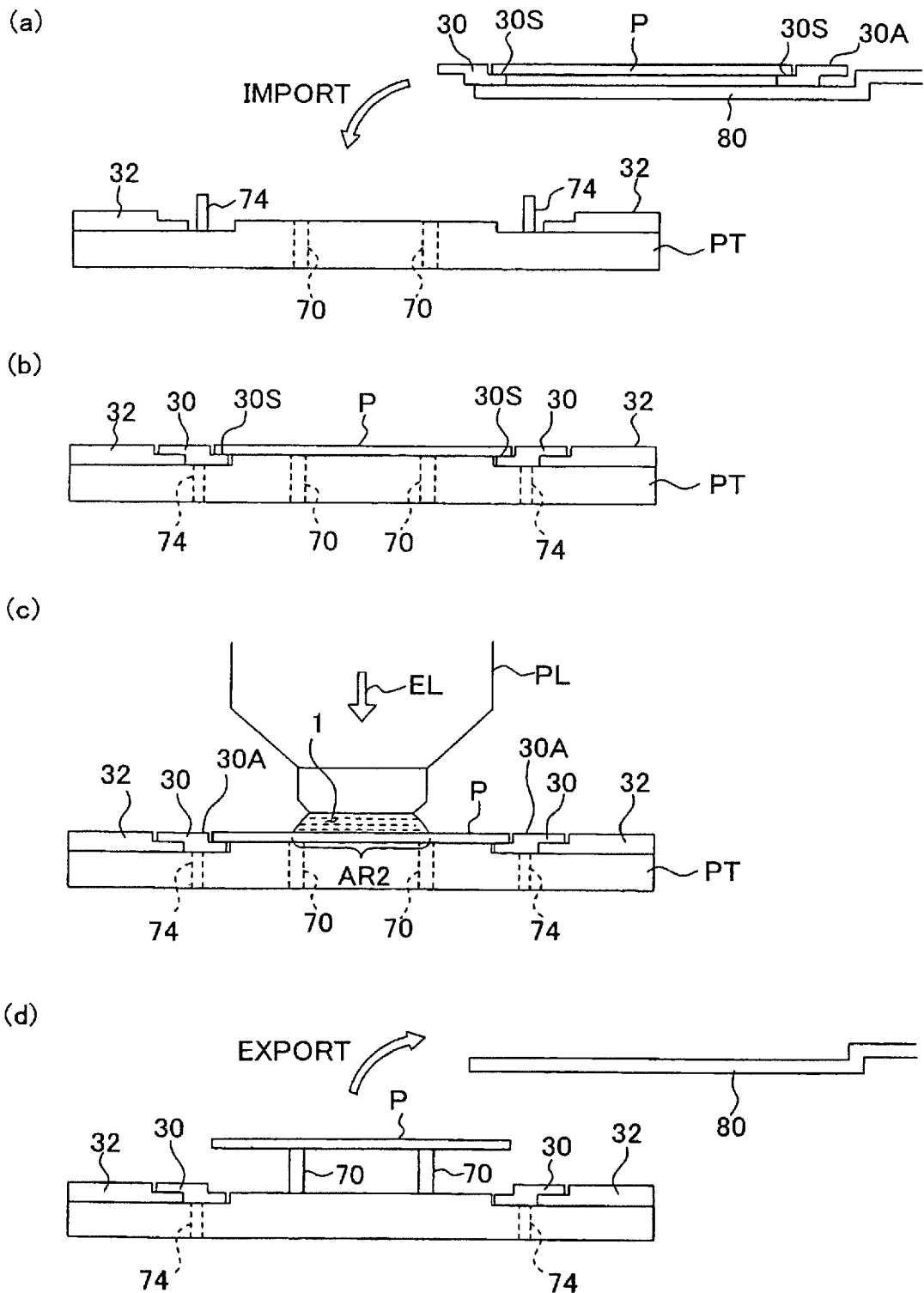
FIGS. 8(a) to 8(d) schematically show an example of the operation of the exposure apparatus of the present invention.

Next, an explanation will be made with reference to schematic views shown in FIGS. 7 and 8 about the method for exposing the substrate P by using the exposure apparatus EX constructed as described above.

As shown in FIG. 7(a), the plate member 30 is attracted and held by the placing surface PTa of the substrate table PT, and the second plate member 32 is also attracted and held by the placing surface PTa of the substrate table PT. The substrate P as the exposure process objective is loaded to the substrate table PT by a transport arm (transport unit) 80. In this situation, the lifting members 70 are moved upwardly. The transport arm 80 delivers the substrate P to the lifting members 70 which are moved upwardly. The lifting members 74 are not moved upwardly. The lifting members 70 are moved downwardly while holding the substrate P delivered from the transport arm 80. Accordingly, as shown in FIG. 7(b), the substrate P is arranged inside the plate member 30, and the substrate P is held by the substrate table PT (substrate holder PH). As shown in FIG. 7(c), the control unit CONT performs the supply and the recovery of the liquid 1 by the liquid supply mechanism 10 and the liquid recovery mechanism 20 to form the liquid immersion area AR2 of the liquid 1 between the projection optical system PL and the substrate P held by the substrate table PT. The control unit CONT radiates the exposure light beam EL onto the substrate P via the projection optical system PL and the liquid 1 to perform the liquid immersion exposure while moving the substrate stage PST which supports the substrate P.

When the edge area E of the substrate P is subjected to the exposure, the exposure light beam EL is radiated onto the flat surface 30A of the plate member 30. As a result of the irradiation with the exposure light beam EL, there is such a possibility that the liquid repellence of the flat surface 30A may be deteriorated. If the liquid repellence of the flat surface 30A is deteriorated, for example, the following inconvenience arises. That is, the liquid 1 of the liquid immersion area AR2 arranged on the flat surface 30A tends to remain to cause the variation of the environment in which the substrate P is placed. Accordingly, the control unit CONT exchanges the plate member 30 in which the liquid repellence is deteriorated, with a new plate member 30 (having sufficient liquid repellence), depending on the deterioration of the liquid repellence of the plate member 30 (flat surface 30A).

Specifically, the liquid 1, which remains on the substrate P and/or the flat surface 30A, is recovered by using, for example, the liquid recovery mechanism 20 after the completion of the liquid immersion exposure process. After that, as shown in FIG. 7(d), the control unit CONT moves the lifting members 74 upwardly after releasing the plate member 30 from the state of being attracted and held. In this situation, the substrate P is also released from the state of being attracted and held by the substrate holder PH. The lifting members 74 are moved upwardly in a state in which the lower surface of the plate member 30 is supported. In this situation, the lifting members 70 are not moved upwardly. Accordingly, the plate member 30 is separated or away from the substrate table PT. In this situation, the support surface 30S of the plate member 30 supports the edge portion of the substrate lower surface PC. Therefore, the substrate P is moved upwardly together with the plate member 30, and the substrate P is separated from the substrate table PT. As described above, the lifting members 74, which construct the attachment/detachment mechanism for attaching/detaching the plate member 30 with respect to the substrate table PT, are capable of detaching the plate member 30 from the substrate table PT together with the substrate P. The transport arm 80 enters the space between the substrate table PT and the plate member 30 having been moved upwardly by the lifting members 74. The transport arm 80 supports the lower surface of the plate member 30. The transport arm 80 unloads the plate member 30 which holds the substrate P, out of the substrate table PT (substrate stage PST).

The unloaded plate member 30 is exchanged with a new plate member 30. As shown in FIG. 8(a), the control unit CONT loads a new plate member 30 which holds a substrate P as the exposure process objective, to the substrate table PT (substrate stage PST) by using the transport arm 80. In this situation, the lifting members 74 are moved upwardly, and the transport arm 80 delivers the plate member 30 which holds the substrate P, to the lifting members 74 which are moved upwardly. The lifting members 70 are not moved upwardly. The lifting members 74 are moved downwardly while holding the plate member 30 which has been delivered from the transport arm 80. Accordingly, as shown in FIG. 8(b), the plate member 30, which holds the substrate P, is arranged inside the second plate member 32, and the plate member 30 is held by the substrate table PT (substrate holder PH). As shown in FIG. 8(c), the control unit CONT performs the supply and the recovery of the liquid 1 by the liquid supply mechanism 10 and the liquid recovery mechanism 20 to form the liquid immersion area AR2 of the liquid 1 between the projection optical system PL and the substrate P held by the substrate table PT. The control unit CONT radiates the exposure light beam EL onto the substrate P via the projection optical system PL and the liquid 1 to perform the liquid immersion exposure while moving the substrate stage PST which holds the substrate P.

When the liquid repellence of the plate member 30 is not deteriorated yet, the liquid 1, which remains, for example, on the substrate P and/or on the upper surface 30A of the plate member 30, is recovered by using, for example, the liquid recovery mechanism 20 after the completion of the liquid immersion exposure. After that, the control unit CONT releases the substrate P from the state of being attracted and held. After that, as shown in FIG. 8(d), the lifting members 70 are moved upwardly. In this situation, the plate member 30 is attracted and held by the substrate table PT. The lifting members 70 are moved upwardly in a state in which the lower surface of the substrate P is supported. In this situation, the lifting members 74 are not moved upwardly. Accordingly, the substrate P is separated from the substrate table PT. The transport arm 80 enters the space between the substrate table PT and the substrate P having been moved upwardly by the lifting members 70, and the lower surface of the substrate P is supported thereby. The transport arm 80 unloads the substrate P from the substrate table PT (substrate stage PST).

Figure 9:
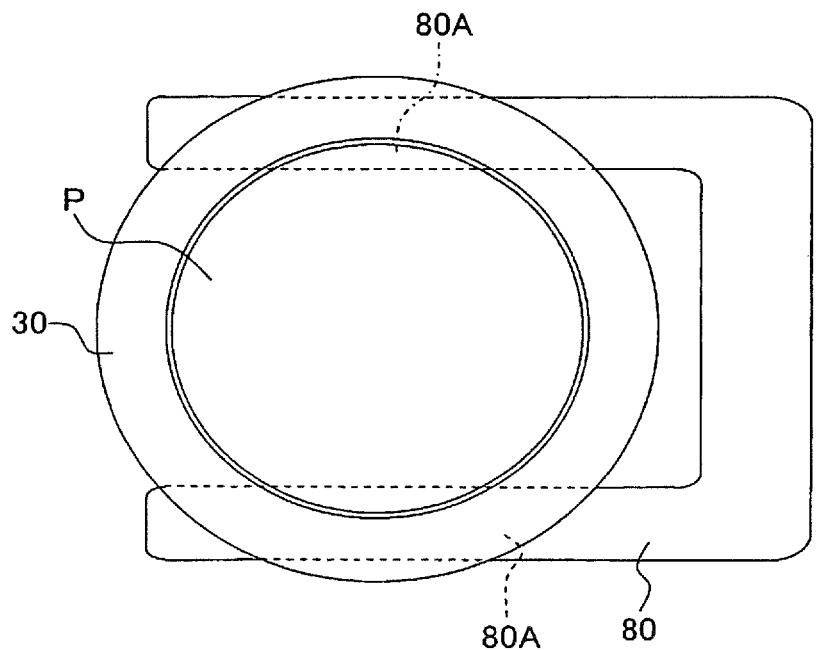
FIG. 9 shows a plan view illustrating a substrate-holding member transported by a transport unit.

As for the transport arm 80, it is also allowable that a transport arm for transporting the plate member 30 and a transport arm for transporting the substrate P are provided separately. However, as shown in FIG. 9, the following arrangement is available. That is, a support surface 80A of a transport arm 80 is formed to be large so that the transport arm 80 can make contact with both of the substrate P and the plate member 30. Accordingly, it is possible to support both of the substrate P and the plate member 30. Therefore, both of the substrate P and the plate member 30 can be transported with one transport arm 80.

As explained above, the liquid-repellent plate members 30, 32, which are provided for the substrate table PT, are provided exchangeably. Therefore, when the liquid repellence of the plate member 30, 32 is deteriorated, the liquid repellence on the substrate table PT can be maintained by merely exchange the plate member 30, 32 with the new plate member 30, 32.

When the liquid-repellent material is coated, or the plate member 30, 32 is formed of the liquid-repellent material in order to provide the liquid repellence of the upper surface of the plate member 30, 32 on the substrate table PT, then the liquid repellence thereof is deteriorated in some cases when the exposure light beam is radiated. In particular, for example, when the fluorine-based resin is used as the liquid-repellent material, and the ultraviolet light is used as the exposure light beam, then the liquid repellence of the plate member 30, 32 tends to be deteriorated (tends to become lyophilic or liquid-attractive). In such a situation, the liquid tends to remain on the plate member 30, 32.

In view of the above, in the embodiment of the present invention, when the liquid repellence of the plate member 30, 32 is deteriorated, the plate member 30, 32 is exchanged with the new plate member 30, 32.

Therefore, it is possible to suppress the remaining of the liquid 1 on the substrate table PT. Even when the liquid 1 remains, the liquid 1 can be smoothly recovered by using, for example, the liquid recovery mechanism 20. Therefore, the deterioration of the exposure accuracy, which would be caused by the remaining liquid 1, can be avoided. It is possible to produce the device which can exhibit the desired performance.

The plate member 30, which has the flat portion 30A around the substrate P, is loaded and unloaded together with the substrate P with respect to the substrate table PT. Accordingly, the plate member 30 can be easily exchanged together with the substrate P with respect to the substrate table PT. Further, the plate member 30 has the flat surface 30A around the substrate P. Therefore, when the plate member 30 is loaded to the substrate table PT together with the substrate P and the liquid immersion exposure is performed for the edge area E of the substrate P, even if a part of the liquid immersion area AR2 of the liquid 1 protrudes to the outside of the substrate P, then the shape of the liquid immersion area AR2 is maintained by the flat surface 30A. The liquid immersion exposure can be performed in such a state that the liquid 1 is satisfactorily retained on the image plane side of the projection optical system PL, without causing, for example, the outflow of the liquid 1.

The inner stepped portion 30D is provided at the inner portion of the plate member 30 to form the support surface 30S so that the edge portion of the substrate lower surface PC can be supported. Therefore, the substrate P can be moved together with the plate member 30 by merely effecting the movement while holding the plate member 30. The corner or turning portion is formed as viewed in a sectional view between the plate member 30 and the substrate P by the inner stepped portion 30D. Therefore, even if the liquid 1 enters the gap A between the plate member 30 and the substrate P, the corner functions as a seal portion. It is possible to avoid the inconvenience which would be otherwise caused such that the liquid 1 inflows into the side of the back surface PC of the substrate P and the substrate stage PST (substrate table PT). Further, the side surface PB of the substrate P is also subjected to the liquid-repelling treatment. Therefore, it is possible to satisfactorily avoid the inflow of the liquid 1 from the gap A between the side surface PB of the substrate P and the plate member 30.

The inconvenience, which would be otherwise caused such that the liquid 1 inflows into the first space 38 via the gap B, can be avoided by providing the liquid repellence for the back surface PC of the substrate P and the upper surface 33A of the circumferential wall portion 33 opposed to the back surface PC. Therefore, it is possible to avoid the occurrence of the inconvenience which would be otherwise caused such that the liquid 1 flows into the suction ports 41. The exposure process can be performed in such a state that the substrate P is satisfactorily attracted and held.

In the embodiment of the present invention, the liquid-repelling treatment is performed to the back surface 58 of the substrate holder PH which is detachable with respect to the substrate table PT, and the contact surface 57, of the substrate table PT, which makes contact with the substrate holder PH. Accordingly, even when the liquid 1 flows into the second space 39, it is possible to suppress the inflow of the liquid 1 into the space between the back surface 58 of the substrate holder PH and the contact surface 57 of the Z stage 52. Therefore, it is possible to avoid, for example, the occurrence of any rust on the back surface 58 of the substrate holder PH and the contact surface 57 of the substrate table PT. If the liquid 1 inflows into the space between the back surface 58 of the substrate holder PH and the contact surface 57 of the substrate table PT, a situation arises such that the substrate holder PH and the Z stage 52 are adhered to one another and they are hardly separated from each other. However, the separation can be effected with ease by providing the liquid repellence.

As for the attachment/detachment mechanism for attaching and detaching the plate member 30 with respect to the substrate table PT, the lifting members 74 are provided to serve as the lifting unit, and the suction holes 72 are provided to serve as the attracting/holding unit for attracting and holding the plate member 30. Therefore, it is possible to smoothly perform the operation for exchanging the plate member 30. The new plate member 30 after the exchange can be satisfactorily held on the substrate table PT.

The inner stepped portion 32D is formed at the inner portion of the second plate member 32, and the outer stepped portion 30F is formed at the outer portion of the plate member 30. Accordingly, the corner is also formed as viewed in a sectional view at the gap between the plate member 30 and the second plate member 32. Therefore, even if the liquid 1 inflows from the gap G, the corner functions as a seal portion. It is possible to avoid the inconvenience which would be otherwise caused such that the liquid 1 arrives at the inside of the substrate table PT.

Figure 10:
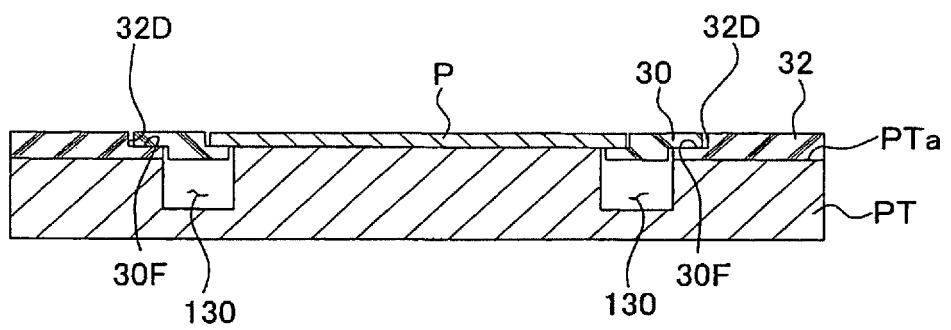
FIG. 10 shows a sectional view illustrating another embodiment of a substrate table.

The outer stepped portion 30F of the plate member 30 can be supported by the inner stepped portion 32D of the second plate member 32. Therefore, it is not necessarily indispensable that the plate member 30 is held by the substrate table PT, because the plate member 30 is supported by the second plate member 32 when the second plate member 32 is attracted and held by the substrate table PT. Therefore, as schematically shown in FIG. 10, a space (dent) 130 can be formed in an area of the substrate table PT opposed to the plate member 30. It is possible to realize a light weight of the substrate table PT (substrate stage PST).

In this arrangement, the substrate P is transported by the transport arm 80 in the state in which the substrate P is held by the plate member 30. Therefore, a relatively wide area of the substrate P is supported by the plate member 30. Therefore, for example, even when the substrate P is large-sized, the flexure (warpage) of the substrate P can be suppressed by transporting the substrate P in the state of being held by the plate member 30.

When the liquid repellence of the flat surface 32A of the second plate member 32 is deteriorated, and the second plate member 32 is exchanged, then the second plate member 32 may be unloaded together with the substrate P and the plate member 30 by using the transport arm 80 after the completion of the liquid immersion exposure for the substrate P, because the second plate member 32 supports the plate member 30. In this arrangement, lifting members for moving the second plate member 32 upwardly and downwardly may be provided in the same manner as the lifting members 74. It is also allowable that the plate member 30 and the second plate member 32 can be separately unloaded and loaded without providing the inner stepped portion 32D of the second plate member 32. In this arrangement, a transport mechanism may be further provided in order to unload and load the second plate member 32.

The timing of the exchange of the plate member 30, 32 is determined depending on the deterioration of the liquid repellence of the flat surface 30A, 32A as described above. The timing of the exchange of the plate member 30, 32 includes, for example, every interval of a predetermined number of pieces of processed substrates and/or every interval of a predetermined period of time. The plate members 30, 32 can be exchanged at predetermined intervals which are previously prescribed. Alternatively, the relationship between the radiation amount (radiation time, illuminance) of the exposure light beam EL and the level of the liquid repellence of the plate member 30, 32 is previously determined by an experiment or simulation. The timing of the exchange of the plate member 30, 32 may be set on the basis of the determined result. The deterioration of the liquid repellence can be evaluated, for example, such that the flat surface 30A, 32A or the like is observed visually or under a microscope, a liquid droplet is dripped onto the surface to be evaluated to observe the state of the liquid droplet visually or under a microscope, or the contact angle of the liquid droplet is measured. When the evaluation as described above is previously recorded in the control unit CONT while providing the relationship in relation to the totalized radiation amount of the ultraviolet light such as the exposure light beam, the control unit CONT can determine the service life of the plate member 30, 32 or the like, i.e., the exchange time (timing) in accordance with the relationship.

The exposure apparatus EX can determine the totalized radiation amount of the exposure light beam EL radiated onto the plate member 30, 32 by using an integrator sensor (not shown) which is capable of measuring the intensity of the exposure light beam EL radiated onto the image plane side of the projection optical system PL. The control unit CONT can measure the radiation time (number of radiation pulses) and the intensity of the exposure light beam EL radiated onto the plate member 30 and/or the plate member 32 on the basis of the position information of the substrate stage PST measured by using the laser interferometer 56 and the intensity information of the exposure light beam EL measured by using the integrator sensor. Therefore, it is possible to determine the totalized radiation amount of the exposure light beam EL radiated onto the plate member 30 and/or the plate member 32 on the basis of the result of the measurement. The integrator sensor for measuring the intensity of the exposure light beam EL is disclosed, for example, in U.S. Pat. Nos. 5,728,495 and 5,591,958, the content of which are incorporated herein by reference within a range of permission of the domestic laws and ordinances of the state designated or selected in this international application.

In the embodiment of the present invention, the control unit CONT judges whether or not the exchange of the plate member 30, 32 is required, on the basis of the contact angle of the liquid on the upper surface 30A, 32A of the plate member 30, 32. When it is estimated or predicted that the contact angle of the liquid is lowered to be not more than a predetermined angle (for example, 100°) on the basis of, for example, the time of use of the plate member 30, 32 and/or the totalized radiation amount of the ultraviolet light, it is judged that the exchange of the plate member 30, 32 is required. Alternatively, when it is estimated that the contact angle of the liquid 1 on the surface 30A, 32A of the plate member 30, 32 is lowered by not less than a predetermined angle (for example, 10°) as compared with the initial state on the basis of, for example, the time of use of the plate member 30, 32 and/or the totalized radiation amount of the ultraviolet light, it is judged that the exchange of the plate member 30, 32 is required.

It is not necessarily indispensable that the deterioration of the liquid repellence of the plate member 30, 32 or the like is judged by the control unit CONT of the exposure apparatus EX. For example, the exposure apparatus EX may be connected to a host computer of a factory or the like in which the exposure apparatus EX is installed so that various data can be exchanged, and the judgment may be made by the host computer.

When the liquid recovery mechanism 20 has a high ability to recover the liquid, there is such a possibility that the liquid can be sufficiently recovered even when the liquid repellence of the plate member 30, 32 is deteriorated. Therefore, the exchange timing of the plate member 30, 32 or the like can be also determined while considering the relationship between the ability of the liquid recovery mechanism 20 to recover the liquid and the deterioration of the liquid repellence (decrease in the contact angle) as well.

The speed of the deterioration and the degree of the deterioration of the liquid repellence differ depending on not only the radiation time of the exposure light beam EL but also other factors including, for example, the material for providing the liquid repellence, the liquid, the exposure wavelength, and the temperature. Therefore, it is appropriate that the evaluation data is prepared together with the factors as described above. This fact also holds in the same manner as described above for the exchange timings of other members to which the liquid repellence is imparted as described below.

In the embodiment of the present invention, the plate member 30, 32 is formed of, for example, polytetrafluoroethylene which is the liquid-repellent material. However, it is a matter of course that the plate member 30, 32 may be formed of any other material having the liquid repellence. Alternatively, for example, the plate member 30, 32 may be formed of a predetermined metal, and the surface of the plate member 30, 32 made of metal may be coated with the liquid-repellent material (fluoride such as polytetrafluoroethylene) having the liquid repellence. As for the coating area of the liquid-repellent material, the entire surface of the plate member 30, 32 may be subjected to the coating, or only a part of the area including, for example, the flat surface 30A, which requires the liquid repellence, may be subjected to the coating.

It is a matter of course that the plate member 30 and the second plate member 32 may be formed of separate materials, and the plate member 30 and the second plate member 32 may be subjected to the coating by using liquid-repellent materials which are distinct from each other. It is not necessarily indispensable that all of the surfaces of the plate member 30 and the second plate member 32 have the liquid repellence at a uniform level. It is also allowable that a portion having the strong liquid repellence may be partially provided. It is not necessarily indispensable that all of the surfaces of the plate member 30 and the second plate member 32 have the same or equivalent durability against the deterioration of the liquid repellence. It is also allowable that the durability against the deterioration of a portion which undergoes a large radiation amount of the exposure light beam may be strengthened as compared with other portions. For example, it is preferable that the surface of the plate member 30 has the durability against the deterioration which is stronger than that of the surface of the second plate member 32.

The embodiment of the present invention has been explained such that the plate member 30 is unloaded together with the substrate P when the plate member 30 is exchanged. It is a matter of course that only the plate member 30 may be loaded and unloaded with respect to the substrate table PT.

The plate member 30 can be exchanged by using the lifting members 74 and the transport arm 80. However, it is not necessarily indispensable to provide the lifting members 74 and the transport arm 80 which is capable of transporting the plate member 30. The plate member 30 may be exchanged manually by an operator. In the embodiment described above, the plate member 30 and the second plate member 32 are provided integrally respectively. However, it is also allowable that the plate member 30 and the second plate member 32 may be divided respectively so that they can be partially exchanged. Accordingly, it is also possible to frequently exchange only a portion at which the deterioration of the liquid repellence is seriously deteriorated.

Alternatively, the plate member 30 and the plate member 32 may be formed as one plate member which may be held on the substrate table PT.

In the embodiment of the present invention, as appreciated from FIG. 5, the substrate holder PH and the substrate table PT are detachable. However, the substrate holder PH may be provided integrally with the substrate table PT.

In the embodiment of the present invention, the entire surfaces of the surface PA, the side surface PB, and the back surface PC of the substrate P are coated with the photosensitive material 90 in order to perform the liquid-repelling treatment. However, another arrangement is also available, in which the liquid-repelling treatment is performed to only the area for forming the gap A, i.e., the side surface PB of the substrate P and the area for forming the gap B, i.e., the area of the back surface PC of the substrate P opposed to the upper surface 33A of the circumferential wall portion 33. Further, when the gap A is sufficiently small, and the material, which is coated to effect the liquid-repelling treatment, has the sufficiently large liquid repellence (contact angle), then the possibility of the inflow of the liquid 1 into the second space 39 via the gap A is further lowered. Therefore, an arrangement is also available, in which the liquid-repelling treatment is not performed to the back surface PC of the substrate P for forming the gap B, and the liquid-repelling treatment is performed to only the side surface PB of the substrate P. It is a matter of course that the substrate P, in which the liquid-repelling treatment is not performed to all of the surface PA, the side surface PB, and the back surface PC, can be also used.

In the embodiment of the present invention, the height of the circumferential wall portion 33 is lower than the height of the support portion 34, and the gap B is formed between the back surface PC of the substrate P and the upper surface 33A of the circumferential wall portion 33. However, the back surface PC of the substrate P and the upper surface 33A of the circumferential wall portion 33 may make contact with each other.

In the embodiment of the present invention, the photosensitive material 90 having the liquid repellence is coated as the liquid-repelling treatment for the side surface PB and the back surface PC of the substrate P. However, the side surface PB and the back surface PC may be coated with a predetermined material having the liquid repellence (water repellence) other than the photosensitive material 90. For example, a protective layer called "top coat layer" (film to protect the photosensitive material 90 from the liquid) is coated or formed as the upper layer of the photosensitive material 90 coated to the surface PA as the exposure surface of the substrate P in some cases. The material for forming the top coat layer (for example, fluorine-based resin material) has the liquid repellence (water repellence) with a contact angle of, for example, about 110°. Therefore, the side surface PB and the back surface PC of the substrate P may be coated with the material for forming the top coat layer. Of course, any material having the liquid repellence other than the photosensitive material 90 and the material for forming the top coat layer may be coated.

In the embodiment of the present invention, for example, the fluorine-based resin material or the acrylic resin material is coated as the liquid-repelling treatment for the substrate table PT and the substrate holder PH. However, the substrate table PT and the substrate holder PH may be coated with the photosensitive material or the material for forming the top coat layer. On the other hand, the side surface PB and the back surface PC of the substrate P may be coated with the material used for the liquid-repelling treatment for the substrate stage PST and the substrate holder PH.

The top coat layer is provided in order to prevent the liquid 1 of the liquid immersion area AR2 from the infiltration into the photosensitive material 90 in many cases. For example, even when the adhesion trace (so-called "water mark") of the liquid 1 is formed on the top coat layer, a predetermined process treatment such as the development process can be performed after removing the water mark together with the top coat layer, by removing the top coat layer after the liquid immersion exposure. In this procedure, when the top coat layer is formed of, for example, a fluorine-based resin material, the top coat layer can be removed by using a fluorine-based solvent. Accordingly, it is unnecessary to provide any unit for removing the water mark (for example, a substrate-washing unit for removing the water mark). The predetermined process treatment can be satisfactorily performed after removing the water mark by a simple configuration in which the top coat layer is removed with the solvent.

In the embodiment described above, the plate member 30, 32 is held by the substrate table PT in the vacuum-attraction manner. However, it is also possible to use another chuck mechanism such as an electromagnetic chuck mechanism.

Second Embodiment

Next, another embodiment of the present invention will be explained. In the following description, parts or components, which are the same as or equivalent to those of the embodiment described above, are designated by the same reference numerals, any explanation of which will be simplified or omitted.

FIG. 11 shows a substrate holder PH which is attached/detached with respect to the substrate table PT (substrate stage PST). FIG. 11(*a*) shows a side sectional view, and FIG. 11(*b*) shows a plan view as viewed from an upper position, illustrating the substrate table PT after the substrate holder PH is detached.

As shown in FIG. 11, the substrate table PT includes, on an upper surface thereof (holding surface for the substrate holder PH), a recess 157 to which the substrate holder PH is capable of being fitted, a plurality of vacuum suction holes 158 which are provided in the recess 157 and which attract and hold the substrate holder PH arranged in the recess 157, and flow passages 159 which are provided in the recess 157 as described later on. When the substrate holder PH is fitted to the recess 157, the substrate table PT and the substrate holder PH are positioned. The vacuum suction holes 158 construct a part of the chuck mechanism for holding the substrate holder PH arranged in the recess 157. The vacuum suction holes 158 are connected to an unillustrated vacuum unit. The driving of the vacuum unit is controlled by the control unit CONT. The control unit CONT controls the vacuum unit to effect the attraction and the holding as well as the release from the holding of the substrate table PT with respect to the substrate holder PH by the aid of the vacuum suction holes 158. When the substrate table PT is released from the holding, then the substrate holder PH and the substrate table PT can be separated from each other, and the substrate holder PH can be exchanged.

In this embodiment, the explanation has been made such that the substrate table PT holds the substrate holder PH by the vacuum attraction. However, the substrate holder PH may be subjected to the holding and the release from the holding by another chuck mechanism including, for example, an electromagnetic chuck mechanism. In this embodiment, the explanation has been made such that the substrate table PT and the substrate holder PH are positioned by using the recess 157. However, for example, the following arrangement is also available. That is, the positional relationship between the substrate holder PH and the substrate table PT is optically detected, and the substrate holder PH is positioned at a predetermined position with respect to the substrate table PT on the basis of the result of the detection.

The substrate holder PH has a recess 150 in which the substrate P is to be arranged, and a flat surface 30A which is substantially flush with the surface of the substrate P arranged in the recess 150. The flat surface 30A is provided annularly around the substrate P. A side wall portion 151, which is higher than the flat surface 30A, is formed around the flat surface 30A. The side wall portion 151 is formed continuously and annularly around the flat surface 30A. The liquid 1 can be retained inside the side wall portion 151 (on the substrate P and on the flat surface 30A).

The substrate holder PH is formed of a material having the liquid repellence including, for example, polytetrafluoroethylene. The substrate holder PH may be formed of, for example, a predetermined metal. At least the flat surface 30A of the substrate holder PH made of metal may be coated with a liquid-repellent material (for example, polytetrafluoroethylene) having the liquid repellence. Of course, the entire region of the surface of the substrate holder PH made of metal may be coated with a liquid-repellent material.

The transport arm 80 is capable of transporting the substrate holder PH detached from the substrate table PT. For example, the transport arm 80 can be operated as follows. That is, the substrate holder PH, which holds the substrate P after being subjected to the exposure process, is unloaded from the substrate table PT (substrate stage PST). The substrate holder PH is exchanged with another substrate holder PH. After that, the another substrate holder PH is loaded to (loaded on) the substrate table PT. When the substrate holder PH is loaded to the substrate table PT, then the transport arm 80 can load only the substrate holder PH, or the transport arm 80 can load the substrate holder PH which holds the substrate P before being subjected to the exposure process.

FIG. 12 shows the substrate holder PH. FIG. 12(*a*) shows a side sectional view, and FIG. 12(*b*) shows a plan view as viewed from an upper position.

With reference to FIG. 12, the substrate holder PH includes a side wall portion 151 which is capable of retaining the liquid 1 as described above, a plurality of projections 161 which are formed on a bottom surface portion PHT of the recess 150, and vacuum suction holes 162 which are formed on upper end surfaces of the projections 161 respectively. The upper end surfaces of the projections 161 are flat surfaces. The substrate holder PH supports the substrate P on the upper end surfaces of the plurality of recesses 161. Further, the substrate holder PH attracts and holds the substrate P by the aid of the vacuum suction holes 162. In this embodiment, the projections 161 are provided at a plurality of predetermined positions of the bottom surface portion PHT of the recess 150 of the substrate holder PH respectively so that the supported substrate P is not warped. When the substrate P is supported by the projections 161, a spacing portion 164 is formed between the substrate P and the bottom surface portion PHT of the substrate holder PH. In this embodiment, the shape of the substrate holder PH, which is viewed in a plan view, is substantially circular. However, the shape may be rectangular.

When the substrate table PT and the substrate holder PH are connected to each other, the vacuum suction holes 162 of the substrate holder PH are connected to the flow passages 159 (see, for example, FIG. 11(*b*)) provided on the upper surface of the substrate table PT, via flow passages 162A formed in the substrate holder PH. The flow passages 159 are connected to the vacuum unit. When the control unit CONT drives the vacuum unit, the substrate P, which is supported by the projections 161, is attracted and held via the flow passages 159 of the substrate table PT, the flow passages 162A of the substrate holder PH, and the vacuum suction holes 162. Valves 162B, which are constructed of, for example, solenoid-operated valves to be driven under the control of the control unit CONT, are provided for the flow passages 162A respectively. The operation for opening/closing the flow passage 162A can be subjected to the remote control. The control unit CONT opens the flow passages 162A by controlling the valves 162B when the vacuum unit is driven, and the control unit CONT closes the flow passages 162A when the vacuum unit is stopped. Therefore, after the attracting operation for the substrate P by the aid of the vacuum suction holes 162, the driving of the vacuum unit is stopped, and the flow passages 162A are closed by the valves 162B. Accordingly, the negative pressure of the flow passages 162A is maintained. Therefore, even when the substrate table PT and the substrate holder PH are separated from each other, the substrate holder PH can maintain the attraction and the holding of the substrate P by allowing the flow passages 162A to have the negative pressure.

Next, an explanation will be made with reference to a schematic view shown in FIG. 13 about the operation of the exposure apparatus EX constructed as described above.

As shown in FIG. 13(a), the substrate holder PH, which holds the substrate P as the exposure process objective, is loaded to the substrate table PT together with the substrate P by the transport arm (transport unit) 80. As shown in FIG. 13(b), the substrate holder PH is arranged so that the substrate holder PH is fitted to the recess 157 provided for the substrate table PT. The substrate holder PH is held by the chuck mechanism having the vacuum suction holes 158 (FIG. 11). The control unit CONT drives the vacuum unit to vacuum-attract and hold the substrate P by the aid of the flow passages 159, the flow passages 162A, and the vacuum suction holes 162 (not shown in FIG. 13). In this situation, the valves 162B open the flow passages 162A. As shown in FIG. 13(c), the control unit CONT supplies and recovers the liquid 1 by the liquid supply mechanism 10 and the liquid recovery mechanism 20 to form the liquid immersion area AR2 of the liquid 1 between the projection optical system PL and the substrate P held on the substrate table PT by the aid of the substrate holder PH. The control unit CONT radiates the exposure light beam EL onto the substrate P via the projection optical system PL and the liquid 1 to perform the liquid immersion exposure while moving the substrate P held on the substrate table PT (substrate stage PST) by the aid of the substrate holder PH. In this situation, the vacuum suction holes 162 are closed by the substrate P which is attracted and held. Therefore, even when the liquid 1 is supplied, the liquid 1 does not inflow into the vacuum suction holes 162. The liquid 1, which is disposed on the substrate P and on the flat surface 30A, does not outflow to the outside of the substrate holder PH owing to the side wall portion 151 of the substrate holder PH as well.

After the completion of the liquid immersion exposure for the substrate P, the control unit CONT recovers the liquid 1 remaining on the substrate P and on the flat surface 30A by using, for example, the liquid recovery mechanism 20 (see FIG. 2). Subsequently, the control unit CONT releases the holding of the substrate holder PH having been effected by the chuck mechanism including the vacuum suction holes 158. Further, the flow passages 162A are closed by using the valves 162B. As shown in FIG. 13(d), the control unit CONT unloads the substrate holder PH in a state of holding the substrate P for which the exposure process has been completed, from the substrate table PT together with the substrate P by the transport arm 80. When the substrate holder PH is separated from the substrate table PT, the flow passages 162A, which are connected to the vacuum suction holes 162 that attract and hold the substrate P, are closed by the valves 162B to maintain the negative pressure state as explained with reference to FIG. 12. Therefore, the attraction and the holding for the substrate P, which are effected by the upper end surfaces of the projections 161, are maintained. When the substrate P is transported together with the substrate holder PH, even if the liquid 1 remains on the substrate P and on the flat surface 30A, then the remaining liquid 1 does not outflow via the flow passages 162A. The remaining liquid 1 is retained inside the side wall portion 151. Therefore, the remaining liquid 1 does not outflow to the outside of the substrate holder PH, and the remaining liquid 1 is not scattered into the transport passage as well.

The unloaded substrate holder PH is exchanged with a new substrate holder PH. The control unit CONT loads the new substrate holder PH which holds the substrate P as the exposure process objective, to the substrate table PT (substrate stage PST) by using the transport arm 80 (see FIG. 13).

As described above, the substrate holder PH is exchanged in this embodiment as well. Therefore, it is possible to hold the substrate P by the substrate holder PH having the surface which is liquid-repellent.

Third Embodiment

The foregoing embodiments have been explained such that the member (plate member 30, second plate member 32, substrate holder PH), which has the flat surface 30A around the substrate P, is exchanged depending on the deterioration of the liquid repellence thereof. However, it is desirable that any member other than the plate member 30, the second plate member 32, and the substrate holder PH provided on the substrate table PT has its liquid-repellent surface. It is appropriate that such a member is exchangeable depending on the deterioration of the liquid repellence thereof. In particular, it is desirable that the member, which makes contact with the liquid 1, has the liquid-repellent surface. It is appropriate that such a member is exchangeable depending on the deterioration of the liquid repellence thereof. Specifically, the constitutive members of the reference member 300 and the constitutive members of the optical sensors 400, 500, which are used while forming the liquid immersion area on the surface, may also be exchangeable.

Figure 14:
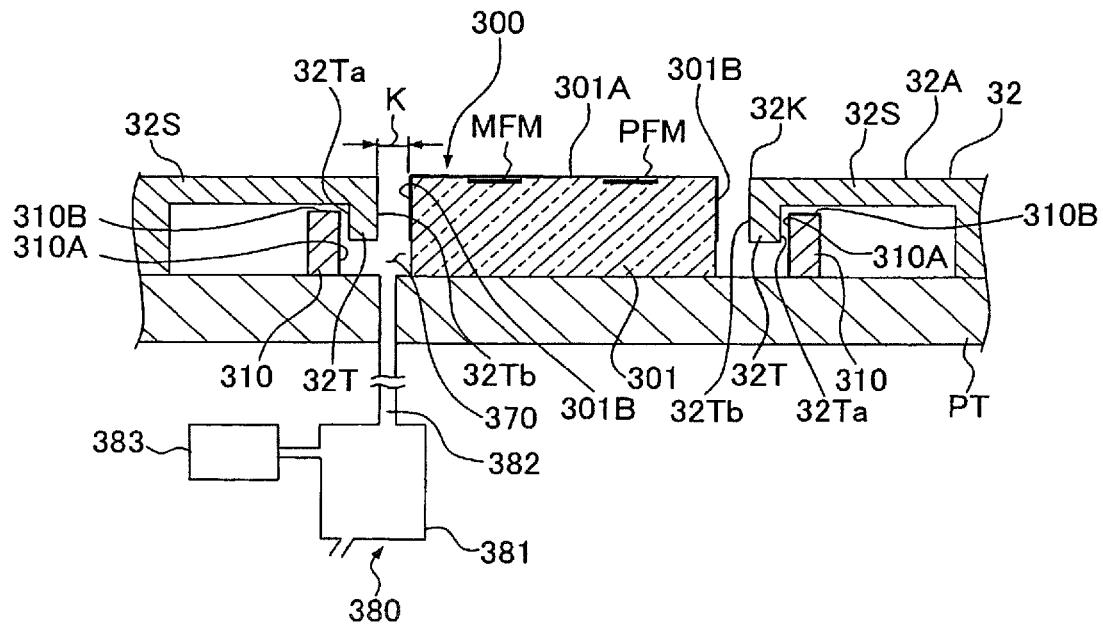
FIG. 14 shows a schematic arrangement illustrating another embodiment of an exposure apparatus of the present invention.

FIG. 14 shows a sectional view illustrating the reference member 300 provided on the substrate table PT. With reference to FIG. 14, the reference member 300 includes an optical member 301 which is formed of glass (CLEARCERAM), and the reference marks MFM, PFM which are formed on the upper surface 301A of the optical member 301. The reference member 300 is attached onto the substrate table PT. As described above, the reference member 300 is arranged in the opening 32K provided for the second plate member 32, and the upper surface 301A is exposed. The reference member 300 (optical member 301) is detachable with respect to the substrate table PT, and the reference member 300 (optical member 301) is exchangeable. Concave and convex members or male and female members, which are fitted to one another in order to position the reference member 300 with respect to the substrate table PT when the reference member 300 is reinstalled to a predetermined position of the substrate table PT, may be provided for the reference member 300 and the substrate table PT. Alternatively, a magnet and a material to be attracted thereby may be embedded in the reference member 300 and the substrate table PT so that the reference member 300 can be positioned with respect to the substrate table PT by the magnetic force. Further alternatively, it is also allowable that the reference member can be positioned with respect to the substrate table PT by the vacuum attractive force. Quartz may be used as the optical member 301.

A gap K, which is, for example, about 0.3 mm, is provided between the reference member 300 and the opening 32K. The upper surface 301A of the optical member 301 (reference member 300) is a substantially flat surface which is provided to have approximately the same height as those of (be flush with) the surface of the substrate P, the surface 30A of the plate member 30, and the surface 32A of the second plate member 32.

Portions of the second plate member 32, which are disposed in the vicinity of the reference member 300, are thin-walled. An end of a thin-walled portion 32S, of the thin-walled portion, which is disposed on the side of the reference member 300, is bent downwardly to form a bent portion 32T. A wall section 310, which protrudes upwardly, is formed on the substrate table PT. The wall section 310 is provided outside the bent portion 32T in relation to the reference member 300. The wall section 310 is formed continuously to surround the reference member 300 (bent portion 32T). The outer side surface 32Ta of the bent portion 32T is opposed to the inner side surface 310A of the wall section 310. The inner side surface 32Tb of the bent portion 32T is opposed to the side surface 301B of the optical member 301 (reference member 300). The side surface 301B of the optical member 301, the inner side surface 32Tb and the outer side surface 32Ta of the bent portion 32T, and the inner side surface 310A and the upper end surface 310B of the wall section 310 are flat surfaces respectively. The thin-walled portion 32S including the bent portion 32T of the second plate member 32 is slightly separated from the wall section 310, and a predetermined gap (interstice) is formed therebetween.

The areas of the upper surface 301A and the side surface 301B of the optical member 301 opposed to at least the bent portion 32T, and the inner side surface 310A and the upper end surface 310B of the wall section 310 are subjected to the liquid-repelling treatment to have the liquid repellence. The liquid-repelling treatment can be performed, for example, by coating the liquid-repellent material such as the fluorine-based resin material and the acrylic resin material as described above.

The liquid 1, which flows into the space 370 between the reference member 301 and the bent portion 32T of the second plate member 32 (wall section 310), is recovered by a recovery section 380. In this embodiment, the recovery section 380 includes a vacuum system 383, a gas/liquid separator 381 which includes a tank capable of accommodating the liquid 1, and a flow passage 382 which is provided in the substrate table PT and which connects the space 370 and the gas/liquid separator 381. The liquid-repelling treatment is also performed to the inner wall surface of the flow passage 382.

It is conceived that the reference member 300 described above may be constructed to perform the operation for detecting the reference mark, for example, in a state in which the liquid immersion area AR2 of the liquid 1 is formed on the upper surface 301A of the reference member 300. However, the upper surface 301A is liquid-repellent. Therefore, the liquid 1 of the liquid immersion area AR2 on the upper surface 301A can be satisfactorily recovered after the completion of the operation for detecting the reference mark. It is possible to avoid the inconvenience which would be otherwise caused such that the liquid 1 remains. Further, the side surface 301B of the optical member 301 is liquid-repellent, and the inner side surface 32Tb of the bent portion 32T opposed to the side surface 301B is also liquid-repellent. Therefore, the liquid 1 hardly inflows into the gap K. Therefore, it is possible to avoid the inconvenience of the inflow of the liquid 1 into the space 370. Even if the liquid 1 inflows into the space 370, the liquid 1 can be satisfactorily recovered by the recovery section 380. Further, even if the liquid 1 inflows into the space 370, it is possible to avoid the inconvenience which would be otherwise caused such that the liquid 1, which inflows into the space 370, rides across the wall section 310, and the liquid 1 inflows into the substrate table PT to cause the rust or the like, because the inner side surface 310A and the upper end surface 310B of the wall section 310 are liquid-repellent, and the second plate member 32 (bent portion 32T) opposed to the wall section 310 is also liquid-repellent. As described above, the wall section 310 functions as a liquid diffusion-preventing wall to avoid the diffusion of the liquid 1. A corner is formed as viewed in a sectional view by the bent portion 32T at the gap between the second plate member 32 and the wall section 310. The corner functions as a seal portion. Therefore, it is possible to reliably avoid the inflow of the liquid 1 into the substrate table PT.

Since the reference member 300 (optical member 301) is exchangeable, when the liquid repellence thereof is deteriorated, the reference member 300 may be exchanged with a new reference member 300 (having the sufficient liquid repellence) in the same manner as the plate member 30.

When the reference member 300 is used, the measuring light beam is locally radiated onto the mark portion. Therefore, a plurality of identical reference marks may be formed on the reference member 300 beforehand. When the liquid repellence of the surface of the mark portion is deteriorated, another reference mark may be used. Alternatively, the marks may be alternately used for every measurement operation in order to lower the speed of the deterioration of the liquid repellence. Accordingly, it is possible to decrease the exchange frequency of the reference member 300. This procedure is especially effective, because the liquid repellence is quickly deteriorated at the portion including the reference mark MFM for which the measuring light beam having the same wavelength as the exposure wavelength is used.

Figure 15:
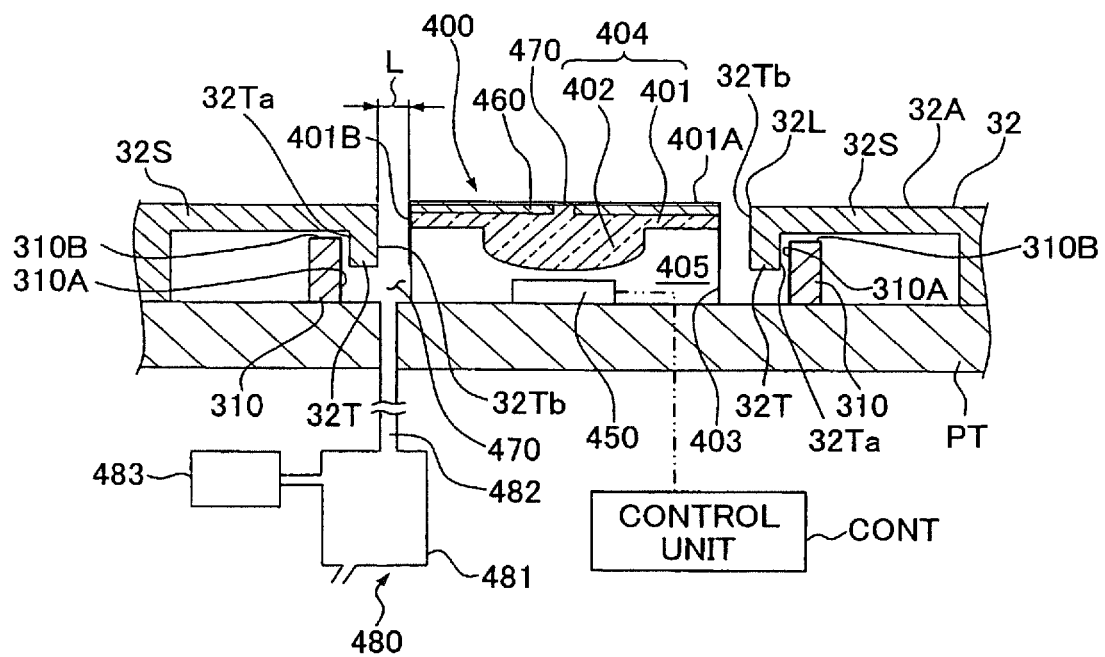
FIG. 15 shows a schematic arrangement illustrating another embodiment of an exposure apparatus of the present invention.

FIG. 15 shows a sectional view illustrating the uneven illuminance sensor 400 provided on the substrate table PT. With reference to FIG. 15, the uneven illuminance sensor 400 includes an upper plate 401 which is formed of, for example, quartz glass, and an optical element 402 which is provided below the upper plate 401 and which is formed of, for example, quartz glass. In this embodiment, the upper plate 401 and the optical element 402 are provided as an integrated body. In the following description, the upper plate 401 and the optical element 402 will be appropriately referred to as "optical member 404" in combination. The upper plate 401 and the optical element 402 are supported on the substrate table PT by the aid of a support section 403. The support section 403 has a continuous wall portion which surrounds the optical member 404. As described above, the uneven illuminance sensor 400 is arranged in the opening 32L provided for the second plate member 32, and the upper surface 401A is exposed. The optical member 404, which includes the upper plate 401 and the optical element 402, is detachable with respect to the substrate table PT, and the optical member 404 is exchangeable. Concave and convex members or male and female members, which are fitted to one another in order to position the optical member 404 with respect to the substrate table PT when the optical member 404 is reinstalled to a predetermined position of the substrate table PT, may be provided for the optical member 404 and the substrate table PT. Alternatively, a magnet and a material to be attracted thereby may be embedded in the optical member 404 and the substrate table PT so that the optical member 404 can be positioned with respect to the substrate table PT by the magnetic force. Further alternatively, it is also allowable that the optical member can be positioned with respect to the substrate table PT by the vacuum attractive force.

A pinhole 470, through which the light beam can pass, is provided on the upper plate 401. A thin film 460, which includes a light-shielding material such as chromium, is provided at portions on the upper plate 401 except for the pinhole 470. In this embodiment, an optical member formed of quartz glass is also provided in the pinhole 470. Accordingly, the thin film 460 is flush with the pinhole 470, and the upper surface 401A is a flat surface.

An optical sensor 450, which receives the light beam allowed to pass through the pinhole 470, is arranged below the optical member 404. The optical sensor 450 is attached onto the substrate table PT. The optical sensor 450 outputs a light-receiving signal to the control unit CONT. In this arrangement, a space 405, which is surrounded by the support section 403, the substrate table PT, and the optical member 404, is a substantially tightly closed space. The liquid 1 does not inflow into the space 405. An optical system (optical element) may be arranged between the optical member 404 and the optical sensor 450.

A gap L, which is, for example, about 0.3 mm, is provided between the opening 32L and the uneven illuminance sensor 400 including the optical member 404 and the support section 403. The upper surface 401A of the uneven illuminance sensor 400 is a substantially flat surface which is provided to have approximately the same height as those of (be flush with) the surface of the substrate P, the surface 30A of the plate member 30, and the surface 32A of the second plate member 32.

Portions of the second plate member 32, which are disposed in the vicinity of the uneven illuminance sensor 400, are thin-walled. An end of the thin-walled portion 32S, of the thin-walled portion, which is disposed on the side of the uneven illuminance sensor 400, is bent downwardly to form a bent portion 32T. A wall section 310, which protrudes upwardly, is formed on the substrate table PT. The wall section 310 is provided outside the bent portion 32T in relation to the uneven illuminance sensor 400. The wall section 310 is formed continuously to surround the uneven illuminance sensor 400 (bent portion 32T). The outer side surface 32Ta of the bent portion 32T is opposed to the inner side surface 310A of the wall section 310. The inner side surface 32Tb of the bent portion 32T is opposed to the side surface 401B of the support section 403 and the optical member 404 of the uneven illuminance sensor 400. The side surface 401B, the inner side surface 32Tb and the outer side surface 32Ta of the bent portion 32T, and the inner side surface 310A and the upper end surface 310B of the wall section 310 are flat surfaces respectively. The thin-walled portion 32S including the bent portion 32T of the second plate member 32 is slightly separated from the wall section 310, and a predetermined gap (interstice) is formed therebetween.

The areas of the upper surface 401A and the side surface 401B of the uneven illuminance sensor 400 opposed to at least the bent portion 32T, and the inner side surface 310A and the upper end surface 310B of the wall section 310 are subjected to the liquid-repelling treatment to have the liquid repellence. The liquid-repelling treatment can be performed, for example, by coating the liquid-repellent material such as the fluorine-based resin material and the acrylic resin material as described above.

The liquid 1, which flows into a space 470 between the uneven illuminance sensor 400 and the bent portion 32T of the second plate member 32 (wall section 310), is recovered by a recovery section 480. In this embodiment, the recovery section 480 includes a vacuum system 483, a gas/liquid separator 481 which includes a tank capable of accommodating the liquid 1, and a flow passage 482 which is provided in the substrate table PT and which connects the space 470 and the gas/liquid separator 481. The liquid-repelling treatment is also performed to the inner wall surface of the flow passage 482.

As for the uneven illuminance sensor 400 described above, the pinhole 470 is successively moved to a plurality of positions in the irradiation area (projection area) onto which the exposure light beam EL is radiated, for example, in a state in which the liquid immersion area AR2 of the liquid 1 is formed on the upper surface 401A of the uneven illuminance sensor 400. The upper surface 401A is liquid-repellent. Therefore, the liquid 1 of the liquid immersion area AR2 on the upper surface 401A can be satisfactorily recovered after the completion of the measurement of the uneven illuminance. It is possible to avoid the inconvenience which would be otherwise caused such that the liquid 1 remains. Further, the side surface 401B of the uneven illuminance sensor 400 (optical member 404, support section 403) is liquid-repellent, and the inner side surface 32Tb of the bent portion 32T opposed to the side surface 401B is also liquid-repellent. Therefore, the liquid 1 hardly inflows into the gap L. Therefore, it is possible to avoid the inconvenience of the inflow of the liquid 1 into the space 470. Even if the liquid 1 inflows into the space 470, the liquid 1 can be satisfactorily recovered by the recovery section 480. Further, even if the liquid 1 inflows into the space 470, it is possible to avoid the inconvenience which would be otherwise caused such that the liquid 1, which inflows into the space 470, rides across the wall section 310, and the liquid 1 inflows into the substrate table PT to cause the rust or the like, because the inner side surface 310A and the upper end surface 310B of the wall section 310 are liquid-repellent, and the second plate member 32 (bent portion 32T) opposed to the wall section 310 is also liquid-repellent. A corner is formed as viewed in a sectional view by the bent portion 32T at the gap between the second plate member 32 and the wall section 310. The corner functions as a seal portion. Therefore, it is possible to reliably avoid the inflow of the liquid 1 into the substrate table PT.

Since the optical member 404 is exchangeable, when the liquid repellence thereof is deteriorated, the optical member 404 may be exchanged with a new optical member 404 (having the sufficient liquid repellence) in the same manner as the plate member 30.

The spatial image-measuring sensor 500 is constructed substantially equivalently to the uneven illuminance sensor 400. Therefore, any detailed explanation thereof will be omitted. However, the spatial image-measuring sensor 500 also has an optical member constructed of an optical element and an upper plate supported by the aid of a support section on the substrate table PT. A slit 570 through which the light beam can pass, and a thin film which is formed of a light-shielding material to cover portions other than the slit are provided on an upper surface 501A of the spatial image-measuring sensor 500. An optical sensor, which receives the light beam allowed to pass through the slit 570, is provided below the optical member. The optical member, which has the slit 570, is exchangeable depending on the deterioration of the liquid repellence.

In the embodiment explained with reference to FIGS. 14 and 15, the inflow of the liquid 1 is avoided by providing the liquid repellence for the surfaces of the members for forming the gaps K, L. However, the inflow of the liquid 1 into the gap can be avoided by similarly providing the liquid repellence for the gap existing on the upper surface of the substrate table PT, without being limited to the gaps disposed around the measuring member and the sensor. Alternatively, a seal member, which is formed of a resin or the like, may be arranged in the gap K, L to avoid the inflow of the liquid 1. Further alternatively, the gap K, L may be filled with a liquid (for example, vacuum grease or magnetic fluid) to provide the liquid seal function so that the inflow of the liquid 1 is avoided. In this arrangement, it is preferable that the sealing liquid is hardly dissolved or eluted in the liquid 1. Of course, it goes without saying that the countermeasures to avoid the inflow of the liquid may be used in combination.

It is unnecessary that all of the surfaces (liquid contact surfaces) of the measuring members (for example, the optical member 301 of the reference member 300, the upper plate 401 of the optical sensor 400, and the upper plate 501 of the optical sensor 500), which are provided on the substrate stage PST (substrate table PT), are liquid-repellent. It is also allowable that only a part or parts of them may have the liquid repellence.

In the embodiment described above, the exchange is performed when the liquid repellence of the surface of the member is deteriorated. However, when a certain member is exchanged, other members, which will reach the exchange timing soon, may be simultaneously exchanged.

In order to recover the liquid (water) more reliably, it is desirable that the contact angle with respect to the liquid (water) is larger than about 80°, desirably not less than 100° (contact angle of polytetrafluoroethylene described above with respect to the liquid (water) is about 110°), for example, for the surface of the substrate table PT, i.e., the surface of the plate member 30, the surface of the second plate member 32, and the surface of the reference member 300.

It is desirable that the photosensitive material (resist for the ArF exposure light beam) to be used, with which the surface of the substrate P is coated, has the contact angle with respect to the liquid (water) that is larger than about 80°. Of course, when the KrF excimer laser light beam is used as the exposure light beam, it is desirable to use, as a resist for the KrF exposure light beam, a material which has the contact angle with respect to the liquid that is larger than 80°.

The specified embodiment described above is illustrative of the exemplary substrate stage which is provided with both of the substrate table and the measuring units or instruments including, for example, the reference member 300, the uneven illuminance sensor 400, and the spatial image-measuring sensor 500. However, the present invention is also applicable to an exposure apparatus in which a stage for performing the exposure while holding the substrate is distinct from a stage for the measurement. That is, the present invention also intends an exposure apparatus provided with an exposure stage which is movable while holding a processing objective substrate such as a wafer, and a measuring stage which is provided with various reference members and measuring members such as measuring sensors. In this arrangement, at least a part or parts of the reference members and/or the various measuring sensors arranged on the substrate stage PST in the embodiment described above can be arranged on the measuring stage. The exposure apparatus, which is provided with the exposure stage and the measuring stage, is described, for example, in Japanese Patent Application Laid-open No. 11-135400, the content of which are incorporated herein by reference within a range of permission of the domestic laws and ordinances of the state designated or selected in this international application.

The embodiment of the present invention is also applicable to a twin-stage type exposure apparatus which is provided with two substrate stages (substrate tables) for holding the substrate P. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, the content of which are incorporated herein by reference within a range of permission of the domestic laws and ordinances of the state designated or selected in this international application.

Fourth Embodiment

Figure 16:
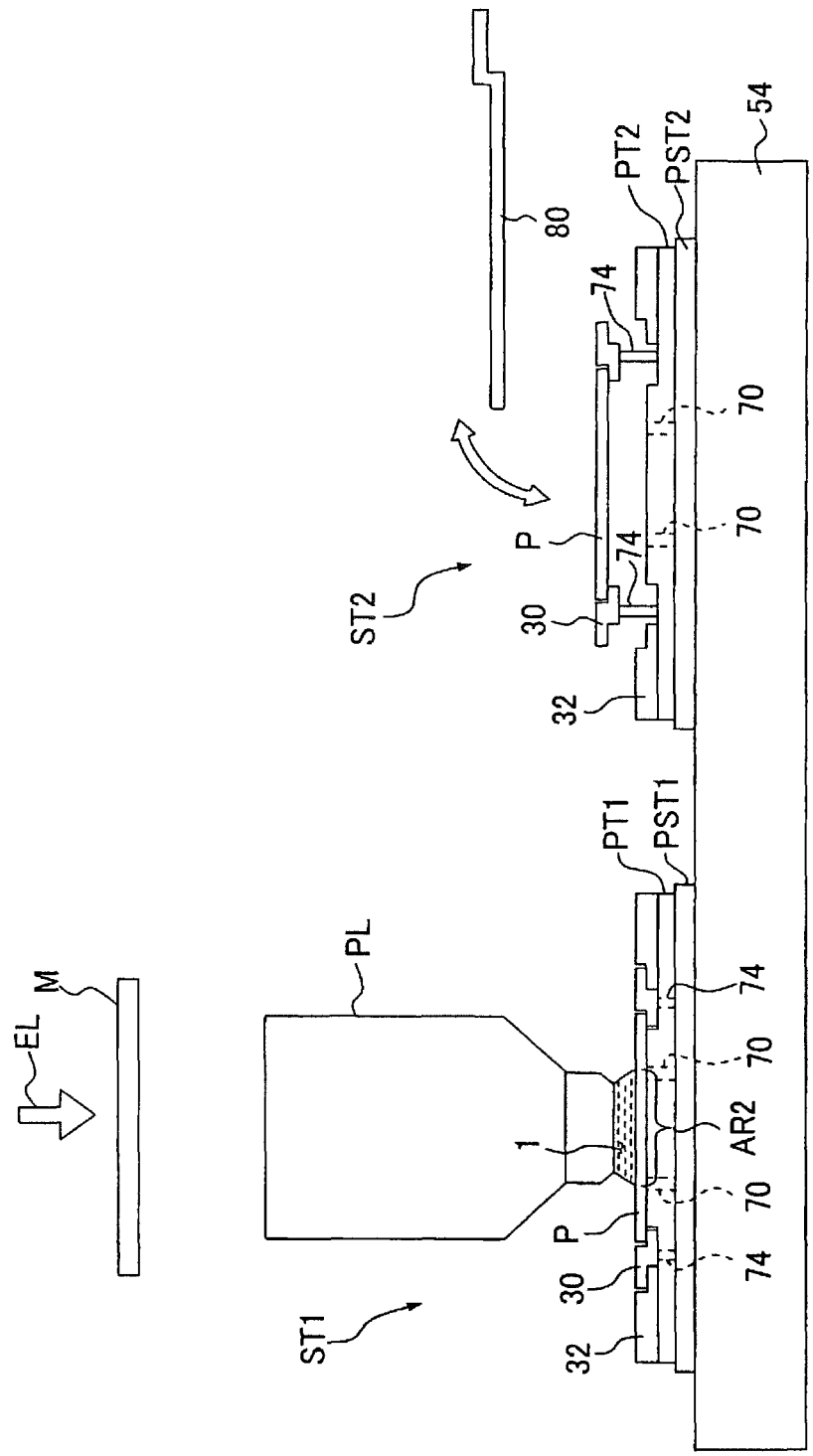
FIG. 16 shows a schematic arrangement illustrating another embodiment of an exposure apparatus of the present invention.

FIG. 16 shows a schematic arrangement of a twin-stage type exposure apparatus to which the present invention is applied. The twin-stage type exposure apparatus includes first and second substrate stages PST1, PST2 which are movable on a common base 54 independently respectively. Each of the first and second substrate stages PST1, PST2 is a substrate stage which has the structure and the function as explained in relation to FIGS. 1 to 15. The first and second substrate stages PST1, PST2 have first and second substrate tables PT1, PT2 respectively. The plate member 30 and the second plate member 32 are provided exchangeably on each of the first and second substrate tables PT1, PT2. The twin-stage type exposure apparatus includes an exposure station ST1 and a measuring/exchange station ST2. The exposure station ST1 is provided with the projection optical system PL. The substrate alignment system, the focus/leveling-detecting system and the like are provided on the measuring/exchange station ST2 (not shown in FIG. 16). The liquid immersion exposure process is performed for a substrate P held on the first substrate table PT1 in the exposure station ST1, during which the substrate P is loaded/unloaded with respect to the second substrate stage PST2 (second substrate table PT2) together with the plate member 30 in the measuring/exchange station ST2. In the measuring/exchange station ST2, the measuring operation (focus-detecting operation, alignment operation) is performed for a substrate P disposed on the second substrate stage PST2 concurrently with the liquid immersion exposure in the exposure station ST1. After the completion of the measuring operation, the second substrate stage PST2 is moved to the exposure station ST2, and the liquid immersion exposure process is performed for the substrate P disposed on the second substrate stage PST2.

As described above, in the case of the twin-stage type exposure apparatus, it is possible to perform not only the substrate exchange and the measuring process but also the exchange of the plate member 30 on the other stage during the period in which the liquid immersion exposure process is performed on one stage. Therefore, it is possible to improve the throughput of the exposure process.

The respective embodiments described above have been explained such that the plate member 30 or the like is exchanged depending on the liquid repellence thereof. However, it goes without saying that the plate member 30 or the like can be exchanged for any reason other then the deterioration of the liquid repellence, for example, when the plate member 30 or the like is damaged or polluted due to any cause. For example, when the plate member 30 or the like makes contact with the liquid 1 for a long period of time, there is such a possibility that the surface may be deteriorated, any substance may be eluted, and the liquid 1 may be polluted therewith. Therefore, the exchange timing may be also determined in consideration of the surface deterioration of the plate member 30 or the like which accompanies the elution of the substance.

In the embodiment described above, the optical element 2 is formed of fluorite. However, for example, it is possible to use fluorite in which the crystalline orientation of the fluorite surface is the (111) plane. Further, magnesium fluoride ($MgF_2$), which serves as a dissolution-preventive film constructed of a single layer film, may be formed by means of the vacuum vapor deposition method at the end portion 2a of the optical element 2 shown in FIG. 1, i.e., the portion which makes contact with the liquid 1.

Fifth Embodiment

For example, when the optical part for constructing the unit such as the radiation amount monitor and the uneven illuminance sensor, the index plate for the spatial image-measuring unit, and the reference mark (reference member) to be used when the reticle alignment is performed are provided on the substrate stage PST as explained in the first embodiment, it is desirable that the light irradiated surface (liquid contact surface) of the optical part as described above has the liquid repellence. If water is not discharged completely from the light irradiated surface of the radiation amount monitor, the uneven illuminance sensor or the like, it is feared that the measurement of the light radiation amount and/or the light illuminance cannot be performed correctly. If water is not discharged completely from the surface of the index plate of the spatial image-measuring unit, there is such a possibility that the surface shape of the index plate may be changed due to the evaporation of the liquid on the index plate, and any error may arise in the measurement performed by the spatial image-measuring unit. If water is not discharged completely from the surface of the reference mark, there is such a possibility that the shape of the reference mark may be changed due to the evaporation of the liquid on the reference mark, and the reticle alignment cannot be performed correctly. Therefore, it is required that the surface of the optical part arranged on the substrate stage has the liquid repellence for a long period of time.

In such circumstances, it is conceived that an amorphous fluororesin is coated on the surface of the optical part to form a thin film so that the liquid-repellent optical thin film having the high optical performance is prepared thereby. That is, the amorphous fluororesin is such a material that the amorphous fluororesin is especially transparent and it has the high ultraviolet transmittance, as compared with other resins. Further, the amorphous fluororesin exhibits the smallest surface tension as compared with any other organic matter, owing to the —$CF_3$ bond coordinated on the resin surface. Therefore, the amorphous fluororesin is also a material which has the excellent water-repelling performance.

However, in the case of the water-repellent optical thin film formed on the surface of the optical part, when the ultraviolet laser, which has the high energy in the liquid immersion state, is radiated, a minute amount of the light energy absorbed by the thin film is converted into the temperature. The thin film is consequently swelled in a relatively short period of time, and water inflows into the film. In such a situation, the film is consequently exfoliated if adhesiveness is unsatisfactory between the fluororesin thin film and the surface of the optical part. The optical performance is harmfully affected thereby, and the water-repelling performance is deteriorated. Therefore, it is feared that any water droplet may remain on the substrate stage.

In general, it is known that a thin film, which has the satisfactory adhesiveness, is obtained by reacting the optical part surface with a coupling agent such as fluoroalkylsilane to form a binder layer and forming a fluororesin thin film thereon. However, the inventors performed investigation and found that the adhesiveness cannot be obtained after the laser irradiation, because fluoroalkylsilane absorbs the ultraviolet laser beam to consequently cause the decomposition.

Figure 19:
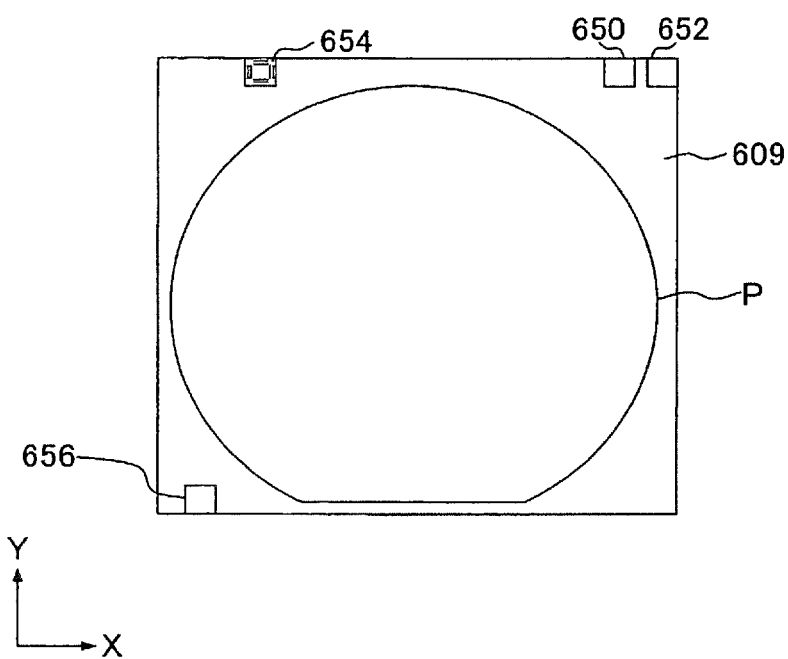
FIG. 19 shows optical parts provided on a wafer stage according to an embodiment.
Figure 20:
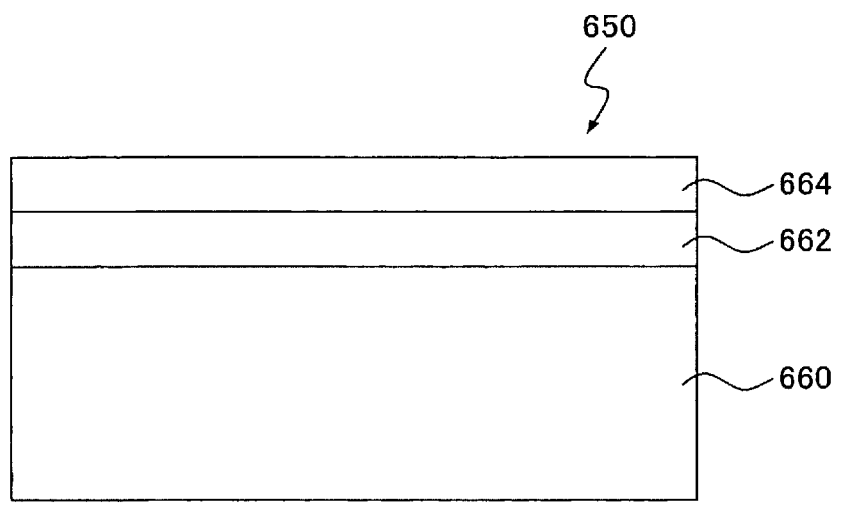
FIG. 20 shows a construction of the optical part provided on the wafer stage according to the embodiment.

In this embodiment, an explanation will be made with reference to the drawings about an optical part which is capable of maintaining the liquid repellence for a long period of time and which is appropriately usable for the liquid immersion type projection exposure apparatus. FIG. 19 shows optical parts provided on the wafer stage. FIG. 20 shows an arrangement of the optical part provided on the wafer stage.

The optical parts, which include, for example, a light-entrance window (light irradiated surface) 650 of a radiation amount monitor for monitoring the radiation amount of the exposure light beam, and a light-entrance window (light irradiated surface) 652 of an uneven illuminance sensor for detecting the uneven illuminance of the exposure light beam, are provided on a wafer stage 609 shown in FIG. 19. Further, the optical parts, which include, for example, an index plate (light irradiated surface) 654 of a spatial image-measuring unit (AIS system) for measuring, for example, the optical characteristic of the projection optical system, and a reference mark (FM) (light irradiated surface) 656 to be used when the reticle alignment is performed, are provided on the wafer stage 609. In this arrangement, as shown in FIG. 20, the light-entrance window (light irradiated surface) 650 of the radiation amount monitor (as well as the light-entrance window (light irradiated surface) 652 of the uneven illuminance sensor) is formed of quartz glass 660. A particulate layer (adhesive particulate layer) 662, which is formed of silicon dioxide ($SiO_2$), is formed as a film on the surface of the quartz glass 660. A water-repellent film 664, which is composed of an amorphous fluororesin, is formed as a film on the surface of the particulate layer.

Each of the index plate 654 of the spatial image-measuring unit (AIS system) and the reference mark (FM) 656 is composed of quartz glass and a chromium (metal) pattern formed on the surface of quartz glass. A particulate layer (adhesive particulate layer), which is formed of silicon dioxide ($SiO_2$), is formed as a film on the surface thereof. A water-repellent film, which is composed of an amorphous fluororesin, is formed as a film on the surface of the particulate layer.

According to the optical part concerning this embodiment, the particulate layer, which is composed of silicon dioxide ($SiO_2$) for forming the adhesive particulate layer, has the good affinity for the glass (main component: $SiO_2$) of the base material. It is possible to obtain an appropriate degree of adhesiveness with respect to the base material glass. Further, irregularities, which result from the diameters of particles, are formed on the surface. Additionally, for example, silicon dioxide itself has the high durability against the laser irradiation as well, because silicon dioxide or the like is a material having the extremely high ultraviolet transmittance. In this embodiment, the particulate layer composed of silicon dioxide ($SiO_2$) is formed as the film, and then the water-repellent film composed of the amorphous fluororesin is formed on the particulate layer. The amorphous fluororesin enters voids or interstices of particulates of silicon dioxide or the like, and the amorphous fluororesin is subjected to drying and solidification while effecting embrace and inclusion. The mechanical strength of the amorphous fluororesin itself is high. Therefore, the water-repellent film, which is allowed to make tight contact with the base material, has the high strength.

The water-repellent film, which is formed on the light irradiated surface, has the high durability against the laser irradiation. Therefore, it is possible to maintain, for a long period of time, the water repellence of the light irradiated surface of the optical part provided on the substrate stage of the projection exposure apparatus.

According to the projection exposure apparatus concerning this embodiment, the optical part, which makes it possible to maintain the water repellence of the light irradiated surface for a long period of time, is provided on the substrate stage. Therefore, even when the liquid immersion exposure is repeatedly performed, it is possible to reliably discharge water from the light irradiated surface of the optical part.

In the embodiment described above, the adhesive particulate layer, which is constructed of the particulate layer composed of silicon dioxide ($SiO_2$), is formed as the film on the light irradiated surface of the optical part, on which the water-repellent film composed of the amorphous fluororesin is formed as the film. However, an adhesive particulate layer, which is composed of magnesium fluoride ($MgF_2$) or calcium fluoride ($CaF_2$), may be formed as a film on the light irradiated surface in place of the silicon dioxide ($SiO_2$), on which the water-repellent film composed of the amorphous fluororesin may be formed as the film. Alternatively, arbitrary two of silicon dioxide ($SiO_2$), magnesium fluoride ($MgF_2$), and calcium fluoride ($CaF_2$) may be mixed or laminated to constitute an adhesive particulate layer. Further alternatively, three of them may be mixed or laminated to constitute an adhesive particulate layer. Also in this case, it is possible to obtain the water-repellent film which is excellent in the durability against the laser irradiation, in the same manner as in the case in which the adhesive particulate layer constructed of the particulate layer composed of silicon dioxide ($SiO_2$) is formed as the film, on which the water-repellent film composed of the amorphous fluororesin is formed as the film.

Figure 21:
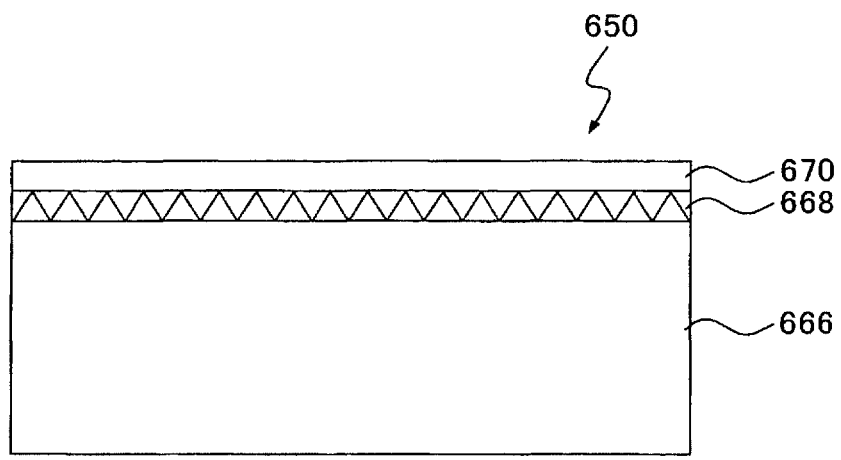
FIG. 21 shows a construction of the optical part provided on the wafer stage according to the embodiment.

In the embodiment described above, the adhesive particulate layer, which is constructed of the particulate layer composed of silicon dioxide ($SiO_2$), is formed as the film on the light irradiated surface of the optical part (for example, the light-entrance window 650), on which the water-repellent film composed of the amorphous fluororesin is formed as the film. However, as shown in FIG. 21, an adhesive surface (etching surface) 668 may be formed by performing the etching by using hydrogen fluoride (or hydrofluoric acid obtained by dissolving hydrogen fluoride in water) on the surface of the light irradiated surface formed of quartz glass 666. A water-repellent film 670 composed of an amorphous fluororesin may be formed as a film on the surface of the adhesive surface 668. In this case, the optical part has, on the light irradiated surface, the adhesive surface constructed of the etching surface obtained by performing the etching with hydrogen fluoride. Therefore, when the water-repellent film composed of the amorphous fluororesin is formed on the adhesive surface, then the amorphous fluororesin enters voids or interstices of the adhesive surface, and the amorphous fluororesin is subjected to drying and solidification while effecting embrace and inclusion. The mechanical strength of the amorphous fluororesin itself is high. Therefore, the water-repellent film, which is allowed to make tight contact with the base material, has the high strength.

In this embodiment, the light irradiated surface has the base material glass and the metal film (chromium film) for forming the pattern on the part of the base material glass, on which the water-repellent film composed of the amorphous fluororesin is formed. However, it is also appropriate that a base material glass and a metal film formed on the entire surface of the base material glass are provided, on which the water-repellent film composed of the amorphous fluororesin is formed. Such an optical part is usable as a high reflection plate to be employed, for example, when the transmittance of the projection lens is monitored.

In this embodiment, quartz glass is used as the base material glass. However, it is also appropriate that low expansion glass is used.

The method for producing the optical part according to the embodiment of the present invention will be specifically explained below with reference to Examples.

Example A

A surface of a light irradiated surface of an optical part (quartz glass) to be subjected to the film formation is washed to be extensively clean by washing the surface with an automatic washing apparatus which radiates the ultrasonic wave or by wiping the surface with a cloth or the like impregnated with alcohol.

Subsequently, a coat solution, which is obtained by stably dispersing fine particles of $MgF_2$ having an average particle size of 80 nm in an alkaline solution, is dripped in an appropriate amount onto the surface of the optical part to perform the spin coat by using a high speed rotation apparatus. When the coat solution is dried until it loses the fluidity, the optical part is detached from the high speed rotation apparatus, followed by being dried for 1 to 2 hours in a drying furnace at about 150° C. in order to completely dry the coat solution. A coat solution, which is obtained by dissolving an amorphous fluororesin ("CYTOP" produced by Asahi Glass Co., Ltd.), is dripped in an appropriate amount further onto the optical part having been cooled to room temperature to perform the spin coat by using the high speed rotation apparatus. When the coat solution is dried until it loses the fluidity, the optical part is detached from the high speed rotation apparatus, followed by being dried for 1 to 2 hours in a drying furnace at about 100° C. in order to completely dry the coat solution. According to the steps as described above, the optical part is produced, which has an $MgF_2$ film and an amorphous fluororesin film on the base material glass (quartz glass).

Example B

A surface of a light irradiated surface of an optical part (quartz glass) to be subjected to the film formation is washed to be extensively clean by washing the surface with an automatic washing apparatus which radiates the ultrasonic wave or by wiping the surface with a cloth or the like impregnated with alcohol.

Subsequently, a coat solution, which is obtained by stably dispersing fine particles of $SiO_2$ having an average particle size of 80 nm in an alkaline solution, is dripped in an appropriate amount onto the surface of the optical part to perform the spin coat by using a high speed rotation apparatus. When the coat solution is dried until it loses the fluidity, the optical part is detached from the high speed rotation apparatus, followed by being dried for 1 to 2 hours in a drying furnace at about 150° C. in order to completely dry the coat solution. A coat solution, which is obtained by dissolving an amorphous fluororesin ("CYTOP" produced by Asahi Glass Co., Ltd.), is dripped in an appropriate amount further onto the optical part having been cooled to room temperature to perform the spin coat by using the high speed rotation apparatus. When the coat solution is dried until it loses the fluidity, the optical part is detached from the high speed rotation apparatus, followed by being dried for 1 to 2 hours in a drying furnace at about 100° C. in order to completely dry the coat solution. According to the steps as described above, the optical part is produced, which has an $SiO_2$ film and an amorphous fluororesin film on the base material glass (quartz glass).

Example C

A surface of an optical part (quartz glass), which is polished highly accurately to have a roughness of about 0.2 nm RMS, is immersed for 5 seconds in hydrofluoric acid diluted to 5%, and then hydrofluoric acid is rinsed with pure water, followed by being wiped with a cloth or the like impregnated with alcohol. A coat solution, which is obtained by dissolving an amorphous fluororesin ("CYTOP" produced by Asahi Glass Co., Ltd.), is dripped in an appropriate amount onto the surface to perform the spin coat by using a high speed rotation apparatus. When the coat solution is dried until it loses the fluidity, the optical part is detached from the high speed rotation apparatus, followed by being dried for 1 to 2 hours in a drying furnace at about 100° C. in order to completely dry the coat solution. According to the steps as described above, the optical part is produced, which has an amorphous fluororesin film on the base material glass (quartz glass).

Comparative Example

A surface of a light irradiated surface of an optical part (quartz glass) to be subjected to the film formation is washed to be extensively clean by washing the surface with an automatic washing apparatus which radiates the ultrasonic wave or by wiping the surface with a cloth or the like impregnated with alcohol. Subsequently, a coat solution, which is obtained by dissolving an amorphous fluororesin ("CYTOP" produced by Asahi Glass Co., Ltd.), is dripped in an appropriate amount onto the surface to perform the spin coat by using a high speed rotation apparatus.

When the coat solution is dried until it loses the fluidity, the optical part is detached from the high speed rotation apparatus, followed by being dried for 1 to 2 hours in a drying furnace at about 100° C. in order to completely dry the coat solution. According to the steps as described above, the optical part is produced, which has an amorphous fluororesin film on the base material glass (quartz glass).

Exfoliation Test

An exfoliation test (tape test) using the cellophane adhesive tape was performed for the optical parts obtained in Examples A to C and Comparative Example as described above. In the tape test, a cellophane adhesive tape (JIS-468006) produced by NICHIBAN Co., Ltd. having a width of 18 mm was used. The degree of exfoliation of the film was judged such that the tape was rubbed strongly three times with a finger front when the tape was stuck, and then the tape was quickly peeled off perpendicularly. Three samples were prepared for each of the optical parts obtained in respective Examples, and the test was performed for each of them.

The following evaluation value criteria were used. That is, a case, in which the water-repelling coat was exfoliated in an amount of not less than φ5 mm, was regarded as "occurrence of exfoliation". The other cases were regarded as "no exfoliation". The expression "3/3" indicates the fact that all of the three samples were exfoliated.

| Test Results | | |
|---|---|---|
| Example A | 0/3 samples | no exfoliation |
| Example B | 0/3 samples | no exfoliation |
| Example C | 0/3 samples | no exfoliation |
| Comp. Ex. | 3/3 samples | occurrence of exfoliation |

As clarified from the test results, the water-repellent film of each of Examples A to C is strongly adhered to the base material glass, because the adhesive layer or the etching surface is provided. Therefore, it is appreciated that the optical part of the present invention is extremely excellent in the liquid resistance (water resistance) in the environment in which the optical part makes contact with the liquid such as in the liquid immersion exposure.

The embodiment has been explained as exemplified by the case in which the water-repellent film is adhered to the base material glass by way of example. According to the results as described above, it is appreciated that the present invention is usable for arbitrary various optical parts. That is, the present invention is not limited to various sensors and reference members provided on the substrate stage of the liquid immersion exposure apparatus. The present invention can be also used for all optical lenses and optical sensors which are used in such an environment that the contact is made with the liquid or the vapor. Further, the present invention is also applicable to the projection optical system to be used for the exposure apparatus, especially the lens installed to the end portion disposed on the side of the substrate, the lens to be used for the illumination optical system, and the sensor.

The term "contact angle" referred to in the embodiments described above includes not only the static contact angle but also the dynamic contact angle.

In the embodiments of the exposure apparatus described above, pure water is used as the liquid 1. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL. When the purity of pure water supplied from the factory or the like is low, it is also appropriate that the exposure apparatus is provided with an ultrapure water-producing unit.

The liquid 1 is water in the respective embodiments described above. However, the liquid 1 may be any liquid other than water. For example, when the light source of the exposure light beam EL is the $F_2$ laser, the $F_2$ laser beam is not transmitted through water. Therefore, in this case, liquids preferably usable as the liquid 1 may include, for example, a fluorine-based fluid such as fluorine-based oil and perfluoropolyether (PFPE) through which the $F_2$ laser beam is transmissive. In this case, the portion to make contact with the liquid 1 is subjected to the liquid-attracting treatment by forming a thin film, for example, with a substance having a molecular structure of small polarity including fluorine. Alternatively, other than the above, it is also possible to use, as the liquid 1, liquids (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid 1 to be used.

It is approved that the refractive index n of pure water (water) with respect to the exposure light beam EL having a wavelength of about 193 nm is approximately in an extent of 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

When the liquid immersion method is used as described above, the numerical aperture NA of the projection optical system is 0.9 to 1.3 in some cases. When the numerical aperture NA of the projection optical system is increased as described above, the image formation performance is sometimes deteriorated by the polarization effect with the random polarized light beam having been hitherto used as the exposure light beam. Therefore, it is desirable to use the polarized illumination. In this case, the following procedure is preferred. That is, the linear polarized illumination is effected, which is adjusted to the longitudinal direction of the line pattern of the line-and-space pattern of the mask (reticle) so that a large amount of diffracted light of the S-polarized component (TE-polarized component), i.e., the component in the polarization direction along the longitudinal direction of the line pattern is allowed to outgo from the pattern of the mask (reticle). When the space between the projection optical system PL and the resist coated on the surface of the substrate P is filled with the liquid, the diffracted light of the S-polarized component (TE-polarized component), which contributes to the improvement in the contrast, has the transmittance through the resist surface that is raised to be high as compared with a case in which the space between the projection optical system PL and the resist coated on the surface of the substrate P is filled with the air (gas). Therefore, even when the numerical aperture NA of the projection optical system exceeds 1.0, it is possible to obtain the high image formation performance. It is more effective to make appropriate combination, for example, with the phase shift mask and/or the oblique incidence illumination method (especially the dipole illumination method) adjusted to the longitudinal direction of the line pattern as disclosed in Japanese Patent Application Laid-open No. 6-188169.

Further, for example, when the ArF excimer laser beam is used as the exposure light beam, and the substrate P is exposed with a fine line-and-space pattern (for example, line-and-space of about 25 to 50 nm) by using the projection optical system PL having a reduction magnification of about ¼, then the mask M functions as a polarizing plate on account of the Wave Guide effect depending on the structure of the mask M (for example, the pattern fineness and the chromium thickness), and a large amount of the diffracted light beam of the S-polarized component (TE-polarized component) is radiated from the mask M as compared with the diffracted light beam of the P-polarized component (TM-component) which lowers the contrast. In such a situation, it is desirable that the linear polarized illumination is used as described above. However, the high resolution performance can be obtained even when the numerical aperture NA of the projection optical system PL is large, for example, 0.9 to 1.3 even when the mask M is illuminated with the random polarized light beam. When the substrate P is exposed with an extremely fine line-and-space pattern on the mask M, there is also such a possibility that the P-polarized component (TM-polarized component) may be larger than the S-polarized component (TE-polarized component) on account of the Wire Grid effect. However, for example, when the ArF excimer laser beam is used as the exposure light beam, and the substrate P is exposed with a line-and-space pattern larger than 25 nm by using the projection optical system PL having a reduction magnification of about ¼, then a large amount of the diffracted light beam of the S-polarized component (TE-polarized component) is radiated from the mask M as compared with the P-polarized component (TM-polarized component). Therefore, the high resolution performance can be obtained even when the numerical aperture NA of the projection optical system PL is large, for example, 0.9 to 1.3.

Further, it is also effective to use a combination of the oblique incidence illumination method and the polarized illumination method in which the linear polarization is effected in a tangential (circumferential) direction of a circle having a center of the optical axis as disclosed in Japanese Patent Application Laid-open No. 6-53120 as well as the linear polarized illumination (S-polarized illumination) adjusted to the longitudinal direction of the line pattern of the mask (reticle). In particular, when the pattern of the mask (reticle) includes not only the line pattern which extends in a predetermined one direction but the pattern also includes line patterns which extend in a plurality of directions in a mixed manner, then the high image formation performance can be obtained even when the numerical aperture NA of the projection optical system is large, by using, in combination, the zonal illumination method and the polarized illumination method in which the linear polarization is effected in a tangential direction of a circle having a center of the optical axis as disclosed in Japanese Patent Application Laid-open No. 6-53120 as well.

In the respective embodiments described above, the optical element 2 is attached to the end portion of the projection optical system PL. The lens can be used to adjust the optical characteristics of the projection optical system PL, including, for example, the aberration (for example, spherical aberration and comatic aberration). The optical element, which is attached to the end portion of the projection optical system PL, may be an optical plate to be used to adjust the optical characteristic of the projection optical system PL. Alternatively, the optical element may be a plane parallel plate through which the exposure light beam EL is transmissive. When the optical element which makes contact with the liquid 1 is the plane parallel plate which is cheaper than the lens, it is enough that the plane parallel plate is merely exchanged immediately before supplying the liquid 1 even when any substance (for example, any silicon-based organic matter), which deteriorates the transmittance of the projection optical system PL, the illuminance of the exposure light beam EL on the substrate P, and the uniformity of the illuminance distribution, is adhered to the plane parallel plate, for example, during the transport, the assembling, and/or the adjustment of the exposure apparatus EX. An advantage is obtained such that the exchange cost is lowered as compared with the case in which the optical element which makes contact with the liquid 1 is the lens. That is, the surface of the optical element to make contact with the liquid 1 is dirtied, for example, due to the adhesion of scattered particles generated from the resist by being irradiated with the exposure light beam EL or any impurity contained in the liquid 1. Therefore, it is necessary to periodically exchange the optical element. However, when the optical element is the cheap plane parallel plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid 1, is large between the substrate P and the optical element disposed at the end portion of the projection optical system PL, it is also allowable that the optical element is tightly fixed so that the optical element is not moved by the pressure, rather than allowing the optical element to be exchangeable.

Each of the embodiments described above is constructed such that the space between the projection optical system PL and the surface of the substrate P is filled with the liquid 1. However, for example, another arrangement may be adopted such that the space is filled with the liquid 1 in a state in which a cover glass constructed of a plane parallel plate is attached to the surface of the substrate P.

The exposure apparatus, to which the liquid immersion method is applied as described above, is constructed such that the optical path space, which is disposed on the light-outgoing side of the terminal end optical element 2 of the projection optical system PL, is filled with the liquid (pure water) to expose the substrate P. However, as disclosed in International Publication No. 2004/019128, it is also allowable that the optical path space, which is disposed on the light-entrance side of the terminal end optical element 2 of the projection optical system PL, is filled with the liquid (pure water).

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P.

The embodiments described above adopt the exposure apparatus in which the space between the projection optical system PL and the substrate P is locally filled with the liquid. However, the present invention is also applicable to a liquid immersion exposure apparatus in which the entire surface of the substrate as the exposure objective is covered with the liquid. The structure and the exposure operation of the liquid immersion exposure apparatus in which the entire surface of the substrate as the exposure objective is covered with the liquid are described in detail, for example, in Japanese Patent Application Laid-open Nos. 6-124873 and 10-303114 and U.S. Pat. No. 5,825,043, the content of which are incorporated herein by reference within a range of permission of the domestic laws and ordinances of the state designated or selected in this international application.

As for the type of the exposure apparatus EX, the present invention is not limited to the exposure apparatus for the semiconductor device production apparatus for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST (wafer stage 609) and/or the mask stage MST, it is allowable to use any one of those of the air floating type based on the use of the air bearing and those of the magnetic floating type based on the use of the Lorentz's force or the reactance force.

Each of the stages PST (609), MST may be either of the type in which the movement is effected along the guide or of the guideless type in which no guide is provided. An example of the use of the linear motor for the stage is disclosed in U.S. Pat. Nos. 5,623,853 and 5,528,118, the content of which are incorporated herein by reference within a range of permission of the domestic laws and ordinances of the state designated or selected in this international application.

As for the driving mechanism for each of the stages PST (690), MST, it is also allowable to use a plane motor in which a magnet unit provided with two-dimensionally arranged magnets and an armature unit provided with two-dimensionally arranged coils are opposed to one another, and each of the stages PST (690), MST is driven by the electromagnetic force. In this arrangement, any one of the magnet unit and the armature unit is connected to the stage PST (690), MST, and the other of the magnet unit and the armature unit is provided on the side of the movable surface of the stage PST (690), MST.

The reaction force, which is generated in accordance with the movement of the substrate stage PST (690), may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), the content of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), the content of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 17:
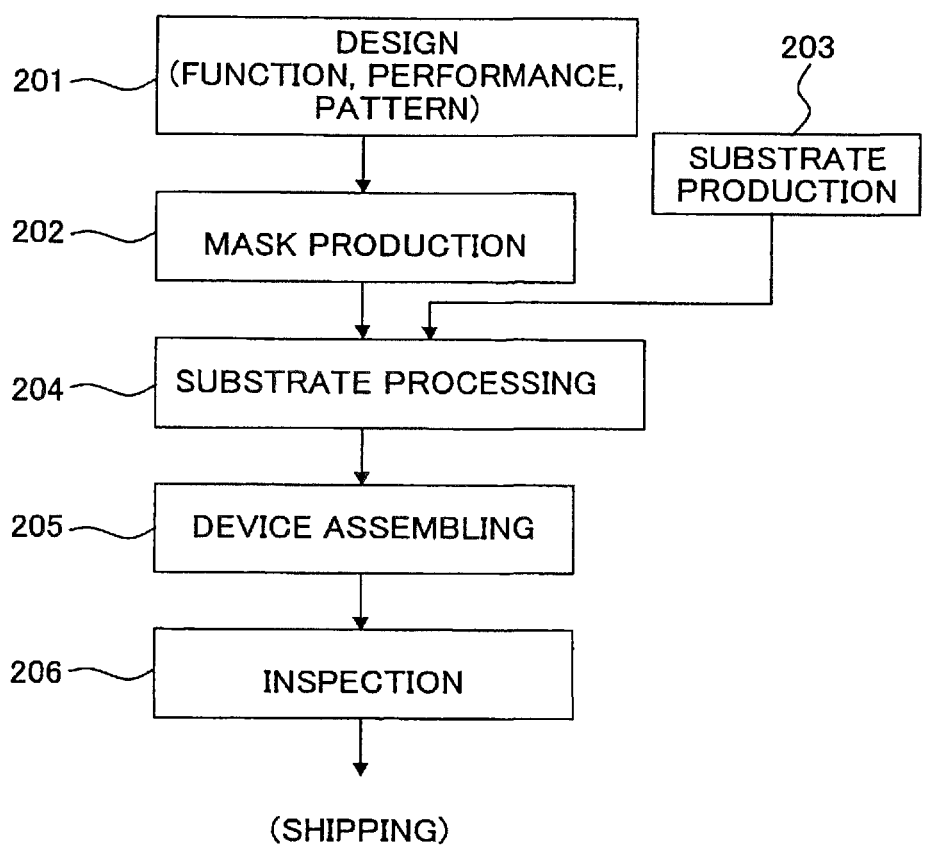
FIG. 17 shows a flow chart illustrating exemplary steps of producing a semiconductor device.
Figure 18:
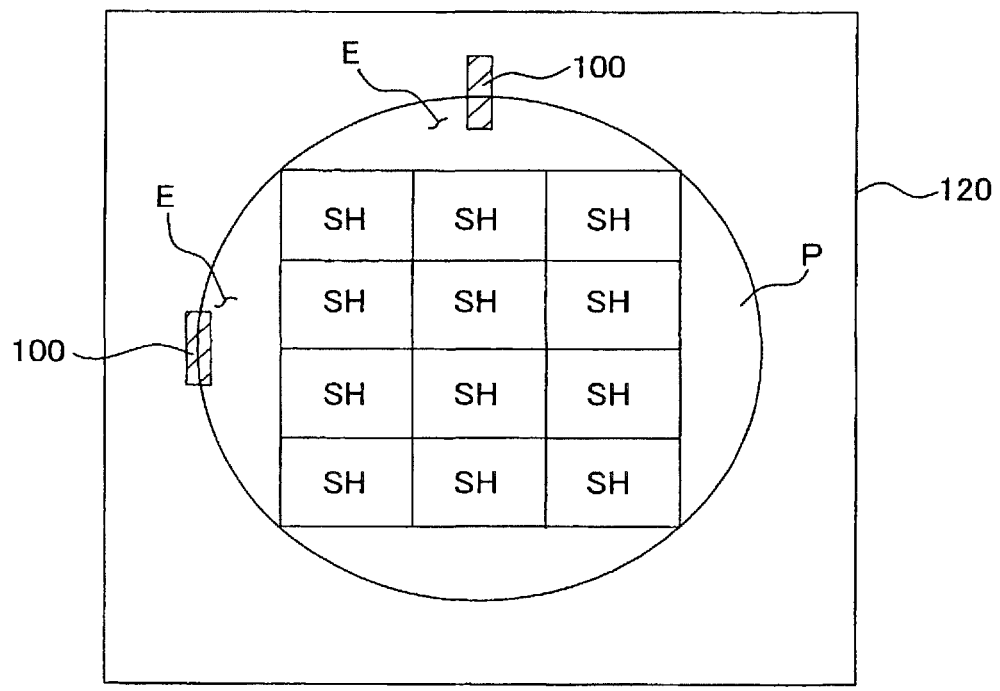
FIG. 18 schematically explains a problem involved in the conventional technique.

As shown in FIG. 17, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

INDUSTRIAL APPLICABILITY

According to the exposure apparatus of the present invention, it is possible to perform the exposure process while suppressing the outflow of the liquid, and it is possible to avoid the remaining of the liquid. Therefore, the liquid immersion exposure can be performed at the high exposure accuracy.

According to the optical part of the present invention, the particulate layer, which is composed at least one of silicon dioxide ($SiO_2$), magnesium fluoride ($MgF_2$), and calcium fluoride ($CaF_2$) for forming the adhesive particulate layer, has the satisfactory affinity for the glass (main component: $SiO_2$) of the base material. An appropriate degree of adhesiveness is obtained with respect to the base material glass. The irregularities, which result from the diameters of the particles, are formed on the surface. Further, for example, silicon dioxide itself has the high durability against the laser irradiation, because silicon dioxide or the like is the material which has the extremely high ultraviolet transmittance. Therefore, the particulate layer, which is composed of at least one of silicon dioxide ($SiO_2$), magnesium fluoride ($MgF_2$), and calcium fluoride ($CaF_2$), is formed as the film, and then the water-repellent film, which is composed of the amorphous fluororesin, is formed. The amorphous fluororesin enters voids or interstices of particulates of silicon dioxide or the like, and the amorphous fluororesin is subjected to drying and solidification while effecting embrace and inclusion. The mechanical strength of the amorphous fluororesin itself is high. Therefore, the water-repellent film, which is allowed to make tight contact with the base material, has the high strength. Therefore, the optical part is applicable to optical sensors and optical instruments to be used in a variety of environments in which the optical part makes contact with the liquid.

According to the optical part of the present invention, the adhesive surface, which is constructed of the etching surface obtained by performing the etching, for example, with hydrogen fluoride, is provided at the light irradiated surface. Therefore, when the water-repellent film, which is composed of the amorphous fluororesin, is formed on the adhesive surface, then the amorphous fluororesin enters voids or interstices of the adhesive surface, and the amorphous fluororesin is subjected to drying and solidification while effecting embrace and inclusion. The mechanical strength of the amorphous fluororesin itself is high. Therefore, the water-repellent film, which is allowed to make tight contact with the base material, has the high strength. Therefore, the optical part is applicable to optical sensors and optical instruments to be used in a variety of environments in which the optical part makes contact with the liquid.

According to the projection exposure apparatus of the present invention, the optical part, which makes it possible to maintain the water repellence of the light irradiated surface for a long period of time, is provided on the substrate stage. Therefore, even when the liquid immersion exposure is repeatedly performed, it is possible to reliably discharge water from the light irradiated surface of the optical part.

The invention claimed is:

1. An exposure apparatus that exposes a substrate with exposure light from a projection optical system via an immersion region formed with liquid below the projection optical system, the exposure apparatus comprising:
    a stage which includes a substrate holder to hold the substrate, and which is movable relative to the projection optical system;
    a detachable member which is detachably disposed on the stage so that an upper surface of the detachable member comes into contact with the immersion region; and
    a sensor which includes a light transmissive member disposed on the stage so as to transmit the exposure light from the immersion region, and which detects the exposure light from the light transmissive member,
    wherein the detachable member, on which an opening is formed in the upper surface, is disposed on the stage so that the light transmissive member is arranged within the opening.

2. The exposure apparatus according to claim 1, wherein the substrate holder comprises a support which supports a back surface of the substrate; a wall which is arranged around the support so as to face the back surface of the substrate supported by the support; and a flow channel which is connected to a space surrounded by the wall so as to suck a gas within the space, and holds the substrate in a state where the space is made to have a negative pressure by sucking the gas within the space through the flow channel.

3. The exposure apparatus according to claim 1, wherein the light transmissive member includes a first transmissive member and a second transmissive member,
    the opening includes a first opening and a second opening, and
    the detachable member is disposed on the stage so that the first transmissive member is arranged within the first opening and the second transmissive member is arranged within the second opening.

4. The exposure apparatus according to claim 3, wherein the substrate holder is arranged between the first transmissive member and the second transmissive member on the stage.

5. The exposure apparatus according to claim 3, wherein the detachable member is disposed on the stage so that the substrate held by the substrate holder is arranged between the first opening and the second opening.

6. The exposure apparatus according to claim 3, wherein the opening includes a third opening arranged between the first opening and the second opening, and
    the detachable member is disposed on the stage so that the substrate held by the substrate holder is arranged within the third opening.

7. The exposure apparatus according to claim 3, wherein the first opening and the second opening are formed in the vicinity of different corners respectively.

8. The exposure apparatus according to claim 1, further comprising
    a sealing material disposed within the opening so as to prevent the liquid, from the immersion region, from inflowing into the opening.

9. The exposure apparatus according to claim 8, wherein the sealing material is arranged in a gap between the light transmissive member and an edge of the opening of the detachable member on the stage.

10. The exposure apparatus according to claim 1, wherein the light transmissive member includes a light-shielding material, disposed on the upper surface of the detachable member, which forms a light transmissive portion to transmit the exposure light into a predetermined shape, and the sensor detects the exposure light from the light transmissive portion.

11. The exposure apparatus according to claim 10, wherein the light transmissive portion includes at least one of a pin hole-shaped light transmissive portion and a slit-shaped light transmissive portion.

12. The exposure apparatus according to claim 1, wherein a surface in the upper surface of the light transmissive member, on which the exposure light is incident, includes a flat surface.

13. The exposure apparatus according to claim 1, wherein a surface of the light transmissive member, from which the exposure light exits, includes a curved surface.

14. The exposure apparatus according to claim 1, wherein the sensor includes a light receiving element, disposed on the stage, which receives the exposure light from the light transmissive member and outputs a light-receiving signal.

15. The exposure apparatus according to claim 1, wherein the detachable member is disposed on the stage so that the upper surface of the detachable member is substantially flush with an upper surface of the substrate supported by the substrate holder.

16. The exposure apparatus according to claim 1, wherein the detachable member is disposed on the stage so that the upper surface of the detachable member is substantially flush with an upper surface of the light transmissive member.

17. The exposure apparatus according to claim 1, wherein the light transmissive member is disposed on the stage so that an upper surface of the light transmissive member is substantially flush with an upper surface of the substrate supported by the substrate holder.

18. The exposure apparatus according to claim 1, wherein the upper surface of the detachable member includes a flat surface.

19. An exposure method for exposing a substrate with exposure light, the exposure method comprising:

exposing the substrate by using the exposure apparatus according to claim 1.

20. A device manufacturing method, comprising:

exposing a substrate with exposure light from a pattern by using the exposure apparatus according to claim 1; and assembling a device on the substrate exposed with the exposure light.

* * * * *